US009679896B2

(12) United States Patent
Yoon et al.

(10) Patent No.: US 9,679,896 B2
(45) Date of Patent: Jun. 13, 2017

(54) MOISTURE BLOCKING STRUCTURE AND/OR A GUARD RING, A SEMICONDUCTOR DEVICE INCLUDING THE SAME, AND A METHOD OF MANUFACTURING THE SAME

(71) Applicant: SAMSUNG ELECTRONICS CO., LTD., Suwon-si, Gyeonggi (KR)

(72) Inventors: Young-Soo Yoon, Hwaseong-si (KR); Min-Kwon Choi, Seoul (KR); Yang-Soo Son, Hwaseong-si (KR); Hyun-Jo Kim, Seoul (KR); Han-Ii Yu, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 14/968,297

(22) Filed: Dec. 14, 2015

(65) Prior Publication Data
US 2016/0172359 A1 Jun. 16, 2016

(30) Foreign Application Priority Data

Dec. 16, 2014 (KR) .................. 10-2014-0180910

(51) Int. Cl.
*H01L 27/088* (2006.01)
*H01L 23/00* (2006.01)
*H01L 23/58* (2006.01)
*H01L 29/40* (2006.01)
*H01L 29/78* (2006.01)

(52) U.S. Cl.
CPC ........ *H01L 27/0886* (2013.01); *H01L 23/564* (2013.01); *H01L 23/585* (2013.01); *H01L 29/402* (2013.01); *H01L 29/785* (2013.01); *H01L 2924/0002* (2013.01)

(58) Field of Classification Search
None
See application file for complete search history.

(56) References Cited

U.S. PATENT DOCUMENTS

| | | | | |
|---|---|---|---|---|
| 5,834,829 A * | 11/1998 | Dinkel | .................... | H01L 21/78 257/508 |
| 6,362,524 B1 * | 3/2002 | Blish | ................... | H01L 21/7684 257/734 |
| 6,495,918 B1 * | 12/2002 | Brintzinger | ........... | H01L 23/562 257/692 |
| 6,921,959 B2 * | 7/2005 | Watanabe | ........... | H01L 23/5227 257/127 |

(Continued)

FOREIGN PATENT DOCUMENTS

| | | |
|---|---|---|
| KR | 1998-0055962 | 9/1998 |
| KR | 100444012 | 8/2004 |

*Primary Examiner* — David E Graybill
(74) *Attorney, Agent, or Firm* — F. Chau & Associates, LLC

(57) ABSTRACT

A moisture blocking structure includes an active fin disposed on a sealing region of a substrate, the substrate including a chip region and the sealing region surrounding a periphery of the chip region, the active fin continuously surrounding the chip region and having a winding line shape in a plan view. A gate structure covers the active fin and surrounds the periphery of the chip region. A conductive structure is disposed on the gate structure, the conductive structure surrounding the periphery of the chip region.

20 Claims, 54 Drawing Sheets

(56) References Cited

U.S. PATENT DOCUMENTS

| Patent/Pub. No. | Date | Inventor | Classification |
|---|---|---|---|
| 7,169,699 B2 * | 1/2007 | Takada | H01L 23/562 257/127 |
| 7,226,801 B2 * | 6/2007 | Chiang | G02F 1/1339 257/59 |
| 7,652,377 B2 * | 1/2010 | Yaegashi | H01L 27/11502 257/310 |
| 7,759,173 B2 * | 7/2010 | DeVries | H01L 21/743 257/127 |
| 7,795,669 B2 * | 9/2010 | Georgakos | H01L 29/785 257/327 |
| 8,018,030 B2 * | 9/2011 | Furusawa | H01L 23/564 257/620 |
| 8,048,761 B2 * | 11/2011 | Yeo | H01L 23/562 257/508 |
| 8,264,064 B2 * | 9/2012 | Watanabe | H01L 23/585 257/618 |
| 8,633,571 B2 * | 1/2014 | Okutsu | H01L 23/522 257/409 |
| 8,723,225 B2 * | 5/2014 | Hu | H01L 21/823481 257/192 |
| 9,048,246 B2 * | 6/2015 | Wei | H01L 23/562 |
| 9,053,947 B2 * | 6/2015 | Hu | H01L 21/823481 |
| 9,105,744 B2 * | 8/2015 | Lee | H01L 21/823431 |
| 9,123,810 B2 * | 9/2015 | Hong | H01L 29/785 |
| 9,293,324 B2 * | 3/2016 | Bentley | H01L 21/02538 |
| 2002/0024115 A1 * | 2/2002 | Ibnabdeljalil | H01L 23/562 257/620 |
| 2003/0218254 A1 * | 11/2003 | Kurimoto | H01L 21/76807 257/758 |
| 2003/0232483 A1 * | 12/2003 | Fujiishi | H01L 27/10894 438/396 |
| 2005/0087878 A1 * | 4/2005 | Uesugi | H01L 23/564 257/758 |
| 2005/0098893 A1 * | 5/2005 | Tsutsue | H01L 23/564 257/758 |
| 2005/0127395 A1 * | 6/2005 | Saigoh | H01L 23/564 257/127 |
| 2006/0208300 A1 * | 9/2006 | Iwanaga | H01L 21/82343 257/308 |
| 2008/0017965 A1 * | 1/2008 | Nomura | H01L 23/564 257/685 |
| 2008/0296681 A1 * | 12/2008 | Georgakos | H01L 29/785 257/347 |
| 2010/0025824 A1 * | 2/2010 | Chen | H01L 23/585 257/620 |
| 2014/0097496 A1 * | 4/2014 | Hu | H01L 21/823481 257/368 |
| 2014/0141586 A1 * | 5/2014 | Hu | H01L 21/823481 438/290 |
| 2014/0367780 A1 * | 12/2014 | Hong | H01L 29/785 257/347 |
| 2014/0367835 A1 * | 12/2014 | Wei | H01L 23/562 257/620 |
| 2015/0021713 A1 * | 1/2015 | Cheng | H01L 29/7851 257/409 |
| 2015/0064869 A1 * | 3/2015 | Hong | H01L 21/823821 438/283 |
| 2015/0187753 A1 * | 7/2015 | Campi, Jr. | H01L 27/0262 257/357 |
| 2015/0255593 A1 * | 9/2015 | Yu | H01L 21/823481 257/401 |
| 2016/0056230 A1 * | 2/2016 | Lin | H01L 21/76 257/491 |
| 2016/0172359 A1 * | 6/2016 | Yoon | H01L 27/0886 257/401 |

* cited by examiner

FIG. 17
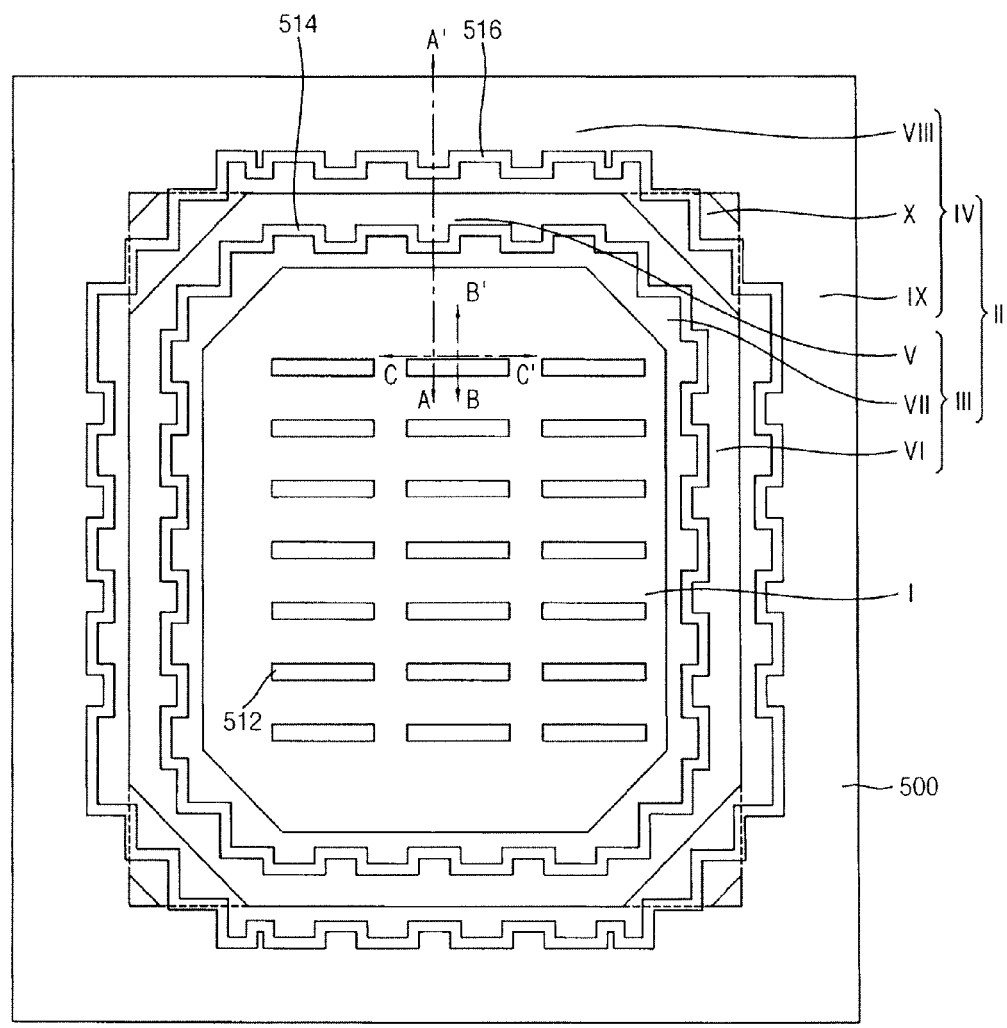
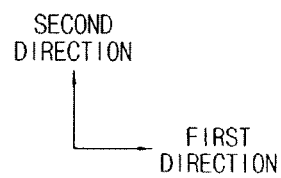

FIG. 28
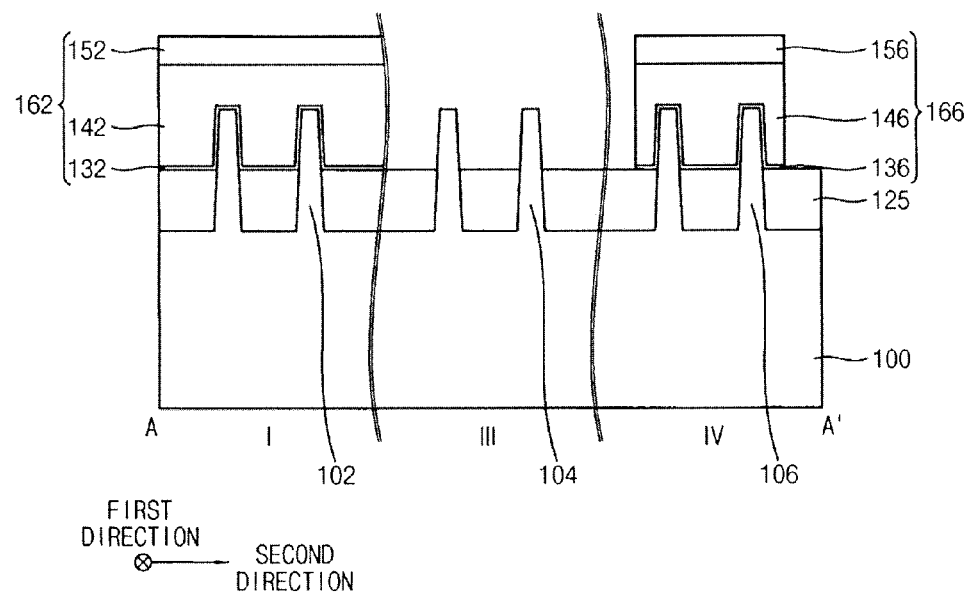
FIG. 29
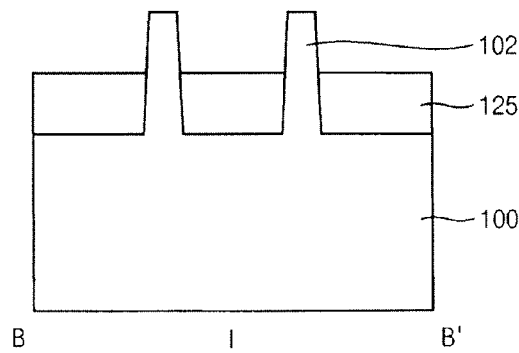
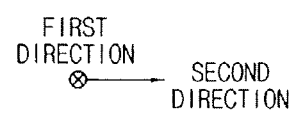

FIG. 30
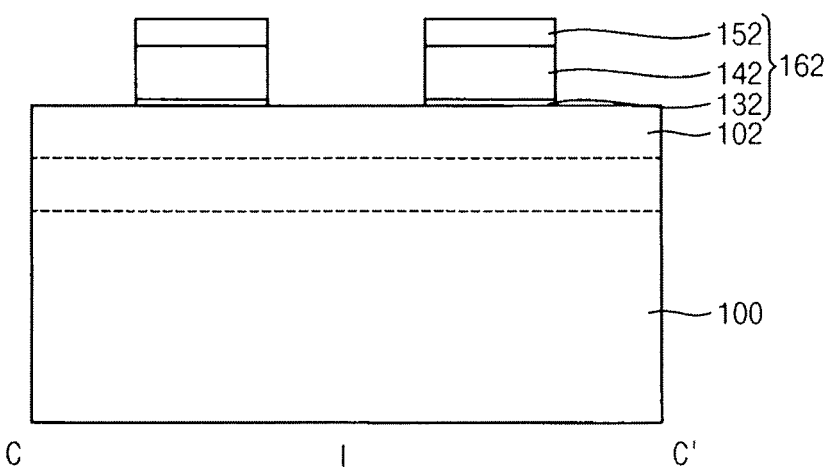
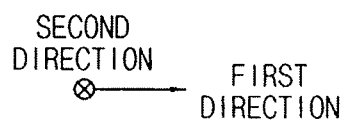

FIG. 32
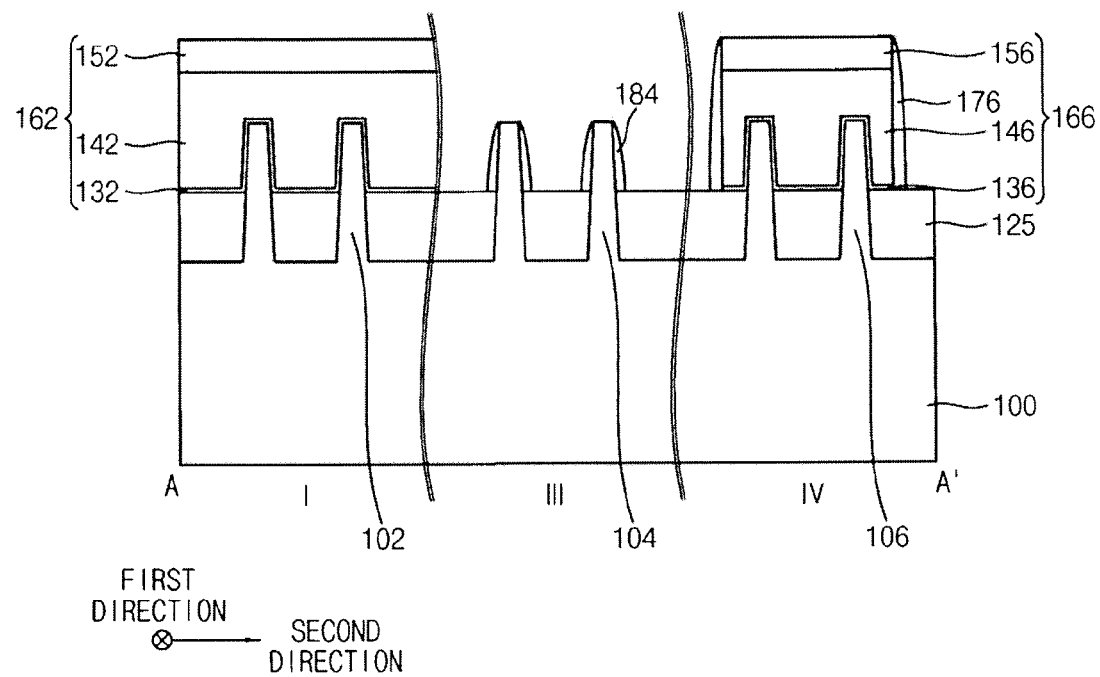
FIG. 33
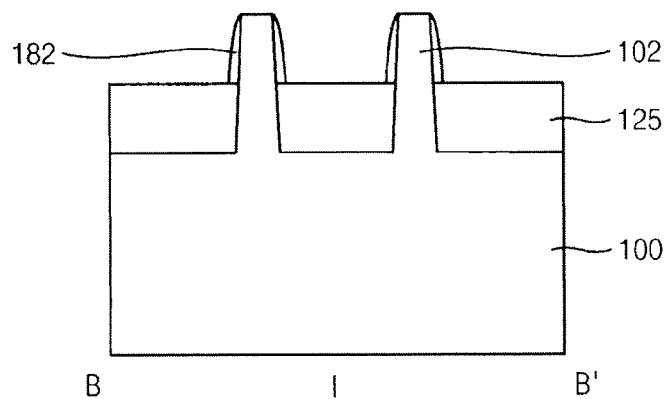
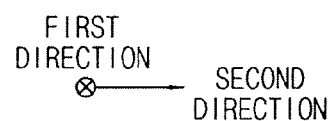

FIG. 50
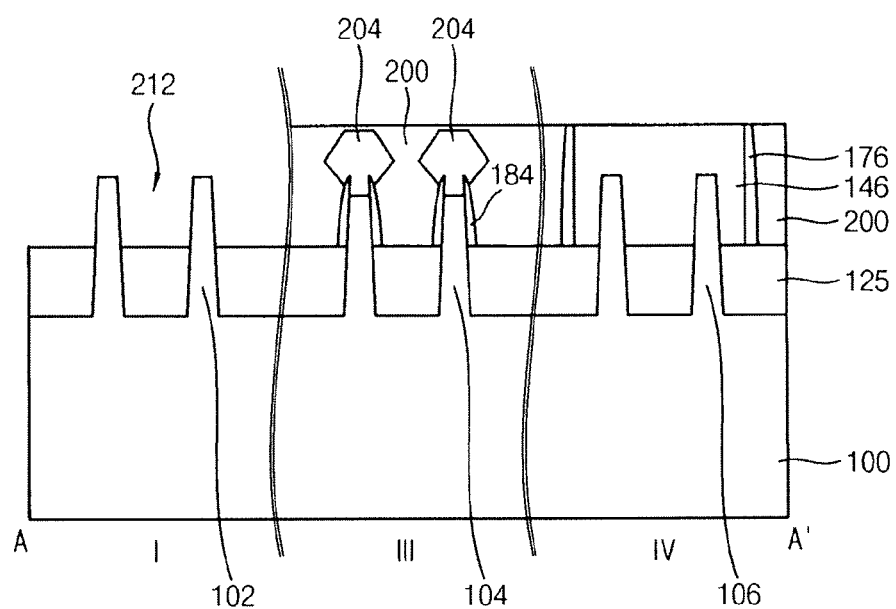

MOISTURE BLOCKING STRUCTURE AND/OR A GUARD RING, A SEMICONDUCTOR DEVICE INCLUDING THE SAME, AND A METHOD OF MANUFACTURING THE SAME

CROSS-REFERENCE TO RELATED APPLICATION

This application claims priority under 35 U.S.C. §119 to Korean Patent Application No. 10-2014-0180910, filed on Dec. 16, 2014, in the Korean Intellectual Property Office (KIPO), the disclosure of which is incorporated by reference herein in its entirety.

TECHNICAL FIELD

The present inventive concept relates to a moisture blocking structure and/or a guard ring, a semiconductor device including the same, and a method of manufacturing the same.

DISCUSSION OF THE RELATED ART

In a sealing region around a chip region, a moisture blocking structure is provided to protect a chip from moisture and/or cracks that are generated during a wafer dicing process. A guard ring may be formed in the sealing region to ground the chip. A fin field effect transistor (finFET) may be formed in the chip region. When a chemical mechanical polishing (CMP) process is performed to form an active fin of the finFET, dishing may occur. Thus, an insulation layer may have a height difference between the chip region and the sealing region.

SUMMARY

According to an exemplary embodiment of the present inventive concept, a moisture blocking structure includes an active fin disposed on a sealing region of a substrate, the substrate including a chip region and the sealing region surrounding a periphery of the chip region, the active fin continuously surrounding the chip region and having a winding line shape in a plan view, a gate structure covering the active fin and surrounding the periphery of the chip region, and a conductive structure disposed on the gate structure, the conductive structure surrounding the periphery of the chip region.

In an exemplary embodiment of the present inventive concept, a moisture blocking structure further includes a plurality of active fins, wherein the gate structure covers two neighboring active fins of the plurality of active fins.

In an exemplary embodiment of the present inventive concept, the two neighboring active fins are substantially parallel to each other.

In an exemplary embodiment of the present inventive concept, the conductive structure includes a contact plug disposed on the gate structure, the contact plug surrounding the periphery of the chip region, and a via disposed on the contact plug, the via surrounding the periphery of the chip region.

In an exemplary embodiment of the present inventive concept, the moisture blocking structure further includes a plurality of active fins, a plurality of gate structures, and a plurality of conductive structures, and a metal plate disposed on the plurality of conductive structures.

In an exemplary embodiment of the present inventive concept, the moisture blocking structure further includes a blocking layer pattern disposed between the gate structure and the conductive structure, the blocking layer pattern including an insulating material.

In an exemplary embodiment of the present inventive concept, the gate structure includes a gate insulation layer pattern and a gate electrode sequentially stacked on the active fin.

In an exemplary embodiment of the present inventive concept, the gate insulation layer pattern includes a high-k dielectric material, and the gate electrode includes a metal.

In an exemplary embodiment of the present inventive concept, the active fin includes a plurality of first portions each extending in a first direction substantially parallel to a top surface of the substrate, and a plurality of second portions each extending in a second direction substantially parallel to the top surface of the substrate and substantially perpendicular to the first direction, wherein each end of each first portion of the plurality of first portions is connected to an end of a corresponding second portion of the plurality of second portions.

In an exemplary embodiment of the present inventive concept, the active fin has a wave shape.

According to an exemplary embodiment of the present inventive concept, a guard ring includes an active fin disposed on a sealing region of a substrate, the substrate including a chip region and the sealing region surrounding an outside edge of the chip region, and the active fin continuously surrounding the outside edge of the chip region and having a winding line shape in a plan view, and a conductive structure disposed on the active fin, the conductive structure surrounding the chip region.

In an exemplary embodiment of the present inventive concept, a guard ring further includes a plurality of active fins, wherein the conductive structure covers two neighboring active fins of the plurality of active fins.

In an exemplary embodiment of the present inventive concept, the neighboring two active fins are substantially parallel to each other.

In an exemplary embodiment of the present inventive concept, the conductive structure includes a contact plug disposed on the active fin, the contact plug surrounding the outside edge of the chip region, and a via disposed on the contact plug, the via surrounding the outside edge of chip region.

In an exemplary embodiment of the present inventive concept, a guard ring further includes a plurality of active fins, and a plurality of conductive structures, and a metal plate disposed on the plurality of conductive structures.

In an exemplary embodiment of the present inventive concept, the guard ring further includes a source/drain layer and a metal silicide pattern disposed between the active fin and the conductive structure.

In an exemplary embodiment of the present inventive concept, the source/drain drain layer is an epitaxial layer doped with impurities.

In an exemplary embodiment of the present inventive concept, the source/drain layer includes silicon-germanium or silicon carbide.

In an exemplary embodiment of the present inventive concept, the active fin includes a plurality of first portions each extending in a first direction substantially parallel to a top surface of the substrate, and a plurality of second portions each extending in a second direction substantially parallel to the top surface of the substrate and substantially perpendicular to the first direction, wherein each end of each first portion of the plurality of first portions is connected to an end of a corresponding second portion of the plurality of second portions.

In an exemplary embodiment of the present inventive concept, the active fin has a wave shape.

According to an exemplary embodiment of the present inventive concept, a semiconductor device includes a substrate including a first region, a second region and a third region, the second region disposed around a perimeter of the first region, and the third region disposed around a perimeter of the second region, a first active fin disposed on the first region of the substrate, a first guard ring including a second active fin disposed on the second region of the substrate, the second active fin continuously surrounding the perimeter of the first region and shaped as a winding line in a plan view, and a first conductive structure disposed on the second active fin, the first conductive structure surrounding the perimeter of the first region, and a moisture blocking structure including a third active fin disposed on the third region of the substrate, the third active fin continuously surrounding the perimeter of the second region and shaped as a winding line in a plan view, a first gate structure covering the third active fin and surrounding the perimeter of the second region, and a second conductive structure disposed on the second gate structure, the second conductive structure surrounding the perimeter of second region.

In an exemplary embodiment of the present inventive concept, a semiconductor device further includes a plurality of second active fins and a plurality of third active fins, wherein the first conductive structure covers two neighboring second active fins of the plurality of second active fins, and the second conductive structure covers two neighboring third active fins of the plurality of third active fins.

In an exemplary embodiment of the present inventive concept, the two neighboring second active fins are substantially parallel to each other.

In an exemplary embodiment of the present inventive concept, the first conductive structure includes a first contact plug disposed on the second active fin, the first contact plug surrounding the perimeter of the first region, and a first via disposed on the first contact plug, the first via surrounding the perimeter of the first region, and wherein the second conductive structure includes a second contact plug disposed on the first gate structure, the second contact plug surrounding the perimeter of the second region, and a second via on the second contact plug, the second via continuously surrounding the second region.

In an exemplary embodiment of the present inventive concept, the first and second contact plugs include substantially the same material, and a top surface portion of the first contact plug is substantially coplanar with a top surface portion of the second contact plug, and wherein the first and second vias include substantially the same material.

In an exemplary embodiment of the present inventive concept, a semiconductor device further includes a plurality of first active fins, a plurality of second active fins, a plurality of third active fins, a plurality of first conductive structures, a plurality of second conductive structures, and a plurality of second gate structures, and a metal plate disposed on the plurality of first conductive structures and the plurality of second conductive structures.

In an exemplary embodiment of the present inventive concept, a semiconductor device further includes a source/drain layer and a metal silicide pattern disposed between the second active fin and the first conductive structure.

In an exemplary embodiment of the present inventive concept, a semiconductor device further includes a blocking layer pattern disposed between the second gate structure and the second conductive structure the blocking layer pattern including an insulating material.

In an exemplary embodiment of the present inventive concept, the second gate structure includes a second gate insulation layer pattern and a second gate electrode sequentially stacked on the third active fin.

In an exemplary embodiment of the present inventive concept, wherein the first active fin extends in a first direction substantially parallel to a top surface of the substrate, wherein the second active fin includes a plurality of first portions each extending in the first direction, and a plurality of second portions each extending in a second direction substantially parallel to the top surface of the substrate and substantially perpendicular to the first direction, wherein each end of each first portion of the plurality of first portions is connected to an end of a corresponding second portion of the plurality of second portions.

In an exemplary embodiment of the present inventive concept, the third active fin includes, a plurality of third portions each extending in the first direction, and a plurality of fourth portions each extending in the second direction, wherein each end of each third portion of the plurality of third portions is connected to an end of a corresponding fourth portion of the plurality of fourth portions.

In an exemplary embodiment of the present inventive concept, the semiconductor device further includes a first gate structure including a first gate insulation layer pattern and a first gate electrode sequentially stacked on the first active fin.

In an exemplary embodiment of the present inventive concept, the first and second gate structures include substantially the same material.

In an exemplary embodiment of the present inventive concept, each of the second and third active fins has a wave shape.

In an exemplary embodiment of the present inventive concept, a semiconductor device further includes a fourth active fin disposed on the third region of the substrate, the fourth active fin surrounding the perimeter of the second region and having a winding line shape in a plan view, and a second guard ring including the fourth active fin, and a third conductive structure disposed on the fourth active fin, the third conductive structure surrounding the perimeter of the second region.

In an exemplary embodiment of the present inventive concept, the first region is a chip region in which a semiconductor chip is formed, and each of the second and third regions is a sealing region.

According to an exemplary embodiment of the present inventive concept, a method of manufacturing a semiconductor device includes forming an isolation layer pattern on a substrate to define a field region, and forming first, second and third active fins protruding from the isolation layer pattern, the substrate including a first region, a second region surrounding a periphery of the first region, and a third region surrounding a periphery of the second region, a top surface of the field region being covered by the isolation layer pattern, top surfaces of the first, second and third active fins not being covered by the isolation layer pattern, the first active fin being in the first region, the second active fin being in the second region, and the third active fin being in the third region, wherein the second active fin continuously surrounds the periphery of the first region and having a winding line shape in a plan view, and the third active fin continuously surrounds the periphery of the second region and having a winding line shape in a plan view, forming a first gate structure to cover the third active fin and to continuously surround the second region, and forming a first conductive structure on the second active fin to surround the periphery of the first region, and forming a second conductive structure on the first gate structure to surround the periphery of the second region.

In an exemplary embodiment of the present inventive concept, forming the first, second, and third active fins includes, forming a first mask on the first region, forming a second mask on the second region, and forming a third mask on the third region, etching the substrate using the first mask to form a first trench on the first region, etching the substrate using the second mask to form a second trench on the second region, and etching the substrate using the third mask to form a third trench on the third region, forming an isolation layer on the substrate to fill the first, second, and third trenches, performing a chemical mechanical polishing (CMP) process on the isolation layer to expose a top surface of the substrate and to planarize the isolation layer, and removing an upper portion of the isolation layer.

In an exemplary embodiment of the present inventive concept, forming the first, second, and third masks includes, forming a mask layer on the substrate, forming a first sacrificial layer pattern on the mask layer in the first region, forming a second sacrificial layer pattern on the mask layer in the second region, and forming a third sacrificial layer pattern on the mask layer in the third region, the second sacrificial layer pattern continuously surrounding the periphery of the first region and having a winding line shape, and the third sacrificial layer pattern continuously surrounding the periphery of the second region and having a winding line shape, forming first spacers on sidewalls of the first sacrificial layer pattern, forming second spacers on sidewalls of the second sacrificial layer pattern, and forming third spacers on sidewalls of the third sacrificial layer pattern, and after removing the first to third sacrificial layer patterns, etching the mask layer using the first, second, and third spacers as an etching mask.

In an exemplary embodiment of the present inventive concept, a method further includes forming a plurality of second active fins and a plurality of third active fins, wherein forming the first gate structure includes forming the first gate structure to cover two neighboring third active fins of the plurality of third active fins, and wherein forming the first conductive structure includes forming the first conductive structure to cover two neighboring second active fins of the plurality of second active fins.

In an exemplary embodiment of the present inventive concept, the two neighboring second active fins are parallel to each other, and the two neighboring third active fins are parallel to each other.

In an exemplary embodiment of the present inventive concept, a method further includes forming a plurality of first active fins, wherein a first active fin of the plurality of first active fins extends in a second direction substantially parallel to a top surface of the substrate, wherein another first active fin of the plurality of first active fins extends in a first direction substantially parallel to the top surface of the substrate and substantially perpendicular to the second direction.

In an exemplary embodiment of the present inventive concept, a method further includes forming a second gate structure, wherein forming the second gate structure includes, forming the second gate structure on the plurality of first active fins and forming the isolation layer pattern to extend in the second direction.

In an exemplary embodiment of the present inventive concept, forming the first and second conductive structures includes, forming a first contact plug on the second active fin to surround the periphery of the first region, and forming a second contact plug on the first gate structure to surround the periphery of the second region, and forming a first via on the first contact plug to continuously surround the first region, and forming a second via on the second contact plug to surround the periphery of the second region.

According to an exemplary embodiment of the present inventive concept, a semiconductor device includes a substrate having a first region and a second region, wherein the second region is disposed around the first region, a first active fin disposed on the first region, a second active fin disposed on the second region, and a third active fin disposed on the second region, wherein the second active fin forms a closed loop around the first region, and the third active fin forms a closed loop around the second active fin, a first conductive structure disposed on the second active fin, wherein the first conductive structure forms a closed loop around the first region, a first gate structure covering the third active fin, a second conductive structure disposed on the first gate structure, wherein the first gate structure forms a closed loop around the second active fin, and the second conductive structure forms a closed loop around the second active fin.

In an exemplary embodiment of the present inventive concept, a semiconductor device further includes a fourth active fin disposed between the second and third active fins, the fourth active fin forming a closed loop around the second active fin, and a fifth active fin disposed on the second region of the substrate, the fifth active fin forming a closed loop around the third active fin, wherein the first conductive structure covers the second and fourth active fins, and the second conductive structure covers the third and fifth active fins.

In an exemplary embodiment of the present inventive concept, the second and third active fins each include a curved or zigzag portion.

In an exemplary embodiment of the present inventive concept, a semiconductor device further includes a second gate structure including a first gate insulation layer pattern and a first gate electrode sequentially stacked on the first active fin.

In an exemplary embodiment of the present inventive concept, the first conductive structure includes a first contact plug disposed on the second active fin, the first contact plug forming a closed loop around the first region, and a first via disposed on the first contact plug, the first via forming a closed loop around the first region, and wherein the second conductive structure includes a second contact plug disposed on the first gate structure, the second contact plug forming a closed loop around the second active fin, and a second via disposed on the second contact plug, the second via forming a closed loop around the second active fin.

BRIEF DESCRIPTION OF THE DRAWINGS

The present inventive concept will be more clearly understood by describing in detail exemplary embodiments thereof with reference to the accompanying drawings, in which:

FIGS. 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64 and 65 are plan views and cross-sectional views illustrating a method of manufacturing a semiconductor device in accordance with exemplary embodiments of the present inventive concept.

DETAILED DESCRIPTION OF THE EMBODIMENTS

Figure 1:
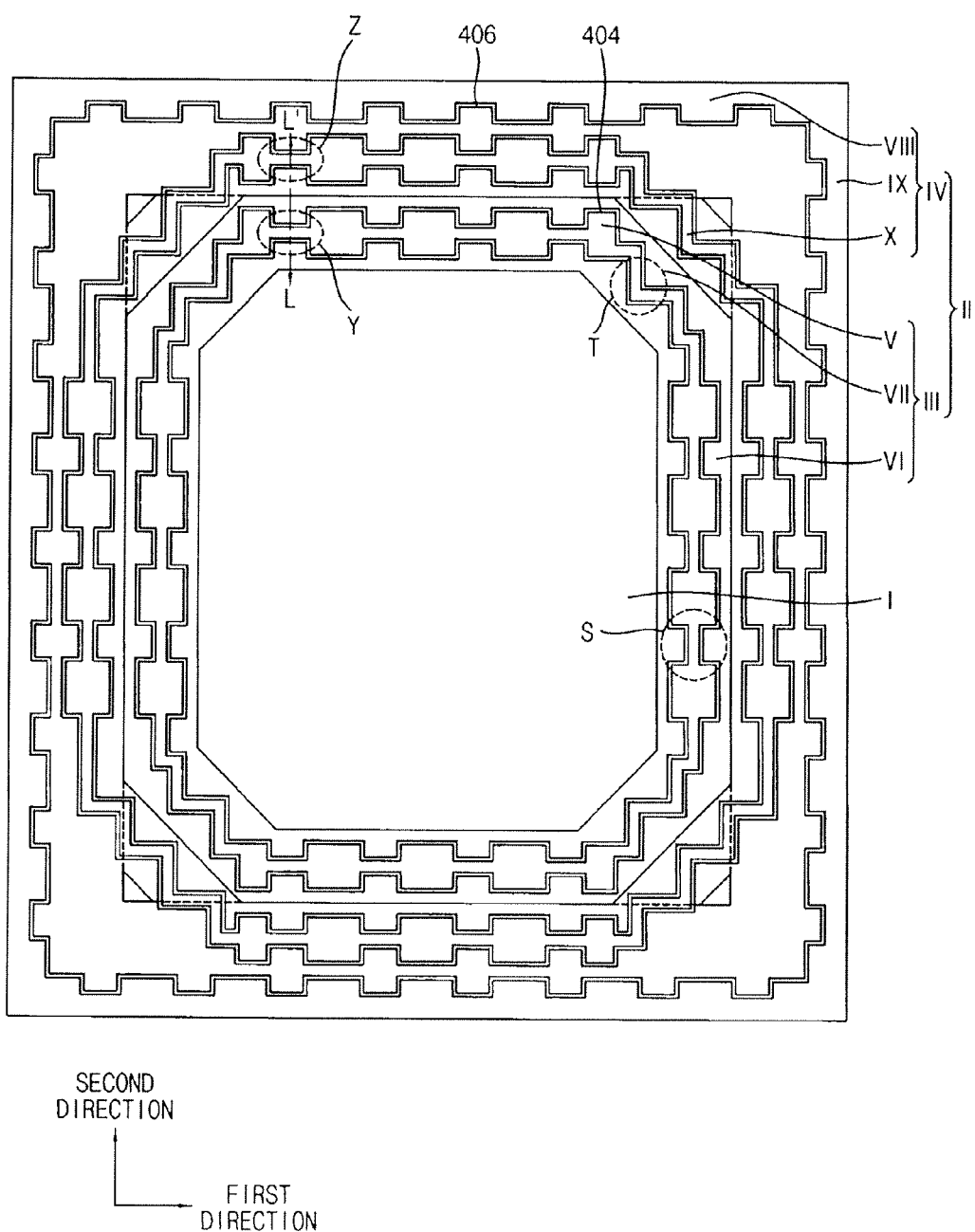
FIG. 1 is a plan view illustrating a moisture blocking structure and a first guard ring in accordance with an exemplary embodiment of the present inventive concept.

Exemplary embodiments of the present inventive concept will be described more fully hereinafter with reference to the accompanying drawings. The present inventive concept may, however, be embodied in many different forms and should not be construed as being limited to the exemplary embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. Like numerals may refer to like elements throughout this application.

As used herein, the singular forms "a," "an" and "the" are intended to include the plural forms as well, unless the context clearly indicates otherwise.

Exemplary embodiments of the present inventive concept are described herein with reference to cross-sectional illustrations that are idealized examples. As such, variations from the shapes of the illustrations as a result, for example, of manufacturing techniques and/or tolerances, may be expected. Thus, exemplary embodiments of the present inventive concept should not be construed as being limited to the particular shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in a region between the buried region and a surface through which the implantation takes place. Thus, the regions illustrated in the figures are schematic in nature and their shapes are not intended to illustrate the actual shape of a region of a device and are not intended to limit the scope of the present inventive concept.

Figure 2:
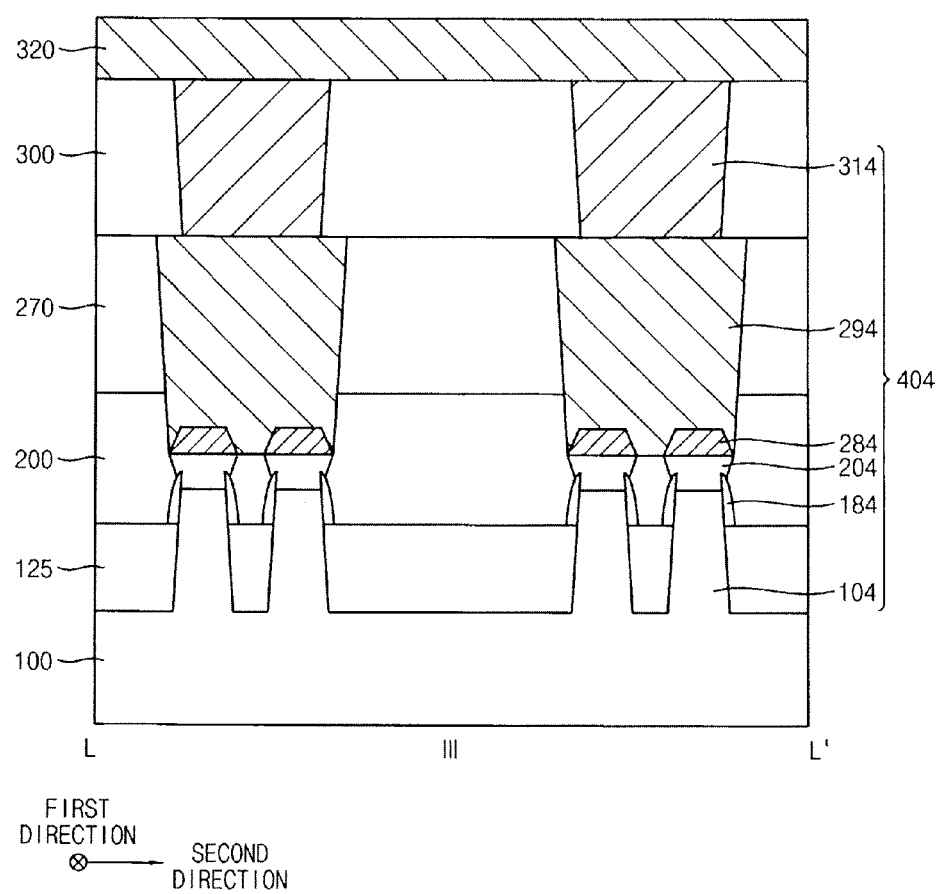
FIGS. 2, 3 and 4 are cross-sectional views of FIG. 1, illustrating a moisture blocking structure and a first guard ring in accordance with exemplary embodiments of the present inventive concept.
Figure 3:
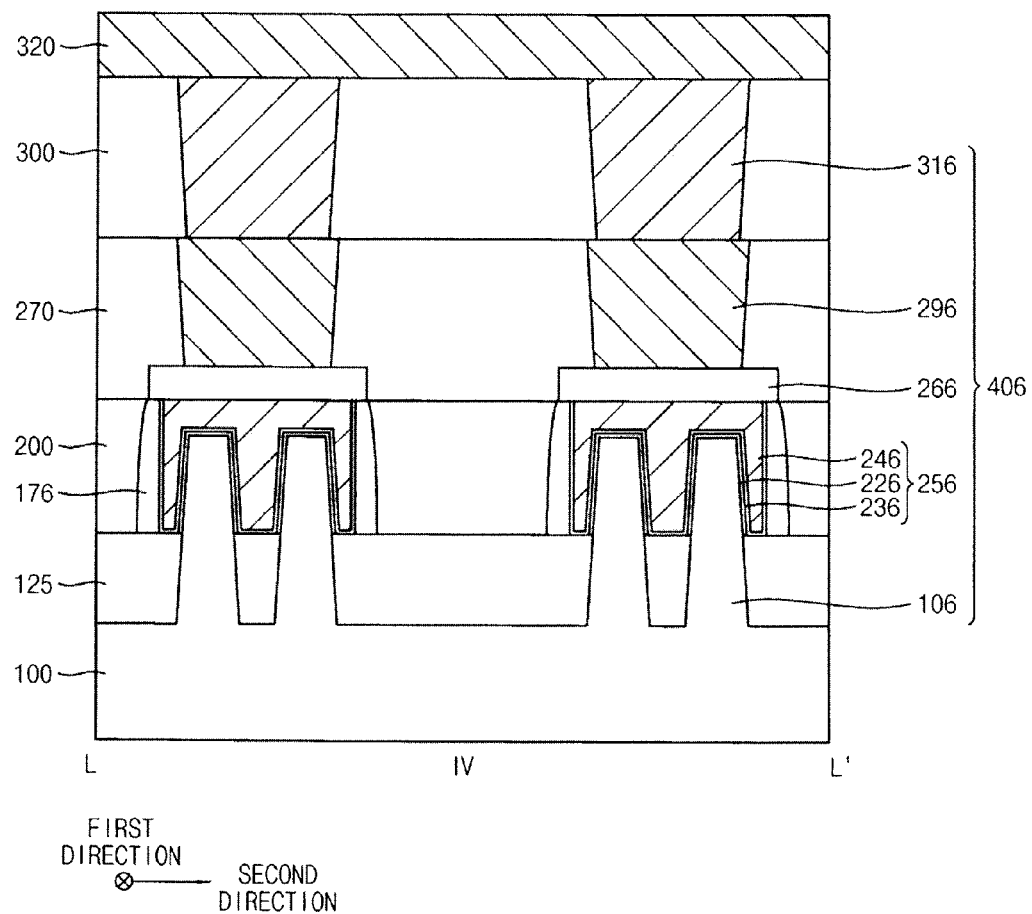
Figure 4:
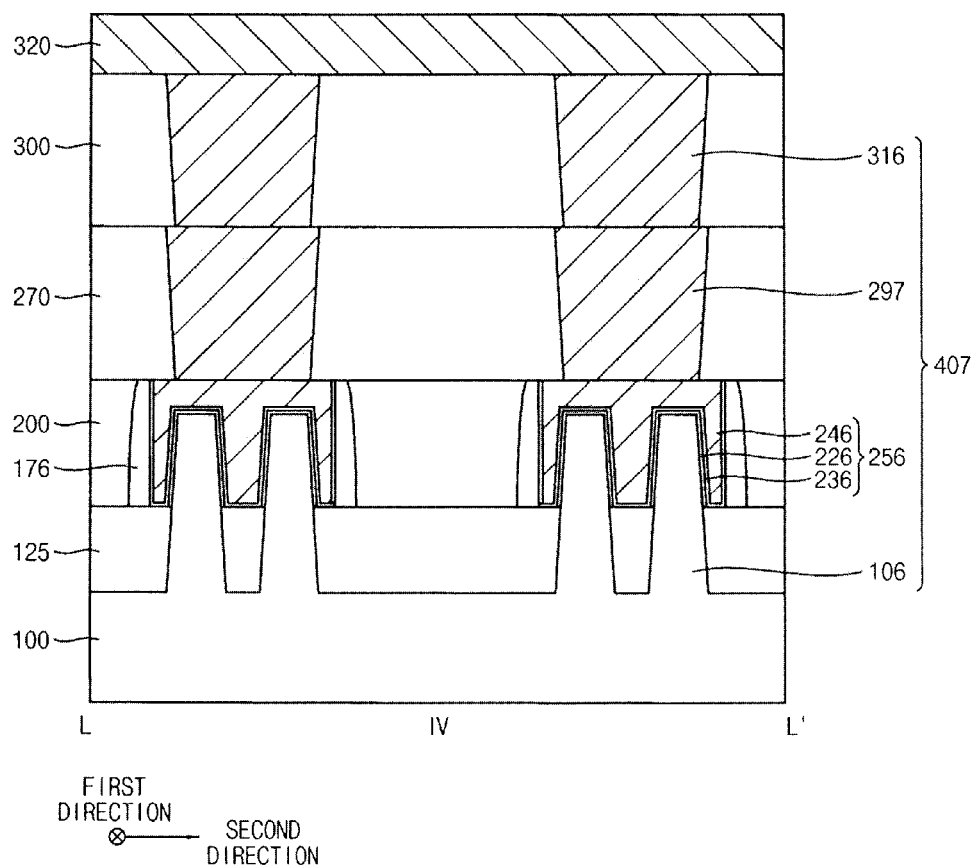
Figure 5:
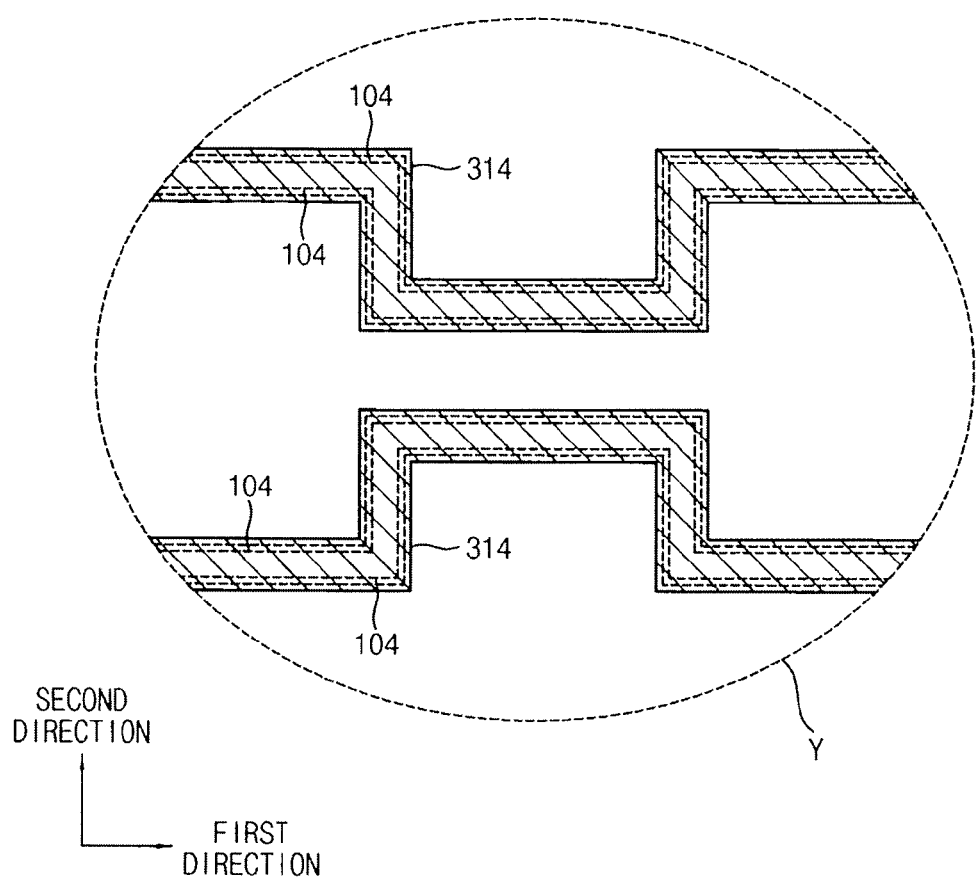
FIGS. 5, 6, 7, 8, 9, 10 and 11 are enlarged plan views illustrating the moisture blocking structure and the first guard ring of FIG. 1, in accordance with exemplary embodiments of the present inventive concept.
Figure 6:
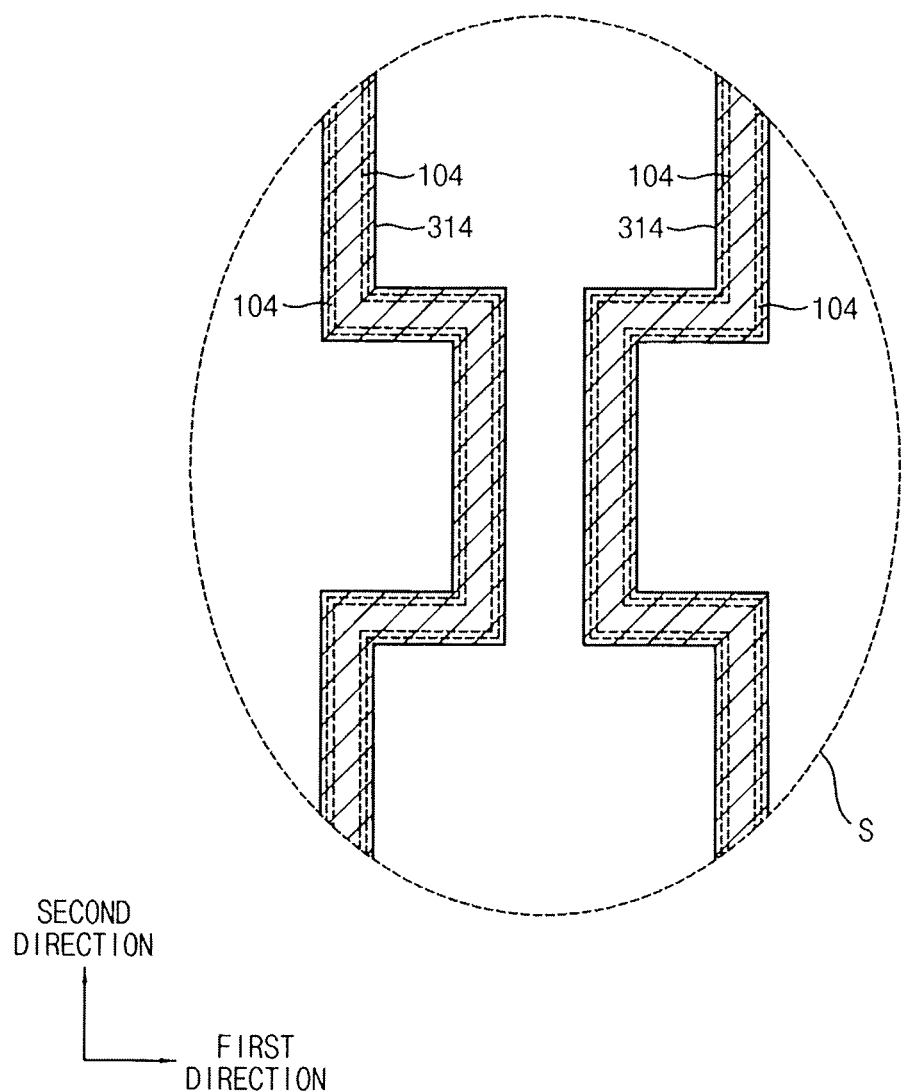
Figure 7:
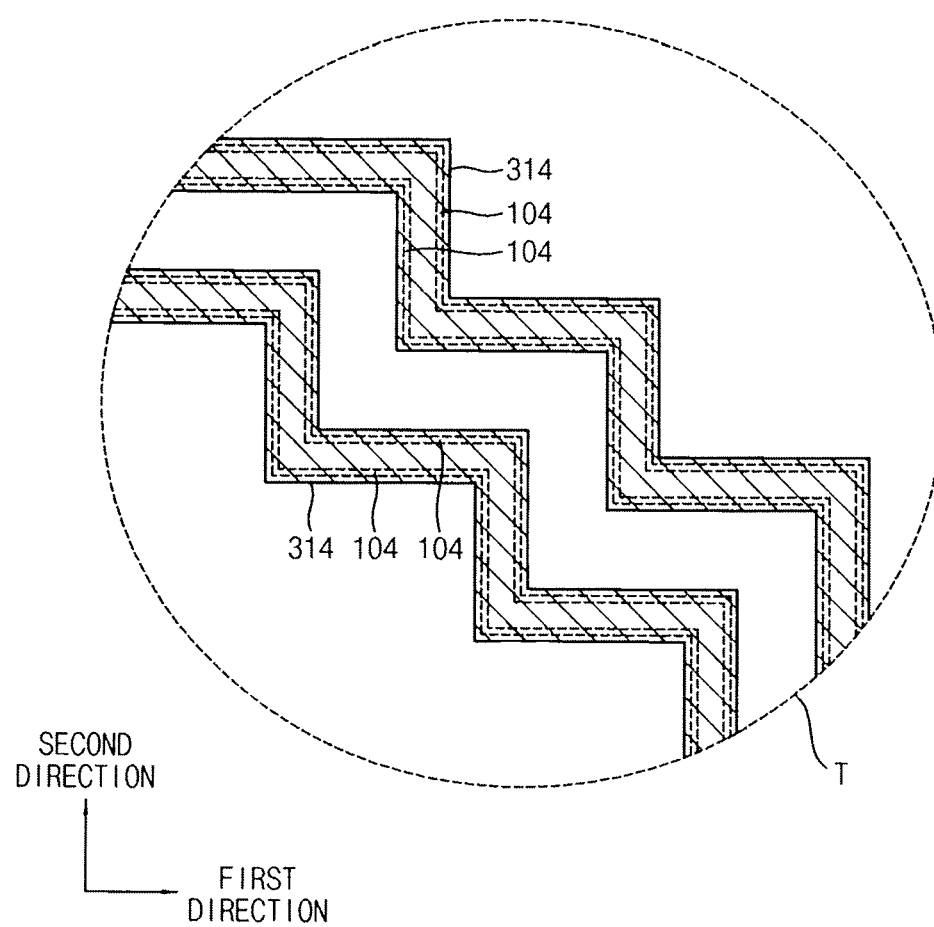

FIG. 1 is a plan view illustrating a moisture blocking structure and a first guard ring in accordance with an exemplary embodiment of the present inventive concept. FIGS. 2 to 4 are cross-sectional views of FIG. 1 illustrating a moisture blocking structure and a first guard ring in accordance with exemplary embodiments of the present inventive concept. FIGS. 5 to 11 are enlarged plan views illustrating the moisture blocking structure and the first guard ring of FIG. 1, in accordance with exemplary embodiments of the present inventive concept. Particularly, FIGS. 2 to 4 are cross-sectional views taken along a line L-L' of FIG. 1. FIGS. 5 and 7 are enlarged plan views of a region Z illustrated in FIG. 1. FIG. 6 is an enlarged plan view of a region Y illustrated in FIG. 1.

Referring to FIGS. 1 to 3 and 5 to 7, a first guard ring 404 and a first moisture blocking structure 406 may be formed on a second region II of a substrate 100.

The substrate 100 may include a semiconductor material such as, for example, silicon, germanium, or the like. The substrate 100 may include a III-V compound semiconductor such as, for example, GaP, GaAs, GaSb, or the like. In an exemplary embodiment of the present inventive concept, the substrate 100 may be a silicon-on-insulator (SOI) substrate or a germanium-on-insulator (GOI) substrate.

The substrate 100 may include first and second regions I and II. The second region II may include third and fourth regions III and IV. The third region III may include fifth, sixth and seventh regions V, VI and VII. The fourth region IV may include eighth, ninth and tenth regions VIII, IX and X.

The first region I may be a chip region in which a semiconductor chip may be formed, and the second region II may be a sealing region surrounding (e.g., surrounding an outer periphery of the first region I) and protecting the semiconductor chip in the first region I. More particularly, the border of the first region I may be surrounded by the second region II, but the second region II may not completely overlap top and bottom sides of the first region I. Hereafter, the term surround may mean to be all around the border of an element or region, except the entirety of its top or bottom sides. However, meaning of the term surround is not limited thereto. The third region III in the second region II may be a guard ring region in which the first guard ring 404 for grounding the semiconductor chip may be formed. The fourth region IV in the second region II may be a region in which the first moisture blocking structure 406 for protecting the semiconductor chip may be formed. The first blocking structure 406 may prevent moisture permeation or crack generation during a dicing process. The dicing process may divide a plurality of semiconductor chips disposed on a wafer from each other.

The third region III may surround the first region I, and may have various shapes for surrounding the first region I. For example, the third region III may surround an outer periphery of the first region I. FIG. 1 shows the third region III having an octagonal shape. However, the present inventive concept need not be limited thereto. When the third region III has the octagonal shape, the third region III may have the fifth region V extending in a first direction substantially parallel to a top surface of the substrate 100, the sixth region VI extending in a second direction substantially parallel to the top surface of the substrate 100 and substantially perpendicular to the first direction, and the seventh region VII connecting the fifth and sixth regions V and VI to each other. The seventh region VII may extend in a direction having an acute angle with the first and second directions.

The fourth region IV may surround the third region III, and may have various shapes for surrounding the third region III. For example, the fourth region IV may surround an outer periphery of the third region III. FIG. 1 shows that the fourth region IV has a rectangular ring shape and a bar shape covering an outer periphery of the seventh region VII in addition thereto. However, the present inventive concept may not be limited thereto. In FIG. 1, the fourth region IV includes the eighth region VIII extending in the first direction, the ninth region IX extending in the second direction, and the tenth region X being connected to the eighth and ninth regions VIII and IX and extending in a direction substantially the same as a direction in which the seventh region VII may extend.

The first guard ring 404 may be formed on the third region III of the substrate 100, and may continuously surround the first region I in a winding line in a plan view. For example, the first guard ring 404 may surround in a plan view the third region III. The winding line of the first guard ring 404 may include a wavy line, a zig-zag line, and the like.

In an exemplary embodiment of the present inventive concept, the first guard ring 404 may include a plurality of first portions, each of which may extend in the first direction, and a plurality of second portions, each of which may extend in the second direction. Each end of each first portion may be connected to an end of a second portion.

Figure 10:
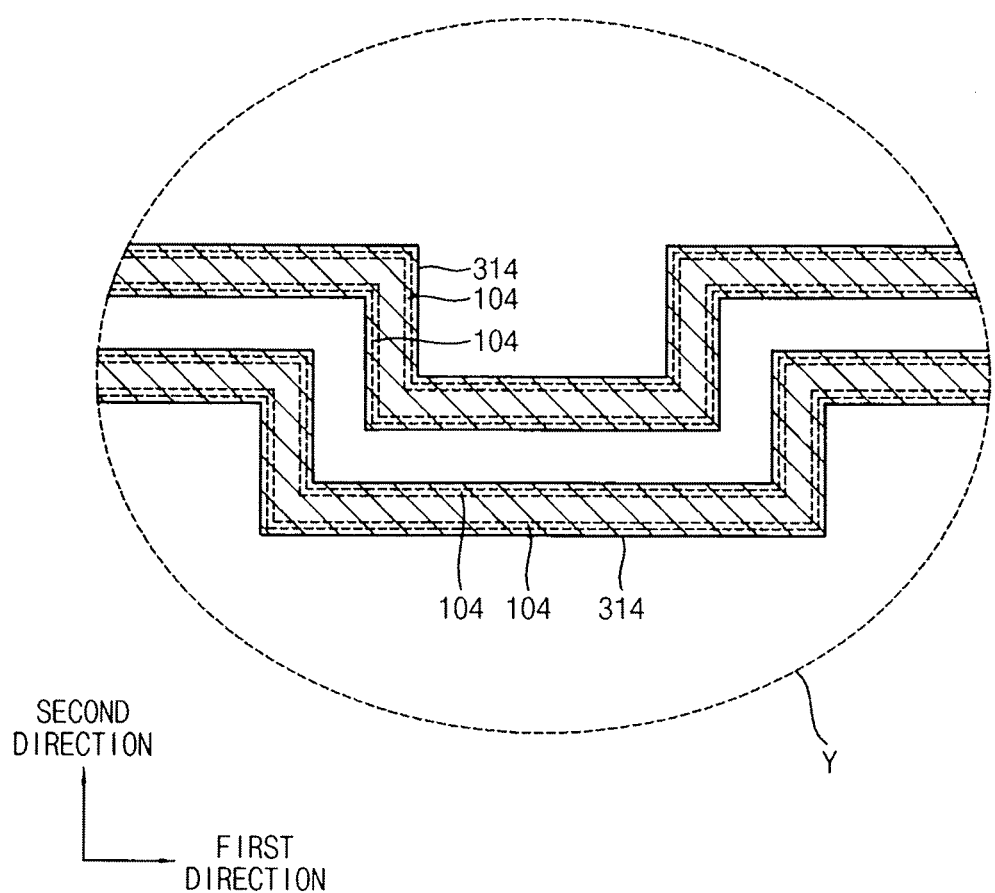
Figure 11:
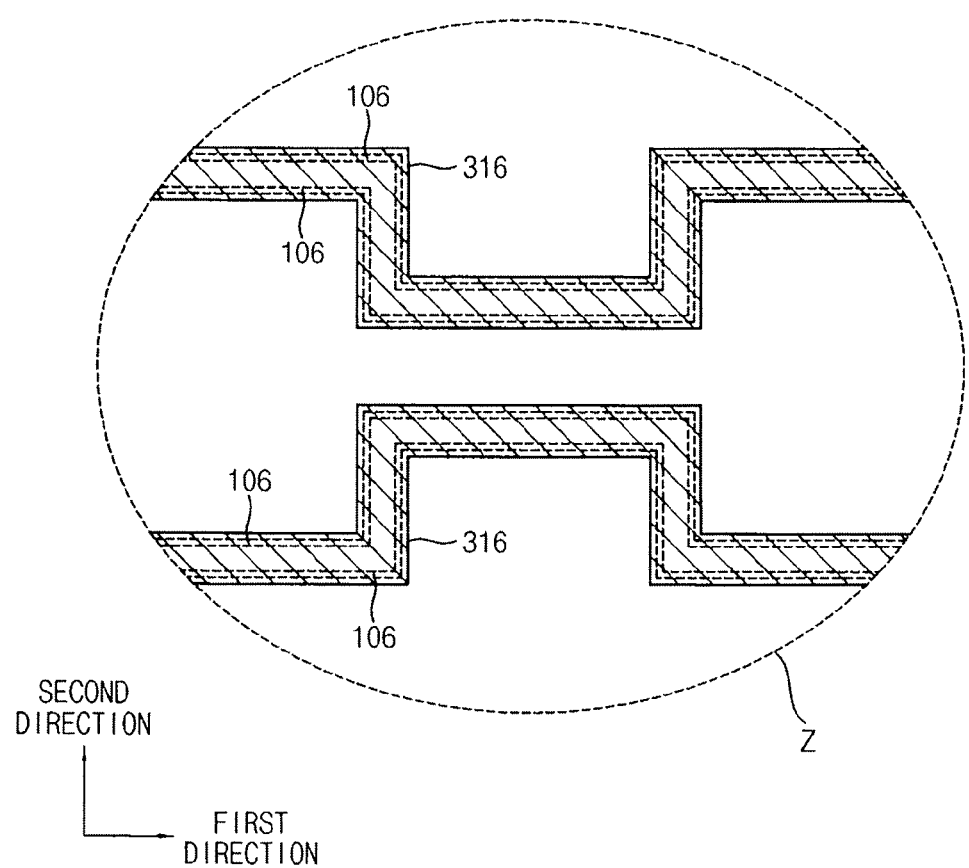

In an exemplary embodiment of the present inventive concept, a plurality of first guard rings 404 may be formed, and the plurality of first guard rings 404 may be disposed outwardly from a center of the first region I. For example, they may be formed away from the center of the first region I. Each of the first guard rings 404 may extend in a winding line to have concave and convex portions. In an exemplary embodiment of the present inventive concept, concave and convex portions of one of the first guard rings 404 may be disposed to face convex and concave portions, respectively, of another one of the first guard ring 404 adjacent thereto. However, the present inventive concept may not be limited thereto. Referring to FIG. 10, concave and convex portions of an outer first guard ring 404 may be disposed to face concave and convex portions, respectively, of an inner first guard ring 404 adjacent to the upper first guard ring 404. Additionally, concave and convex portions of one of the first guard rings 404 may be disposed not to exactly face convex and concave portions of another first guard rings 404 adjacent thereto. For example, the concave and convex portions of an inner first guard ring 404 may be staggered with respect to the concave and convex portions of an outer first guard ring 404 adjacent to the inner guard ring 404.

Figure 8:
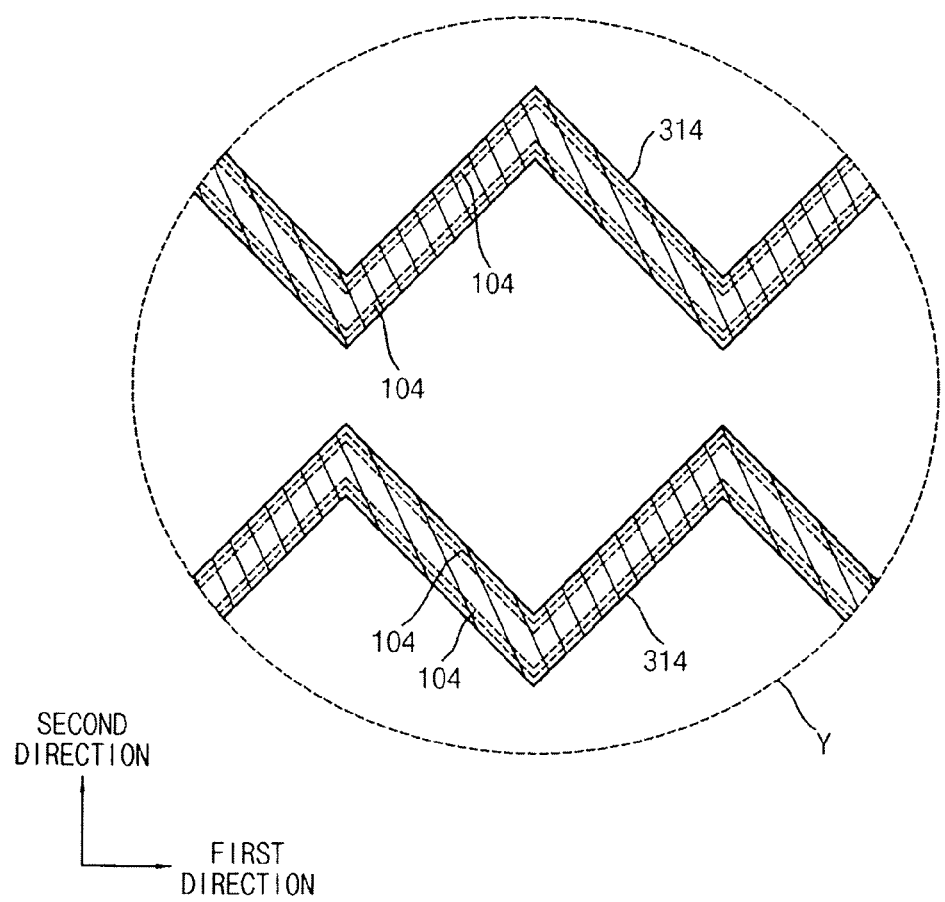

In an exemplary embodiment of the present inventive concept, referring to FIG. 8, the first guard ring 404 may include third and fourth portions extending in third and fourth directions, respectively. Each of the third and fourth portions may have an acute angle with the first and second directions. Each end of each third portion may be connected to an end of a fourth portion.

Figure 9:
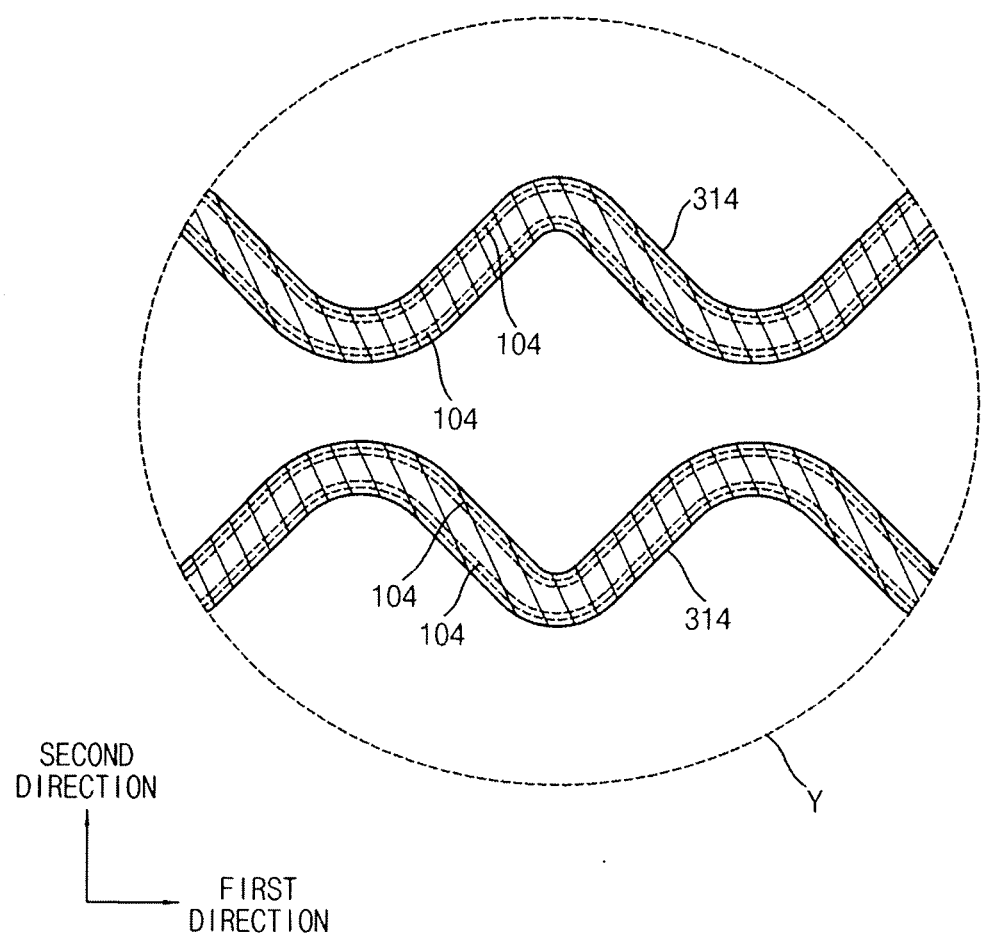

In an exemplary embodiment of the present inventive concept, referring to FIG. 9, the first guard ring 404 may extend in a curved line, for example, in a wave-type line. This way, the first guard ring 404 may have a wavy shape.

Thus, the first guard ring 404 may have any type of winding line. In some cases, the first guard ring 404 may not be straight or bar shaped.

In an exemplary embodiment of the present inventive concept, the first guard ring 404 may include a second active fin 104 and a first conductive structure sequentially stacked on the third region III of the substrate 100. The second active fin 104 may continuously surround (e.g., surround the first region I in a plan view) the first region I in a winding line. The first conductive structure may have a shape corresponding to the shape of the second active fin 104. The second active fin 104 may have the shape of a winding line (e.g., a curved or wavy shape). Accordingly, a mandrel or a mask spacer may not fall down and may be stable in a double patterning process for forming the second active fin 104. A polishing stress may be effectively dispersed in a chemical mechanical polishing (CMP) process for forming an isolation layer pattern 125 so that the second active fin 104 may be stably formed.

The second active fin 104 may protrude from the substrate 100. A lower sidewall of the second active fin 104 may be covered by the isolation layer pattern 125. An upper portion of the second active fin 104 may protrude from a top surface of the isolation layer pattern 125. A second spacer 184 may be formed on both sidewalls of the second active fin 104. The second active fin 104 may include a nitride, for example, silicon nitride, or an oxide, for example, silicon oxide.

The second active fin 104 may include a material substantially the same as that of the substrate 100. In an exemplary embodiment of the present inventive concept, the second active fin 104 may be doped with impurities for example, boron, phosphorus, or the like.

In an exemplary embodiment of the present inventive concept, a plurality of second active fins 104 may be formed outwardly (e.g., formed away) from the center of the first region I, and the first conductive structure may be formed on two neighboring second active fins 104.

The first conductive structure may include a first contact plug 294 and a first via 314 sequentially stacked. The first contact plug 294 may be formed in a first insulating interlayer 200. The first insulating interlayer 200 may be formed on the substrate 100 and may cover the second active fin 104 and the second spacer 184. A second insulating interlayer 270 may be disposed on the first insulating interlayer 200. The first via 314 may be formed in a third insulating interlayer 300. The third insulating layer 300 may be disposed on the second insulating interlayer 270. The first contact plug 294 and the first via 314 may include a metal, for example, tungsten, copper, aluminum, or the like. The first contact plug 294 may include doped polysilicon.

In an exemplary embodiment of the present inventive concept, a plurality of first conductive structures may be formed outwardly (e.g., formed away) from the center of the first region I. A metal plate 320 may be disposed on the plurality of first conductive structures. Thus, the plurality of first conductive structures may be electrically connected to each other. Currents flowing in the metal plate 320 and other upper wirings connected thereto may be grounded to the substrate 100 by the first guard ring 404 including the second active fin 104, the first contact plug 294 and the first via 314.

A second source/drain layer 204 and a second metal silicide pattern 284 may be formed between the second active fin 104 and the first contact plug 294.

The second source/drain layer 204 may be formed on the second active fin 104 and the second spacer 184. The second source/drain layer 204 may be formed by a selective epitaxial growth (SEG) process using the second active fin 104 as a seed. In an exemplary embodiment of the present inventive concept, the second source/drain layer 204 may include a single crystalline silicon-germanium layer doped with impurities, a single crystalline silicon carbide layer doped with impurities, a single crystalline silicon layer doped with impurities, or the like.

The second metal silicide pattern 284 may be formed by a chemical reaction between the source/drain layer 204 and a metal layer. The second metal silicide pattern 284 may include, for example, cobalt silicide, nickel silicide, or the like.

In an exemplary embodiment of the present inventive concept, the second source/drain layer 204 and the second metal silicide pattern 284 may not be formed. In this case, the first contact plug 294 may directly contact the second active fin 104.

The first moisture blocking structure 406 may be formed on the fourth region IV of the substrate 100, and may continuously surround the third region III in a winding line in a plan view. For example, the first moisture blocking structure 406 may surround in a plan view the third region III.

The first moisture blocking structure 406 may have a shape similar to that of the first guard ring 404 in a plan view. For example, referring to FIG. 11, the first moisture blocking structure 406 on the eighth region VIII may have a shape similar to that of the first guard ring 404 illustrated with reference to FIG. 5. The first moisture blocking structure 406 may include a plurality of fifth portions each of which may extend in the first direction, and a plurality of sixth portions each of which may extend in the second direction. Each end of each fifth portion may be connected to an end of a sixth portion. Additionally, the first moisture blocking structure 406 on the ninth and tenth regions IX and X may have a shape similar to that of the first guard ring 404 on the fifth and sixth regions V and VI.

A plurality of first moisture blocking structures 406 may be formed outwardly (e.g., be offset) from the center of the first region I. In an exemplary embodiment of the present inventive concept, the first moisture blocking structure 406 may be curved, for example, like a wave. In other words, the first moisture blocking structure 406 may have a curved shape including a plurality of windings. According to an exemplary embodiment of the present inventive concept, the first moisture blocking structure 406 may have a jagged portion. The first moisture blocking structure 406 may also be formed in a straight line.

In an exemplary embodiment of the present inventive concept, the first moisture blocking structure 406 may include a third active fin 106, a second gate structure 256, and a second conductive structure sequentially stacked on the fourth region IV of the substrate 100.

The third active fin 106 may continuously surround (e.g., surround in a plan view) the third region III in a winding line. Each second gate structure 256 and each second conductive structure may have a shape corresponding to the shape of a third active fin 106. The third active fin 106 may have the shape of a winding line. Accordingly, a mandrel or a mask spacer may not fall down and may be stable in a double patterning process for forming the third active fin 106. A polishing stress may be effectively dispersed in a CMP process for forming the isolation layer pattern 125 so that the third active fin 106 may be stably formed.

The third active fin 106 may protrude from the substrate 100. A lower sidewall of the third active fin 106 may be covered by the isolation layer pattern 125 and an upper portion of the third active fin 106 may protrude from a top surface of the isolation layer pattern 125. The third active fin 106 may include a material substantially the same as that of the substrate 100. In an exemplary embodiment of the present inventive concept, the third active fin 106 may be doped with impurities, for example, boron, phosphorus, or the like.

In an exemplary embodiment of the present inventive concept, a plurality of third active fins 106 may be formed outwardly (e.g., formed away) from the center of the first region I, and the second gate structure 256 may be formed on two neighboring third active fins 106. The second gate structure 256 may cover a portion of the isolation layer pattern 125 between the two third active fins 106. The second gate structure 256 may cover portions of the isolation layer pattern 125 adjacent to outer sidewalls of the second gate structure 256.

The second gate structure 256 may include a second interface layer pattern 226, a second gate insulation layer pattern 236 and a second gate electrode 246 sequentially stacked on the third active fin 106. A second gate spacer 176 may be formed on both sidewalls of the second gate structure 256, and a second blocking layer pattern 266 may be formed on top surfaces of the second gate structure 256 and the second gate spacer 176.

The second interface layer pattern 226 may include an oxide, for example, silicon oxide. In an exemplary embodiment of the present inventive concept, the second interface layer pattern 226 may be formed only on a top surface of the third active fin 106. The second interface layer pattern 226 may also be formed on the isolation layer pattern 125. Alternatively, the second interface layer pattern 226 may be omitted.

The second gate insulation layer pattern 236 may include a metal oxide having a high dielectric constant, for example, hafnium oxide, tantalum oxide, zirconium oxide, or the like. The second gate insulation layer pattern 236 may be formed on the second interface layer pattern 226, the isolation layer pattern 125 and an inner sidewall of the second gate spacer 176. The second gate insulation layer pattern 236 may cover a bottom and a sidewall of the second gate electrode 246.

The second gate electrode 246 may include a material having a low resistance, for example, a metal such as aluminum, copper, tantalum, or the like. The second gate electrode 246 may include doped polysilicon.

The second gate structure 256 may include a dummy gate insulation layer pattern including silicon oxide and a dummy gate electrode including polysilicon instead of the second interface layer pattern 226, the second gate insulation layer pattern 236 and the second gate electrode 246.

The second gate spacer 176 and the second blocking layer pattern 266 may include a nitride, for example, silicon nitride.

The second conductive structure may include a second contact plug 296 and a second via 316 sequentially stacked. The second contact plug 296 may be formed in the second insulating interlayer 270. The second via 316 may be formed in the third insulating interlayer 300. The second contact plug 296 and the second via 316 may include a material substantially the same as that of the first contact plug 294 and of the first via 314. The second contact plug 296 and the second via 316 may include a metal, for example, tungsten, copper, aluminum, or the like, or doped polysilicon.

In an exemplary embodiment of the present inventive concept, a plurality of second conductive structures may be formed outwardly (e.g., be offset) from the center of the first region I, and the metal plate 320 may be formed on the plurality of second conductive structures. Thus, the plurality of second conductive structures may be electrically connected to each other, and electrically connected to the first conductive structures.

In the first moisture blocking structure 406 including the third active fin 106, the second gate structure 256, the second blocking layer pattern 266, the second contact plug 296 and the second via 316, the second gate structure 256 may cover two third active fins 106. Thus, a route through which moisture may inflow from the outside into the first region I may be lengthened, and an external influence therefrom may be lessened.

Referring to FIG. 4, a second moisture blocking structure 407 may not include a blocking layer pattern on the second gate structure 256. In this case, the second gate structure 256 may directly contact a fourth contact plug 297.

A guard ring may be formed only on the third region III of the substrate 100 (e.g., the first guard ring 404). However, a guard ring may be also formed on the fourth region IV of the substrate 100. This guard ring may be referred to as a second guard ring. For example, the second guard ring may include the third active fin 106, the first contact plug 294 and the first via 314 sequentially stacked. The second guard ring may be formed on the fourth region IV of the substrate 100 to ground current and block moisture to reduce their impact to the chip region.

Figure 12:
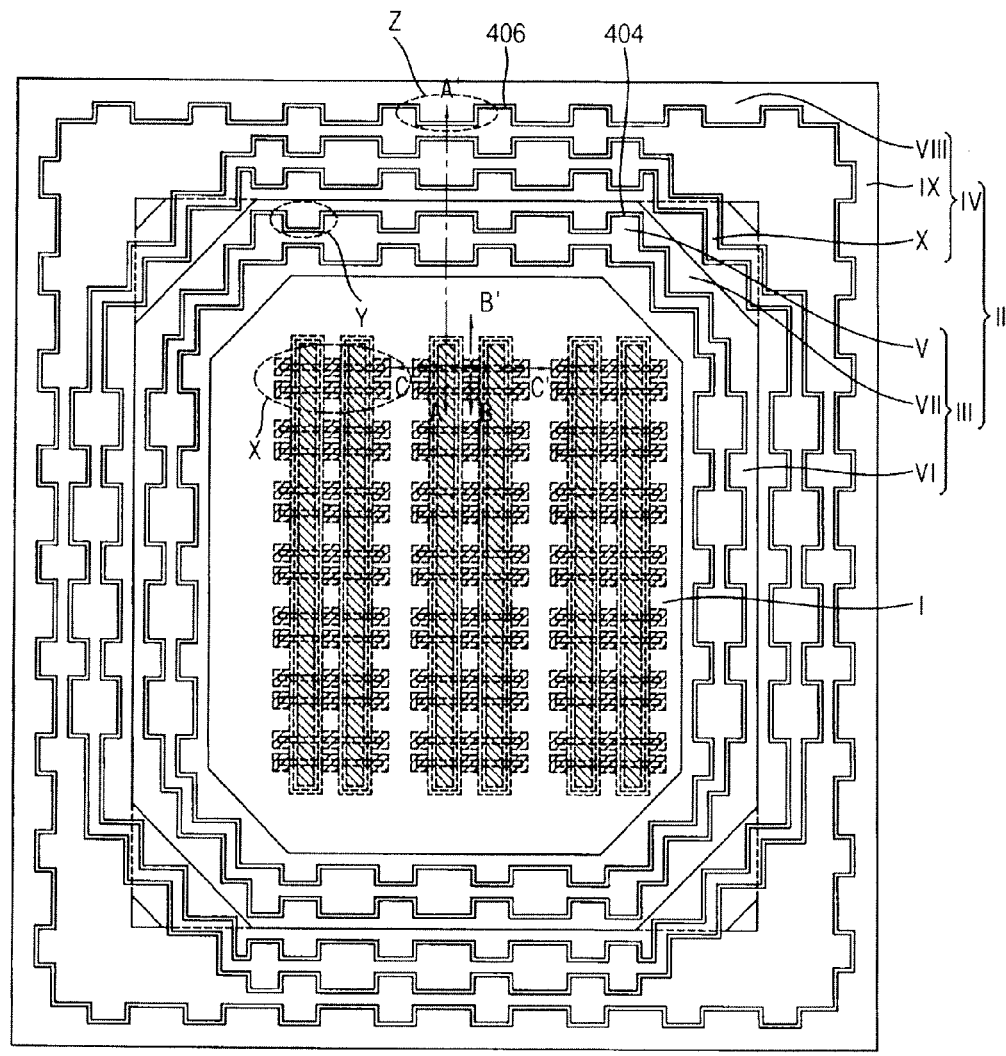
FIG. 12 is a plan view illustrating a semiconductor device in accordance with an exemplary embodiment of the present inventive concept.
Figure 13:
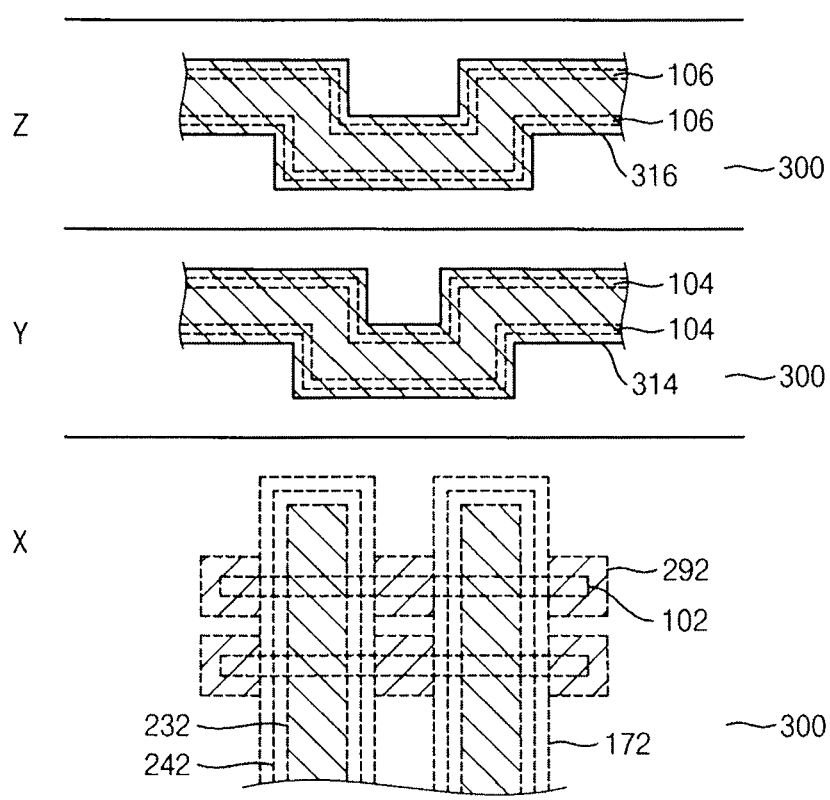
FIGS. 13, 14, 15 and 16 are cross-sectional views of FIG. 12, illustrating a semiconductor device in accordance with exemplary embodiments of the present inventive concept.
Figure 14:
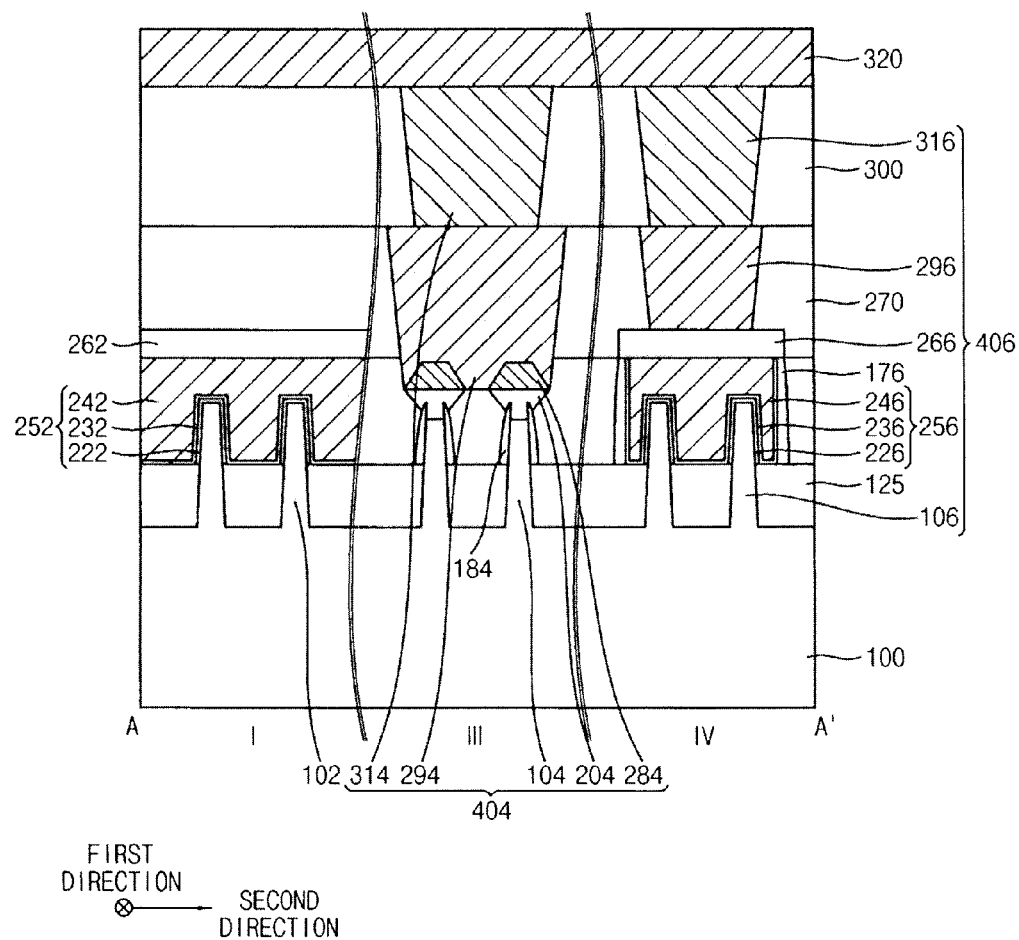
Figure 15:
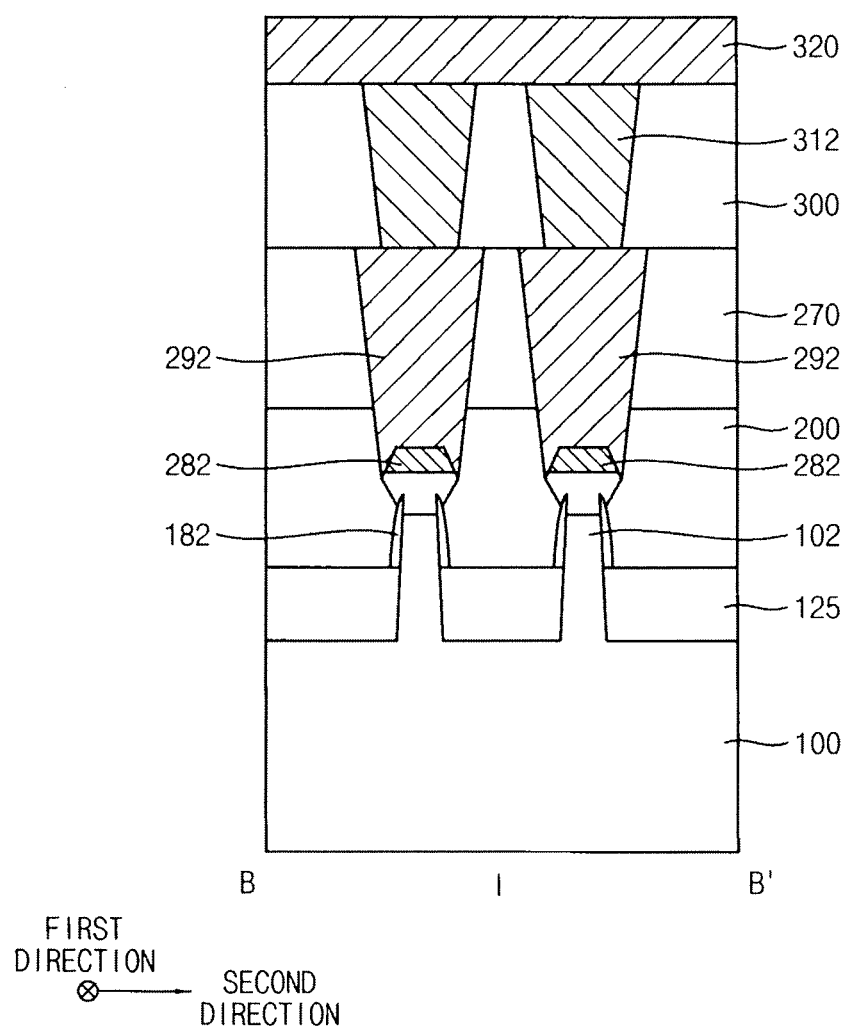
Figure 16:
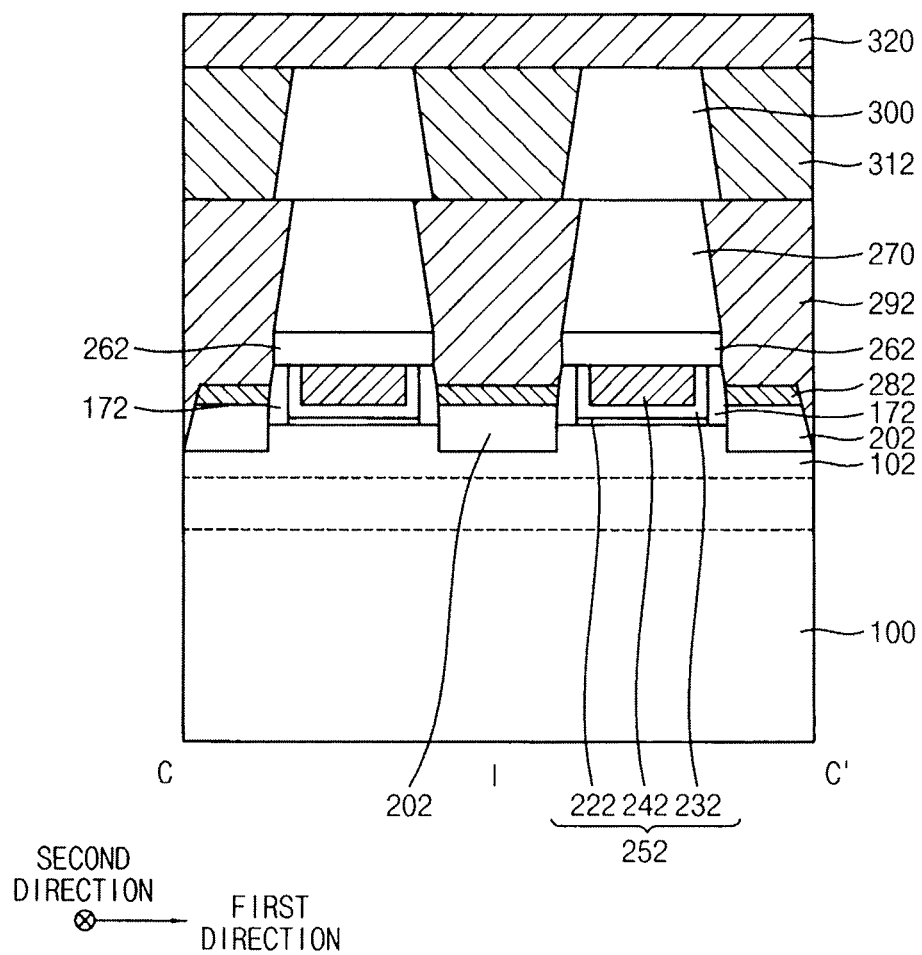

FIG. 12 is a plan view illustrating a semiconductor device in accordance with an exemplary embodiment of the present inventive concept. FIGS. 13 to 16 are cross-sectional views of FIG. 12, illustrating a semiconductor device in accordance with exemplary embodiments of the present inventive concept. Particularly, FIG. 13 is an enlarged cross-sectional view illustrating regions X, Y and Z of FIG. 12. FIGS. 14 to 16 are cross-sectional views taken along lines A-A', B-B', and C-C' of FIG. 12, respectively. The semiconductor device may include the first moisture blocking structure 406 and the first guard ring 404 illustrated with reference to FIGS. 1 to 11. Detailed description of elements already described with reference to FIGS. 1 to 11 may be omitted for brevity.

Referring to FIGS. 12 to 16, the semiconductor device may include a transistor, a first guard ring 404 and a first moisture blocking structure 406 on a substrate 100.

The substrate 100 may include first to tenth regions I to X. The first region I may be a chip region in which a semiconductor chip including a transistor may be formed. The second region II may be a sealing region surrounding (e.g., surrounding an outer periphery of the first region I) and protecting the semiconductor chip in the first region I. The third region III in the second region II may be a guard ring region in which the first guard ring 404 for grounding the semiconductor chip may be formed. The fourth region IV in the second region II may be a region in which the first moisture blocking structure 406 may be formed. The moisture blocking structure 406 may protect the semiconductor chip by preventing moisture permeation or crack generation.

The transistor may include a first active fin 102 on the first region I of the substrate 100, a first gate structure 252 on the first active fin 102, and a first source/drain layer 202 on the first active fin 102 adjacent to the first gate structure 252.

In an exemplary embodiment of the present inventive concept, a first active fin 102 may extend in a first direction substantially parallel to a top surface of the substrate 100. A plurality of first active fins 102 may be formed in a second direction substantially parallel to the top surface of the substrate 100 and substantially perpendicular to the first direction. A first spacer 182 may be formed on both sidewalls of the first active fin 102, and may include a nitride, for example, silicon nitride, or an oxide such as, for example, silicon oxide.

The first gate structure 252 may include a first interface layer pattern 222, a first gate insulation layer pattern 232, and a first gate electrode 242 sequentially stacked on the first active fin 102. A first gate spacer 172 may be formed on both sidewalls of the first gate structure 252. A first blocking layer pattern 262 may be formed on top surfaces of the first gate structure 252 and the first gate spacer 172.

The first interface layer pattern 222 may include an oxide, for example, silicon oxide. In an exemplary embodiment of the present inventive concept, the first interface layer pattern 222 may be formed only on a top surface of the first active fin 102. The first interface layer pattern 222 may also be formed on a top surface of the first active fin 102 and on an isolation layer pattern 125 on the substrate 100. Alternatively, the first interface layer pattern 222 may be omitted.

The first gate insulation layer pattern 232 may include a metal oxide having a high dielectric constant, for example, hafnium oxide, tantalum oxide, zirconium oxide, or the like. The first gate insulation layer pattern 232 may be formed on the first interface layer pattern 222, the isolation layer pattern 125 and an inner sidewall of the first gate spacer 172. The first gate insulation layer pattern 232 may cover a bottom and a sidewall of the first gate electrode 242.

The first gate electrode 242 may include a material having a low resistance, for example, a metal such as aluminum, copper, tantalum, or the like, or doped polysilicon. The first gate spacer 172 and the first blocking layer pattern 262 may include a nitride, for example, silicon nitride.

The first source/drain layer 202 may be formed on the first active fin 102 and the first spacer 182. The first source/drain layer 202 may be formed by an SEG process using the first active fin 102 as a seed. In an exemplary embodiment of the present inventive concept, the first source/drain layer 202 may include a single crystalline silicon-germanium layer doped with impurities, a single crystalline silicon carbide layer doped with impurities, a single crystalline silicon layer doped with impurities, or the like.

A first metal silicide pattern 282 may be formed on the first source/drain layer 202. The first metal silicide pattern 282 may include, for example, cobalt silicide, nickel silicide, or the like.

A transistor may be formed in a first insulating interlayer 200. Second and third insulating interlayers 270 and 300 may be sequentially formed on the first insulating interlayer 200. A third contact plug 292 may be formed in the first and second insulating interlayers 200 and 270. The third contact plug 292 may contact the first metal silicide pattern 282. A third via 312 may be formed in the third insulating interlayer 300. The third via 312 may contact the third contact plug 292. The third contact plug 292 and the third via 312 may include a metal, for example, tungsten, copper, aluminum, or the like, or doped polysilicon. A metal plate 320 may be disposed on a top surface of the third via 312.

A fifth contact plug may be formed in the first and second insulating interlayers 200 and 270. The fifth contact plug may contact the first gate structure 252. Additionally, a fifth via may be formed in the third insulating interlayer 300. The fifth via may contact a top surface of the fifth contact plug and a bottom of the metal plate 320.

A first guard ring 404 may be formed on the third region III of the substrate 100, and may continuously surround (e.g., surround in a plan view) the first region I in a winding line in a plan view. On the fifth to seventh regions V, VI, and VII, the first guard ring 404 may include a variety of windings such as wavy portions or zig-zag portions. In this case, the first guard ring 404 may or may not be in the form of a straight line or bar.

In an exemplary embodiment of the present inventive concept, the first guard ring 404 may include a second active fin 104 and a first conductive structure sequentially stacked on the third region III of the substrate 100. The second active fin 104 may continuously surround the first region I in a winding line, and the first conductive structure may have a shape corresponding to the shape of the second active fin 104.

The second active fin 104 may protrude from the substrate 100, and may include a material substantially the same as that of the substrate 100 and the first active fin 102. In an exemplary embodiment of the present inventive concept, the second active fin 104 may be doped with impurities, for example, boron, phosphorus, or the like. A second spacer 184 may be formed on both sidewalls of the second active fin 104. The second spacer 184 may include a material substantially the same as that of the first spacer 182.

The first conductive structure may include a first contact plug 294 and a first via 314 sequentially stacked. The first contact plug 294 and the first via 314 may include materials substantially the same as those of the third contact plug 292 and the third via 312, respectively.

In an exemplary embodiment of the present inventive concept, a plurality of first conductive structures may be formed outwardly (e.g., formed away) from the center of the first region I. The metal plate 320 may be formed on the plurality of first conductive structures. Thus, the plurality of first conductive structures may be electrically connected to each other. Further, the plurality of first conductive structures may be electrically connected to the third via 312 and the third contact plug 292. Thus, currents flowing in the metal plate 320 and wirings on the first region I connected thereto may be grounded to the substrate 100 by the first guard ring 404 including the second active fin 104, the first contact plug 294 and the first via 314.

A second source/drain layer 204 and a second metal silicide pattern 284 may be further formed between the second active fin 104 and the first contact plug 294. The second source/drain layer 204 and the second metal silicide pattern 284 may include materials substantially the same as those of the first source/drain layer 202 and the first metal silicide pattern 282, respectively. However, in an exemplary embodiment of the present inventive concept, the second source/drain layer 204 and the second metal silicide pattern 284 may not be formed. In this case, the first contact plug 294 may directly contact the second active fin 104.

The first moisture blocking structure 406 may be formed on the fourth region IV of the substrate 100, and may continuously surround (e.g., surround in a plan view) the third region III in a winding line in a plan view. The first moisture blocking structure 406 may have a variety of winding line shapes on the eighth to tenth regions IIIV, IX, and X. The first moisture blocking structure 406 might not have a straight line shape.

In an exemplary embodiment of the present inventive concept, the first moisture blocking structure 406 may include a third active fin 106, a second gate structure 256, and a second conductive structure sequentially stacked on the fourth region IV of the substrate 100. The third active fin 106 may continuously surround (e.g., surround in a plan view) the third region III in a winding line, and the second gate structure may have a shape corresponding to the shape of the third active fin 106.

The third active fin 106 may protrude from the substrate 100, and a lower sidewall of the third active fin 106 may be covered by the isolation layer pattern 125. An upper portion of the third active fin 106 may protrude from a top surface of the isolation layer pattern 125. The third active fin 106 may include a material substantially the same as that of the substrate 100, and the first and second active fins 102 and 104. In an exemplary embodiment of the present inventive concept, the third active fin 106 may be doped with impurities such as, for example, boron, phosphorus, or the like.

The second gate structure 256 may include a second interface layer pattern 226, a second gate insulation layer pattern 236 and a second gate electrode 246 sequentially stacked on the third active fin 106. A second gate spacer 176 may be formed on both sidewalls of the second gate structure 256, and a second blocking layer pattern 266 may be formed on top surfaces of the second gate structure 256 and the second gate spacer 176.

The second interface layer pattern 226, the second gate insulation layer pattern 236, and the second gate electrode 246 may include materials substantially the same as those of the first interface layer pattern 222, the first gate insulation layer pattern 232, and the first gate electrode 242, respectively. However, the second gate structure 256 may include a dummy gate insulation layer pattern including silicon oxide, and a dummy gate electrode including polysilicon instead of the second interface layer pattern 226, the second gate insulation layer pattern 236, and the second gate electrode 246.

The second gate spacer 176 and the second blocking layer pattern 266 may include materials substantially the same as those of the first gate spacer 172 and the first blocking layer pattern 262, respectively.

The second conductive structure may include a second contact plug 296 and a second via 316 sequentially stacked. The second contact plug 296 and the second via 316 may include materials substantially the same as those of the first contact plug 294 and the first via 314, respectively.

In an exemplary embodiment of the present inventive concept, a plurality of second conductive structures may be formed outwardly from the center of the first region I, and the metal plate 320 may be formed on top surfaces of the plurality of second conductive structures. Thus, the plurality of second conductive structures may be electrically connected to each other via the metal plate 320. The plurality of second conductive structures may also be electrically connected to the first conductive structures, the third via 312 and the third contact plug 292 on the first region I.

In the first moisture blocking structure 406 including the third active fin 106, the second gate structure 256, the second blocking layer pattern 266, the second contact plug 296 and the second via 316, the second gate structure 256 may cover the two third active fins 106. Thus, a route through which moisture may inflow from the outside into the third region III may be lengthened, and an external influence therefrom may be lessened.

In an exemplary embodiment of the present inventive concept, the first moisture blocking structure 406 may not include a blocking layer pattern on the second gate structure 256. In this case, the second gate structure 256 may directly contact the fourth contact plug 296.

A second guard ring may be formed on the fourth region IV of the substrate 100. The second guard ring may include the third active fin 106, the first contact plug 294 and the first via 314 sequentially stacked. The substrate 100 may be grounded by the second guard ring. The second guard ring may be formed on the fourth region IV of the substrate 100 to ground current and block moisture to reduce their impact on the chip region.

FIGS. 17 to 65 are plan views and cross-sectional views illustrating stages of a method of manufacturing a semiconductor device in accordance with exemplary embodiments of the present inventive concept. FIGS. 17, 19, 22, 27, 31, 35, 39, 43, 47, 51, 54, 57 and 61 are plan views of the semiconductor device. FIGS. 18, 20, 21, 23-26, 28, 32, 36, 40, 44, 48, 50, 52, 55, 58, 62, and 65 are cross-sectional views taken along a line A-A' of corresponding plan views. FIGS. 29, 33, 37, 41, 45, 59, and 63 are cross-sectional views taken along a line B-B' of corresponding plan views. FIGS. 30, 34, 38, 42, 46, 49, 53, 56, 60 and 64 are cross-sectional views taken along a line C-C' of corresponding plan views. In FIGS. 31, 35, 39, 43, 47, 51, 54, 57 and 61, enlarged cross-sectional views of regions X, Y and Z of FIG. 27 are shown, instead of all regions in the interest of brevity.

This method may be used for manufacturing the semiconductor device illustrated with reference to FIGS. 12 to 17. However, the present inventive concept is not limited thereto.

Figure 18:
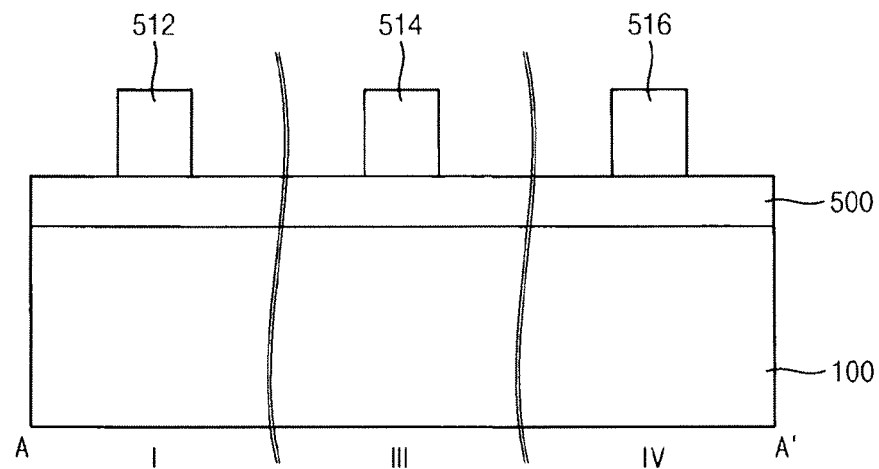

Referring to FIGS. 17 and 18, a mask layer 500 may be formed on a substrate 100. First, second and third sacrificial layer patterns 512, 514 and 516 may be formed on the mask layer 500 in first, third and fourth regions I, III, IV, respectively. The first to third sacrificial layer patterns 512, 514 and 516 may serve as a mandrel in a double patterning process.

In an exemplary embodiment of the present inventive concept, the first sacrificial layer pattern 512 may extend in the first direction, and the second and third sacrificial layer patterns 514 and 516 may continuously surround (e.g., surround in a plan view) the first and third regions I and III, respectively, in a winding line in a plan view. In an exemplary embodiment of the present inventive concept, a plurality of first sacrificial layer patterns 512, a plurality of second sacrificial layer patterns 514, and a plurality of third sacrificial layer patterns 516 may be formed.

The first sacrificial layer pattern 512 may extend in the first direction in a straight line, and thus may fall down if the first sacrificial layer pattern 512 has a length more than a given length. The plurality of first sacrificial layer patterns 512, each having a length less than the given length, may be formed in the first direction. However, each of the second and third sacrificial layer patterns 514 and 516 may not extend in a direction in a straight line. Thus, the second and third sacrificial layer patterns 514 and 516 may not fall down but may be stably formed with a long length.

The mask layer 500 may include a nitride, for example, silicon nitride. The first to third sacrificial layer patterns 512, 514 and 516 may include polysilicon, amorphous carbon layer (ACL), spin-on organic hardmask (SOH), or the like.

Figure 19:
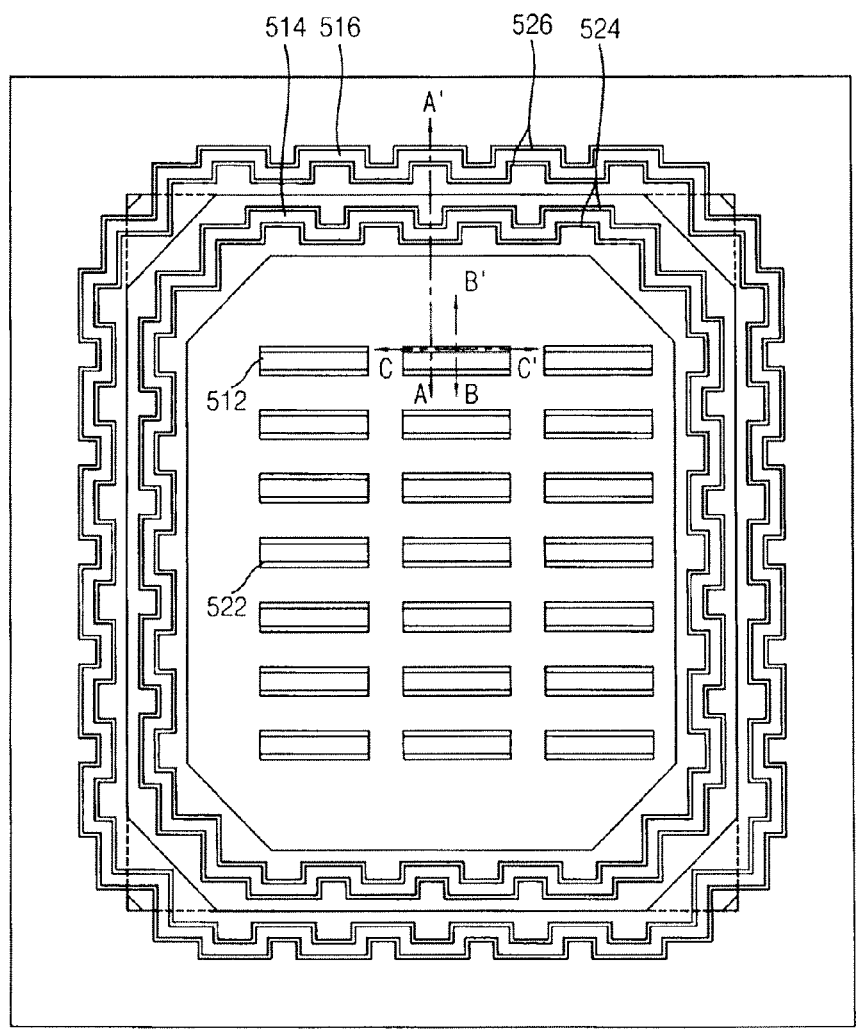
Figure 20:
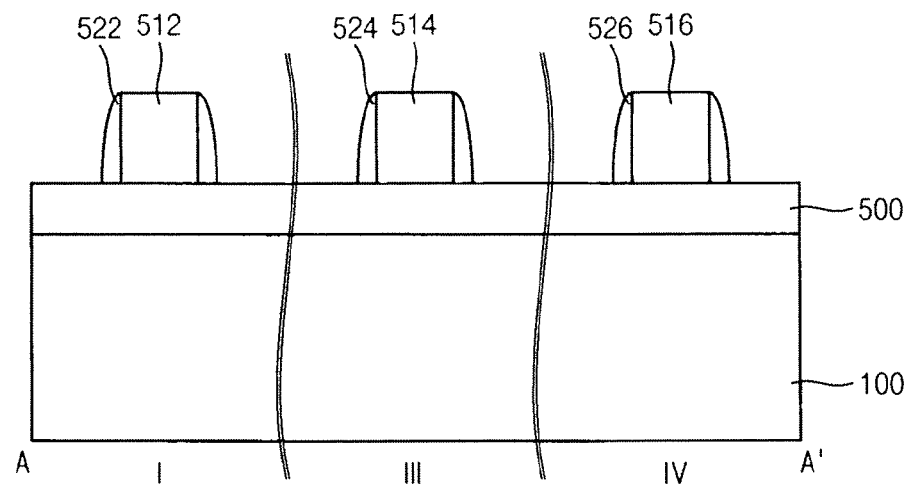

Referring to FIGS. 19 and 20, first, second and third mask spacers 522, 524 and 526 may be formed on both sidewalls of the first, second and third sacrificial layer patterns 512, 514 and 516, respectively.

In an exemplary embodiment of the present inventive concept, the first to third mask spacers 522, 524 and 526 may be formed by forming a mask spacer layer on the mask layer 500 to cover the first to third sacrificial layer patterns 512, 514 and 516, and anisotropically etching the mask spacer layer. The first to third mask spacers 522, 524 and 526 may be formed to have widths less than those of the first to third sacrificial layer patterns 512, 514 and 516. Even though the first to third mask spacers 522, 524 and 526 may have small widths, the first to third mask spacers 522, 524 and 526 may not fall down for the same reason described above with reference to the first to third sacrificial layer patterns 512, 514 and 516.

The mask spacer layer may be an oxide. The oxide may be formed by using, for example, an atomic layer deposition (ALD) process.

Figure 21:
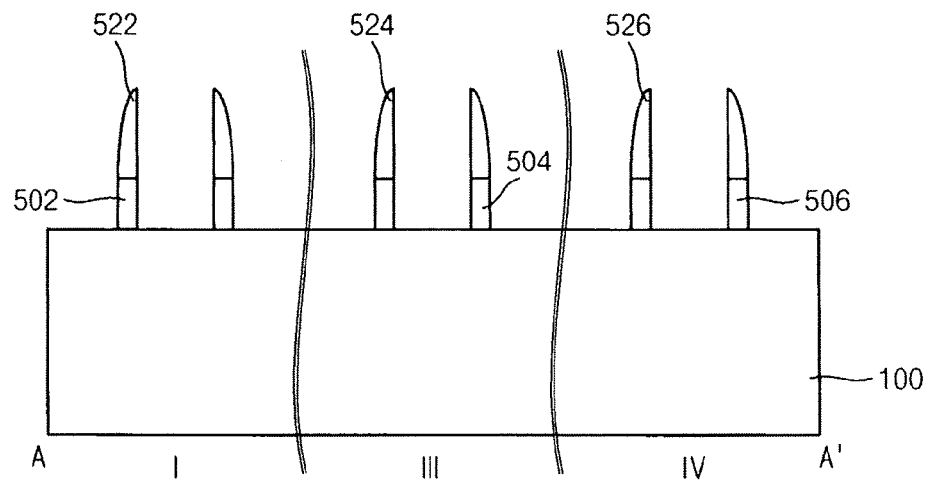

Referring to FIG. 21, after removing the first to third sacrificial layer patterns 512, 514 and 516, the mask layer 500 may be etched using the first to third mask spacers 522, 524 and 526 as an etching mask to form first, second and third masks 502, 504 and 506 in the first, third and fourth regions I, III, and IV, respectively.

In an exemplary embodiment of the present inventive concept, the first to third sacrificial layer patterns 512, 514 and 516 may be removed by a wet etching process or a dry etching process, and the mask layer 500 may be etched by a dry etching process.

In an exemplary embodiment of the present inventive concept, the first to third masks 502, 504 and 506 may be formed to have shapes substantially the same as those of the first to third mask spacers 522, 524 and 526, respectively.

Figure 22:
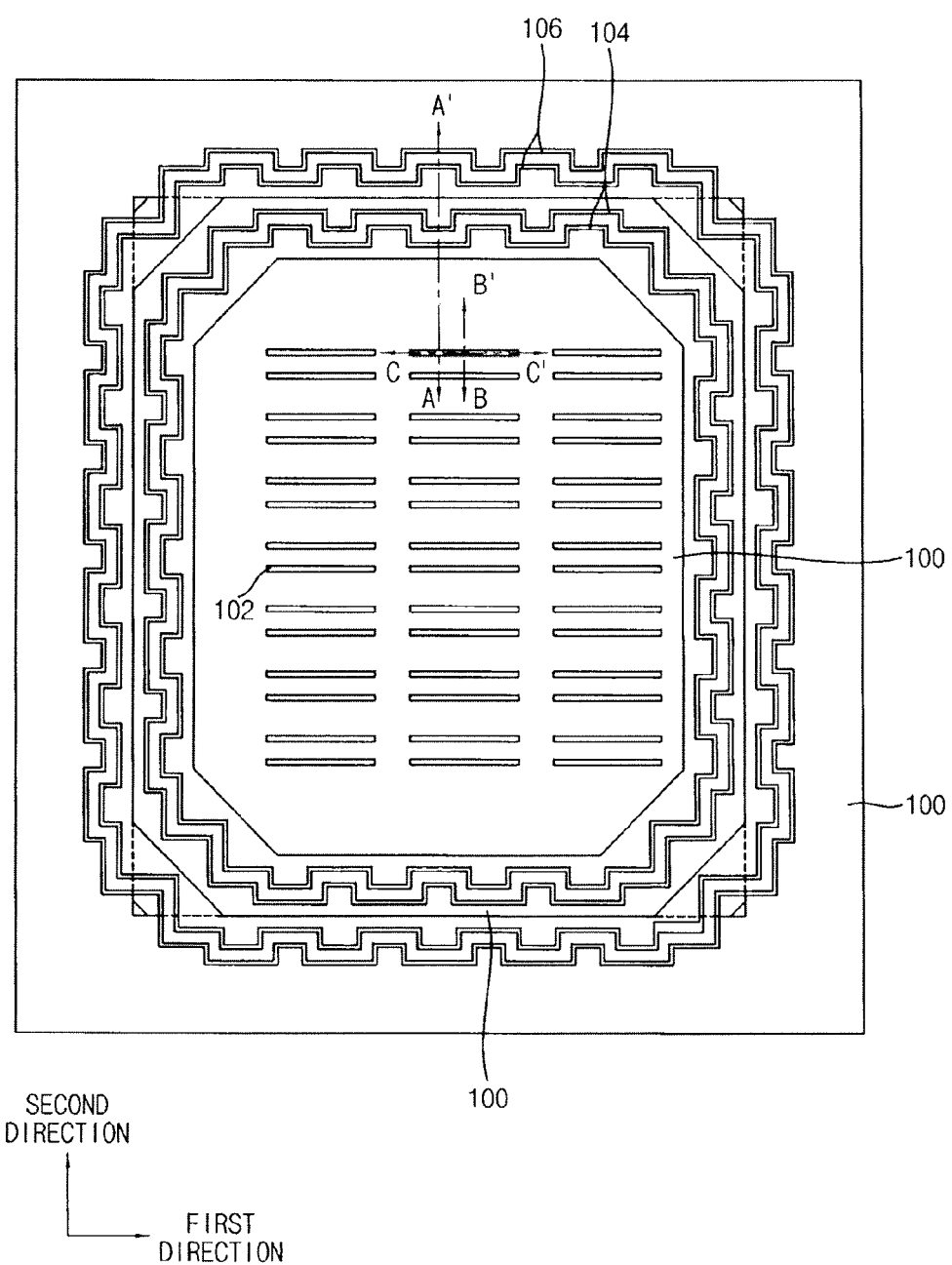
Figure 23:
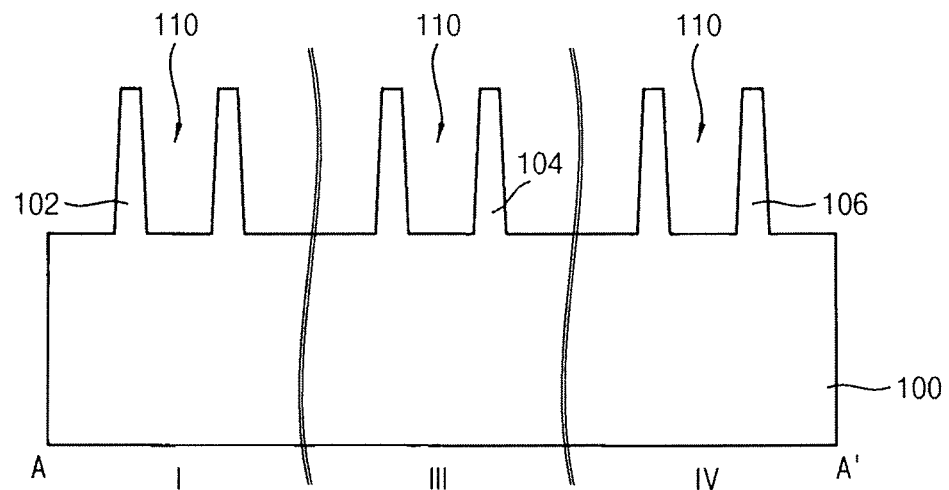

Referring to FIGS. 22 to 23, the substrate 100 may be etched using the first to third masks 502, 504 and 506 as etching masks to form first, second and third active fins 102, 104 and 106 in the first, third and fourth regions I, III, and IV, respectively. Thus, a first trench 110 may be formed between the first to third active fins 102, 104 and 106 on the substrate 100. In the etching process, the first to third masks 522, 524 and 526 may be removed.

The first to third active fins 102, 104 and 106 may be formed to have shapes substantially the same as those of the first to third masks 502, 504 and 506, respectively. For example, the first active fin 102 may extend in the first direction on the first region I of the substrate 100, and a plurality of first active fins 102 may be formed both in the first and second directions. The second active fin 104 may be formed on the third region III of the substrate 100 to continuously surround (e.g., surround in a plan view) the first region I in a winding line. A plurality of second active fins 104 may be formed outwardly from the first region I. The third active fin 106 may be formed on the fourth region IV of the substrate 100 to continuously surround the third region III in a winding line, and a plurality of third active fins 106 may be formed outwardly from the first region I.

After the etching process, the first to third masks 502, 504 and 506 may be removed.

Figure 24:
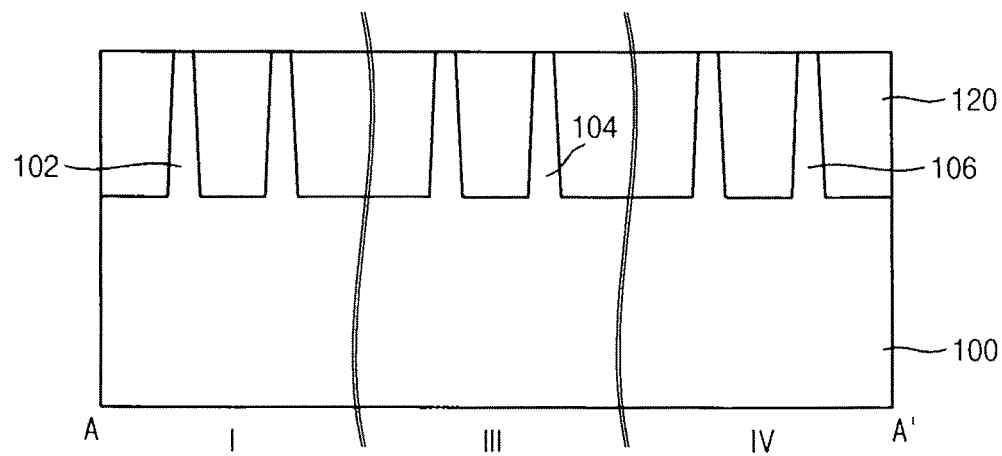

Referring to FIG. 24, an isolation layer 120 may be formed to fill the first trench 110.

In an exemplary embodiment of the present inventive concept, after forming the isolation layer 120 on the substrate 100, the isolation layer 120 may be planarized until a top surface of the substrate 100, (e.g., top surfaces of the active fins 102, 104 and 106) may be exposed. The isolation layer 120 may be formed to include an oxide, for example, silicon oxide. The planarization process may be performed by a CMP process. When the CMP process is performed, the first to third active fins 102, 104 and 106 may be formed on the first, third and fourth regions I, III and IV of the substrate 100, respectively. Thus there may be no density difference or a very small density difference among the first, third and fourth regions I, III and IV. Thus, the CMP process may be performed with no dishing.

Figure 25:
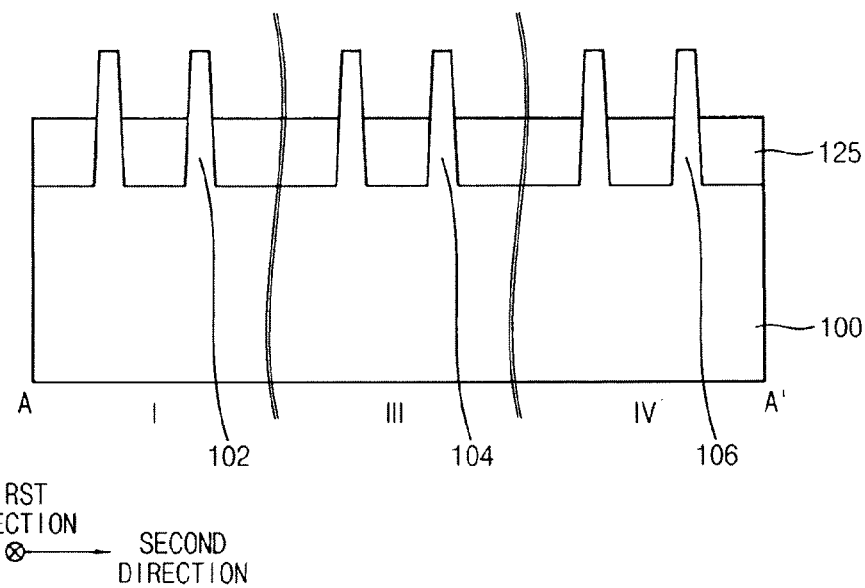

Referring to FIG. 25, an upper portion of the isolation layer 120 may be removed to expose an upper portion of the first trench 110. Thus, an isolation layer pattern 125 may be formed. In an exemplary embodiment of the present inventive concept, the etching process may be performed by an etch back process.

When the isolation layer pattern 125 is formed, a field region, which may have a top surface covered by the isolation layer pattern 125, may be defined in each of the first, third and fourth regions I, III and IV of the substrate 100. An active region, which need not have a top surface covered by the isolation layer pattern 125, may be defined in each of the first, third and fourth regions I, III and IV of the substrate 100.

Figure 26:
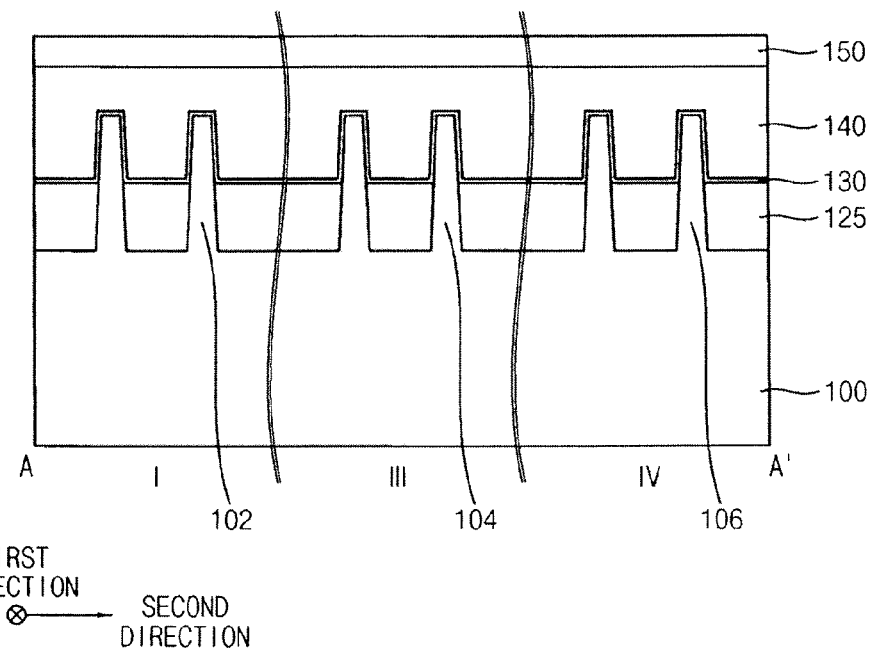
Figure 27:
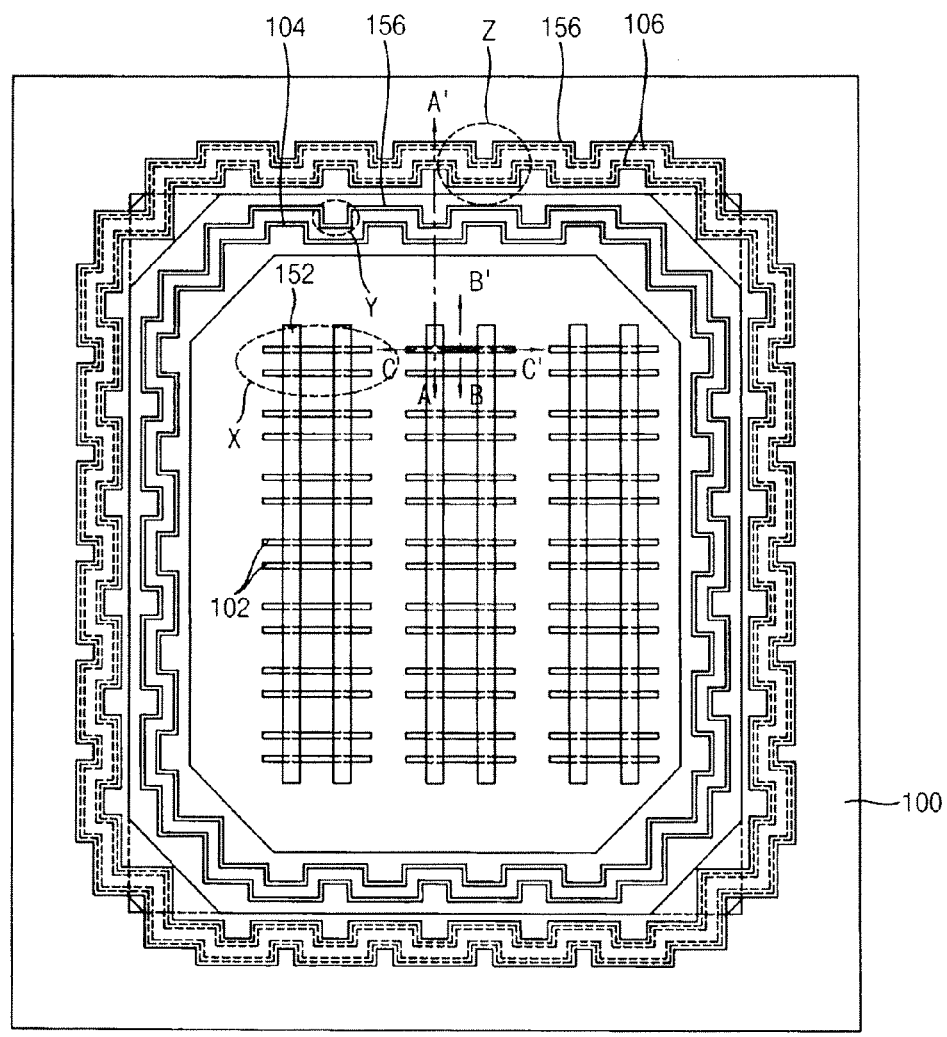
Figure 31:
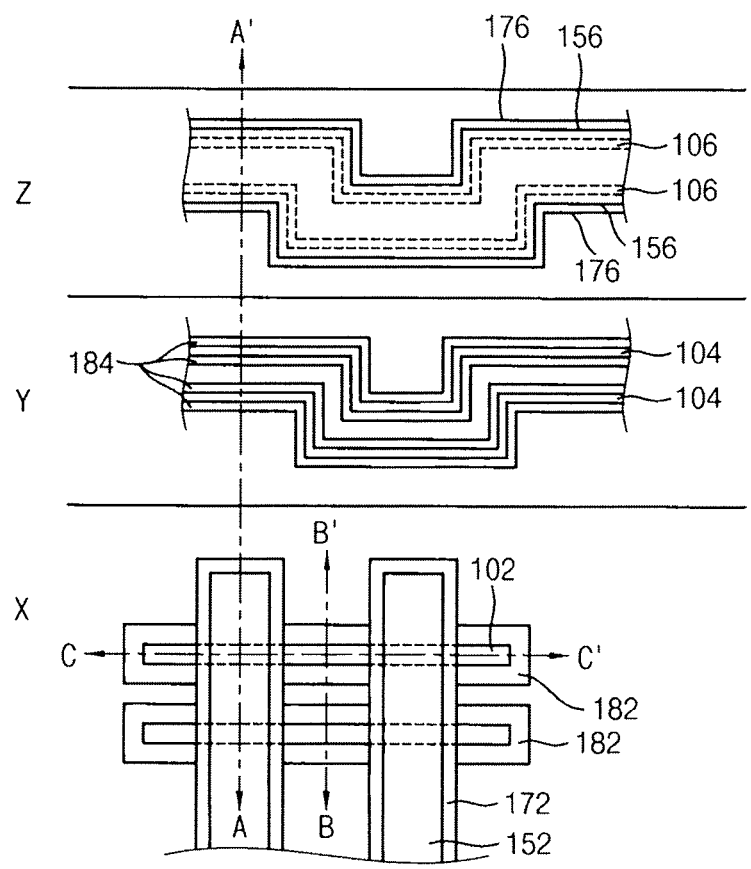
Figure 34:
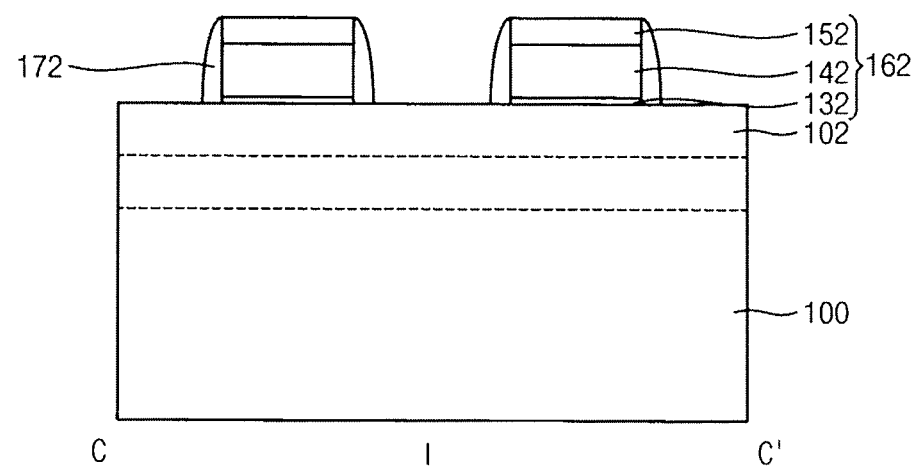
Figure 35:
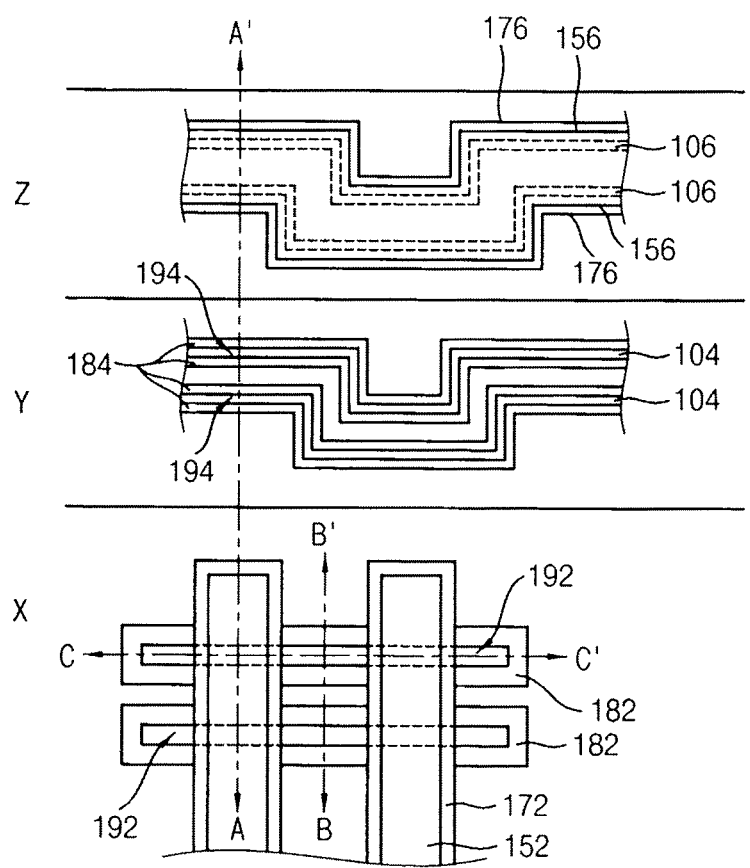

Referring to FIG. 26, a dummy gate insulation layer 130, a dummy gate electrode layer 140 and a hard mask layer 150 may be sequentially formed on the substrate 100. The isolation layer pattern 125 may be formed on the substrate 100.

The dummy gate insulation layer 130 may be formed to include an oxide, for example, silicon oxide. The dummy gate electrode layer 140 may be formed to include, for example, polysilicon. The hard mask layer 150 may be formed to include a nitride, for example, silicon nitride.

The dummy gate insulation layer 130 may be formed by a chemical vapor deposition (CVD) process, an ALD process, or the like. Alternatively, the dummy gate insulation layer 130 may be formed by a heat treatment process on upper portions of the first to third active fins 102, 104 and 106. In this case, the dummy gate insulation layer 130 may not be formed on the isolation layer pattern 125. The dummy gate electrode layer 140 and the hard mask layer 150 may be also formed by a CVD process, an ALD process, or the like.

Referring to FIGS. 27 to 30, an etching process may be performed using a photoresist pattern as an etching mask to pattern the hard mask layer 150. Thus, first and second hard masks 152 and 156 may be formed in the first and fourth regions I and IV, respectively. The dummy gate electrode layer 140 and the dummy gate insulation layer 130 may be etched using the first and second hard masks 152 and 156 as etching masks to form first and second dummy gate structures 162 and 166 in the first and fourth regions I and IV, respectively.

In an exemplary embodiment of the present inventive concept, the first dummy gate structure 162 may extend to partially cover the first active fins 102 disposed in the second direction. The second dummy gate structure 166 may extend to have a shape similar to those of the third active fins 106 so that the second dummy gate structure 166 may cover the third active fins 106. In an exemplary embodiment of the present inventive concept, the second dummy gate structure 166 may cover two neighboring third active fins 106, from among the plurality of third active fins 106 and a portion of the isolation layer pattern 125 between the neighboring third active fins 106. The second dummy gate structure 166 may cover portions of the isolation layer pattern 125 adjacent to outer sidewalls of the neighboring third active fins 106.

The first dummy gate structure 162 may include a first dummy gate insulation layer pattern 132, a first dummy gate electrode 142 and a first hard mask 152 sequentially stacked. The second dummy gate structure 166 may include a second dummy gate insulation layer pattern 136, a second dummy gate electrode 146 and a second hard mask 156 sequentially stacked.

The second active fins 104 in the third region III may not be covered by the dummy gate structures 162 and 166. The second active fins 104 in the third region III may be exposed.

An ion implantation process may be performed to form an impurity region at upper portions of the first and second active fins 102 and 104 not covered by the first and second dummy gate structures 162 and 166.

Referring to FIGS. 31 to 34, first and second gate spacers 172 and 176 may be formed on sidewalls of the first and second dummy gate structures 162 and 166, respectively. First and second spacers 182 and 184 may be formed on sidewalls of the first and second active fins 102 and 104, respectively.

In an exemplary embodiment of the present inventive concept, the first and second gate spacers 172 and 176 and the first and second spacers 182 and 184 may be formed by forming a spacer layer on the first and second dummy gate structures 162 and 166, on the first and second active fins 102 and 104, and on the isolation layer pattern 125, and by anisotropically etching the spacer layer. The spacer layer may include a nitride such as, for example, silicon nitride ($Si_xN_y$), silicon oxycarbonitride ($SiO_xC_yN_z$), or the like.

Referring to FIGS. 35 to 38, upper portions of the first and second active fins 102 and 104 not covered by the first and second dummy gate structures 162 and 166, the first and second gate spacers 172 and 176, and the first and second spacers 182 and 184 may be etched to form second and third trenches 192 and 194 in the first and third regions I and III, respectively.

Each of the second and third trenches 192 and 194 may have a given depth toward an inside of the substrate 100.

Figure 36:
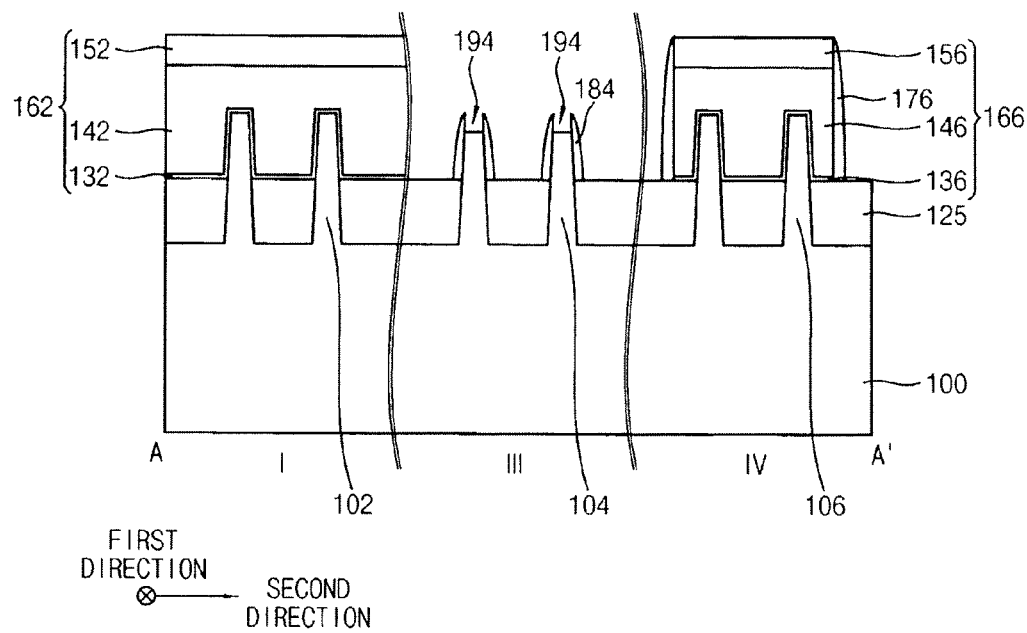
Figure 37:
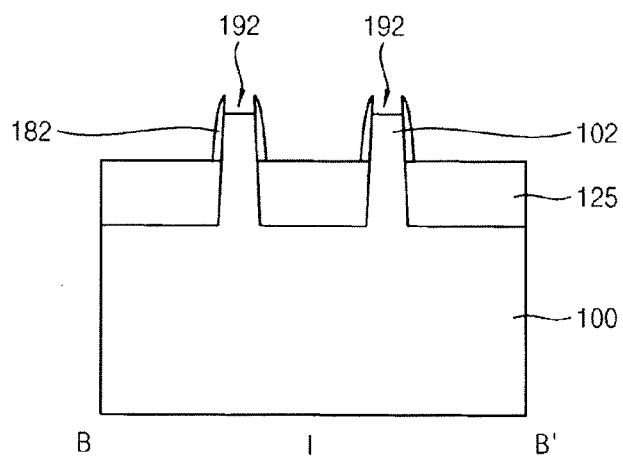
Figure 38:
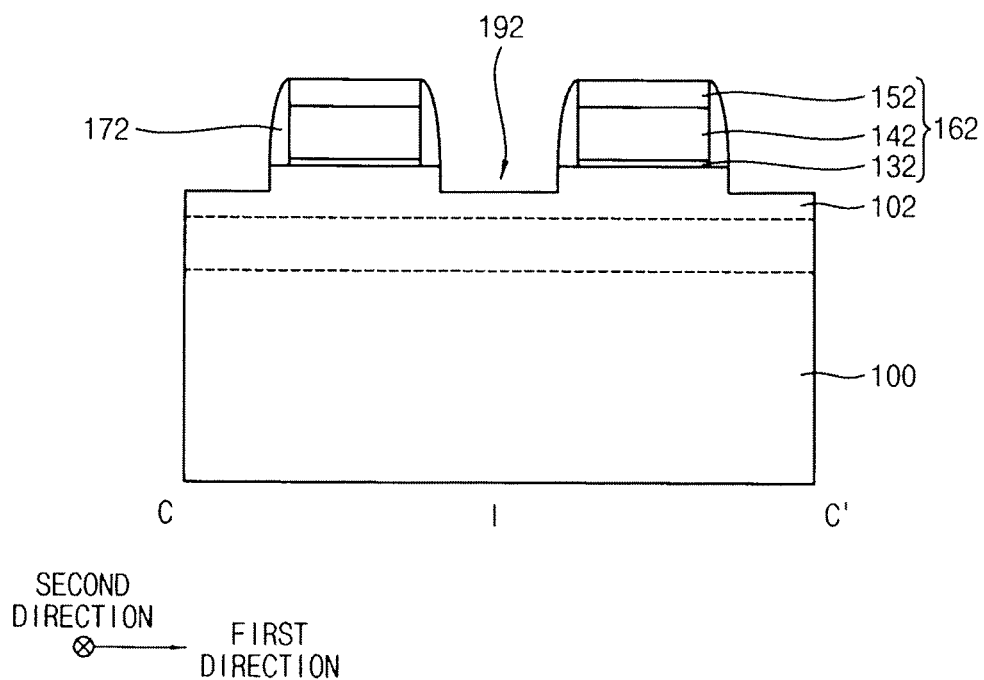
Figure 39:
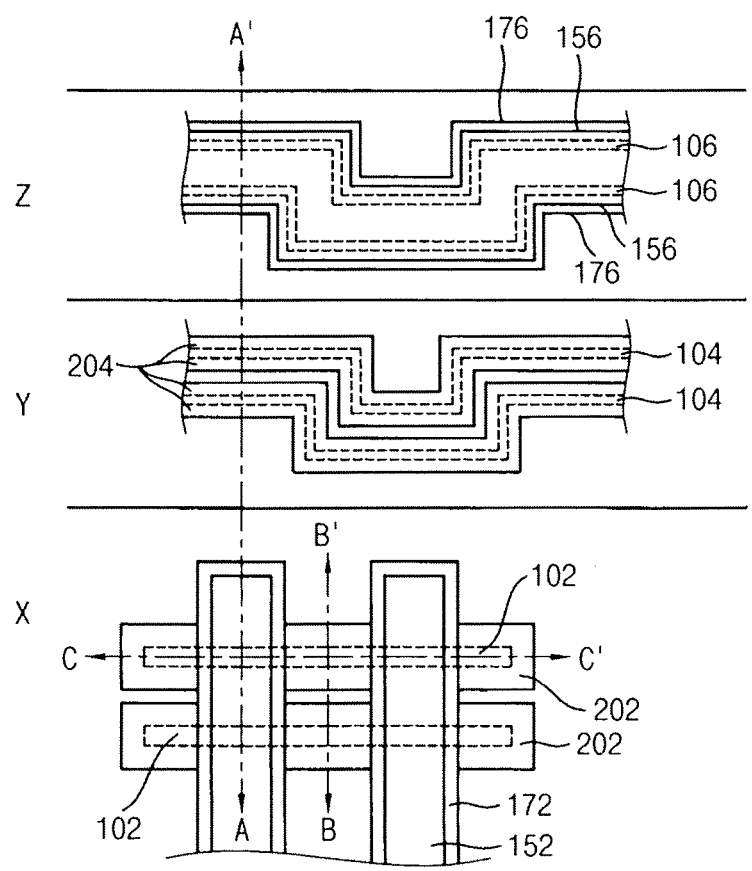
Figure 40:
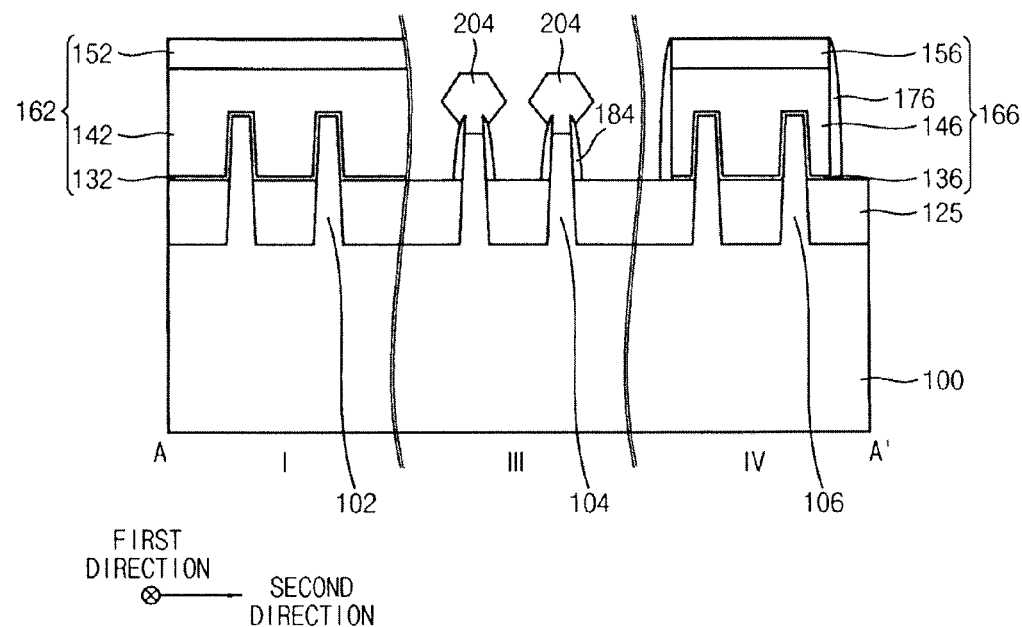
Figure 41:
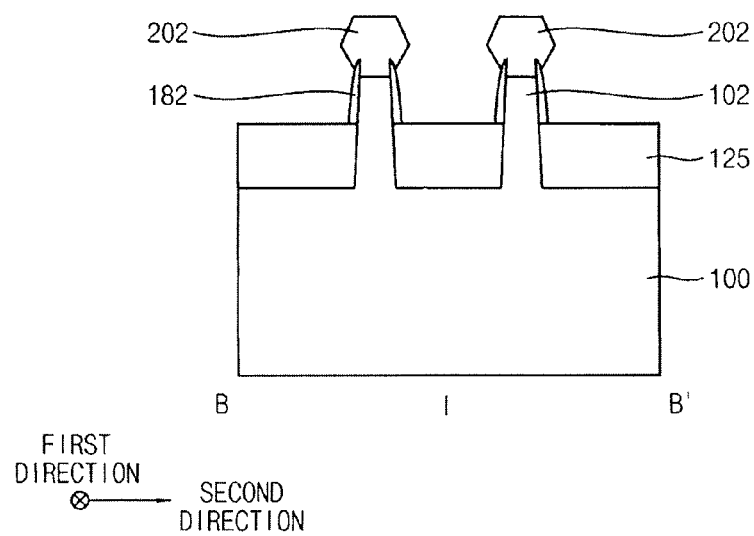
Figure 42:
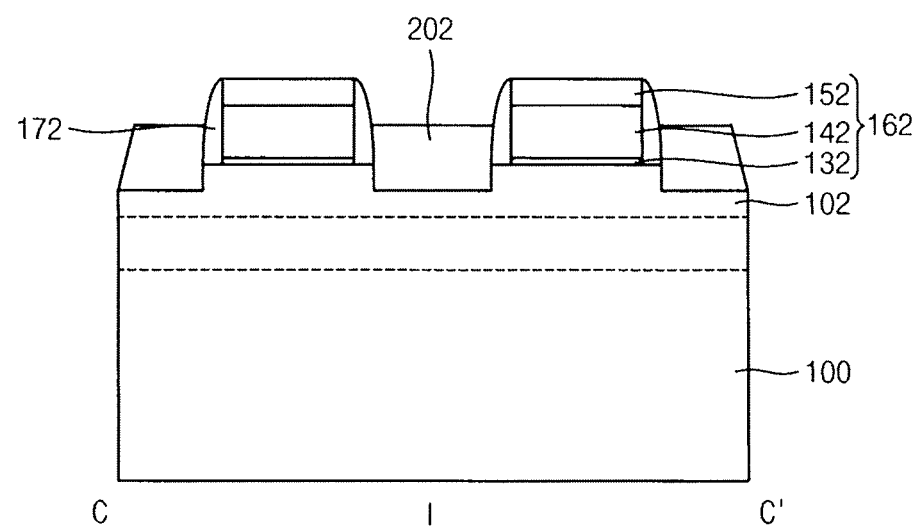
Figure 43:
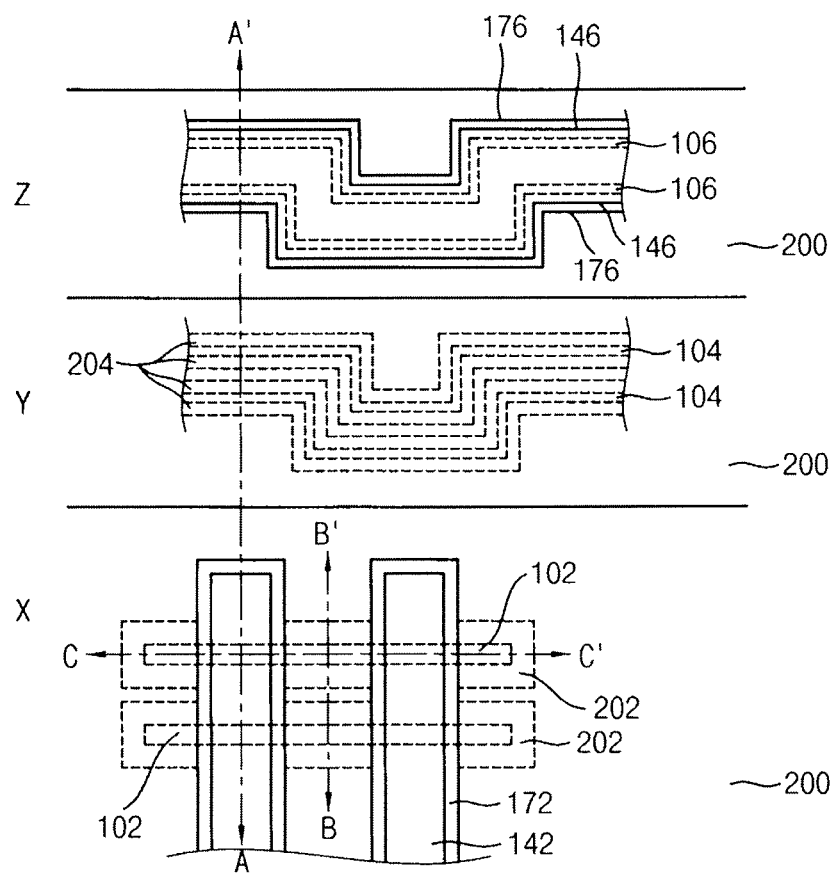
Figure 44:
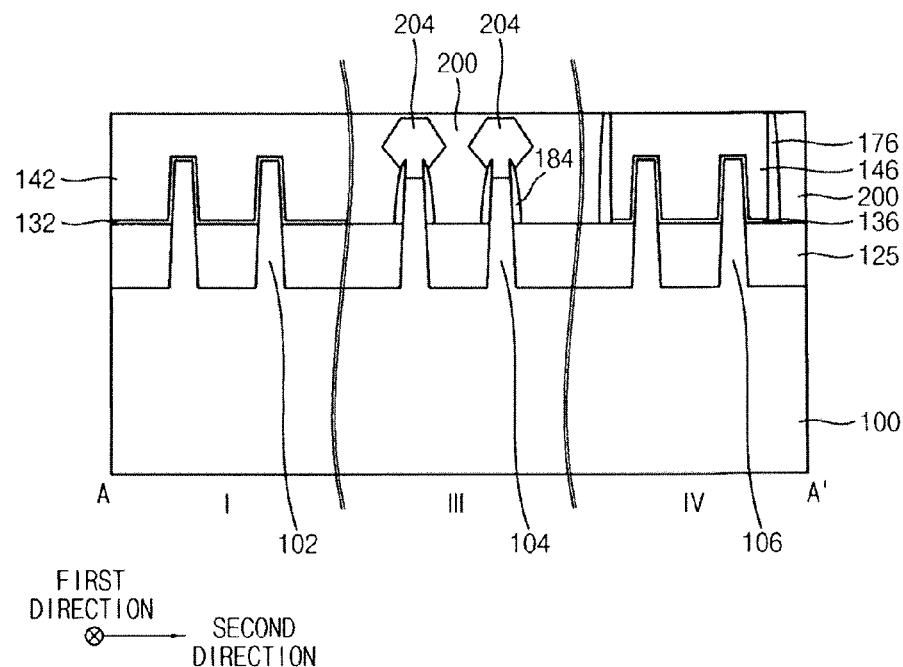
Figure 45:
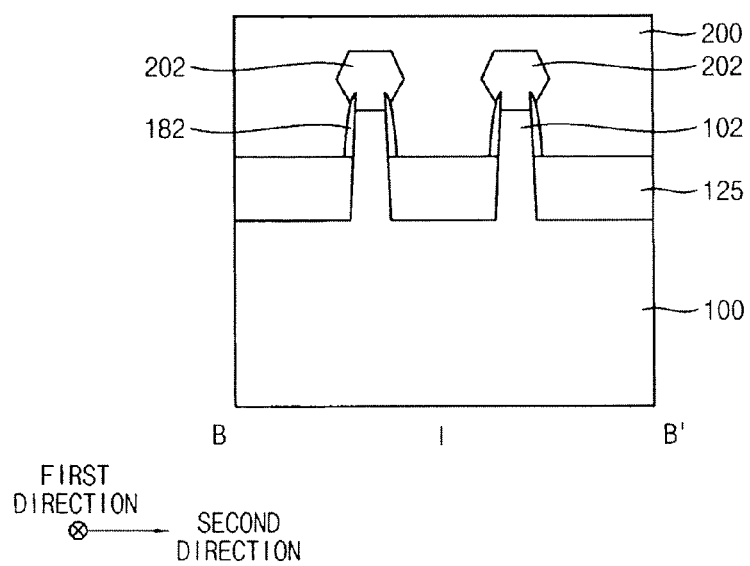
Figure 46:
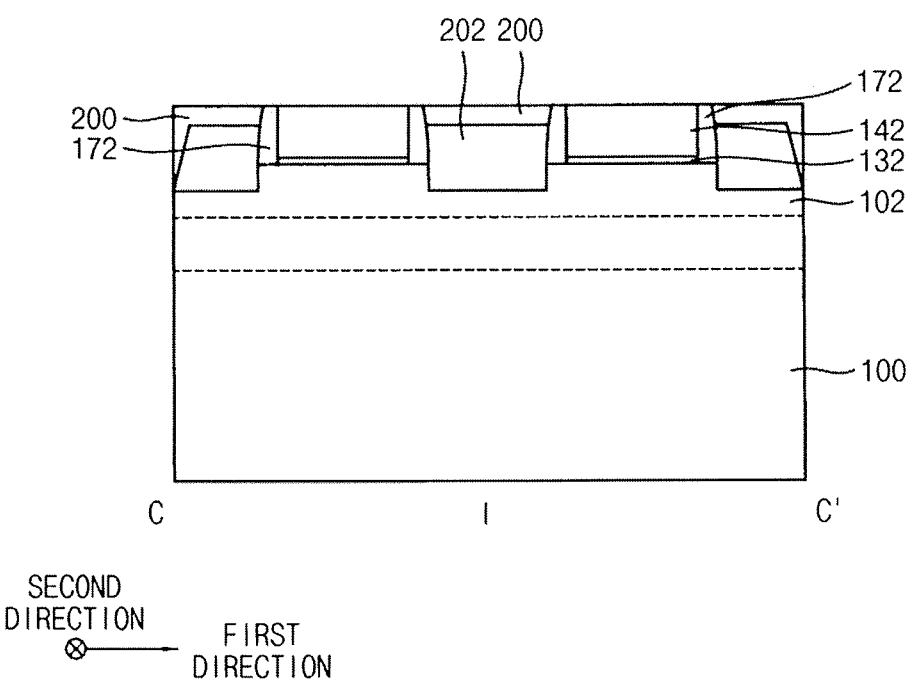

FIGS. 36 to 38 show that the second and third trenches 192 and 194 are formed on upper portions of the first and second active fins 102 and 104 of which sidewalls are not be covered by the isolation layer pattern 125. However, the present inventive concept may not be limited thereto. In an exemplary embodiment of the present inventive concept, the second and third trenches 192 and 194 may be formed to extend to lower portions of the first and second active fins 102 and 104 of which sidewalls may be covered by the isolation layer pattern 125. Each of the second and third trenches 192 and 194 may be formed to have a rectangular shape, a U-like shape cross-section taken along the first direction, a fan shape cross-section taken along the first direction, a sigma shape cross-section taken along the first direction, or the like.

The etching process for forming the second and third trenches 192 and 194, illustrated with reference to FIGS. 31 to 34, may be performed in-situ. The anisotropic etching process for forming the first and second gate spacers 172 and 176 and the first and second spacers 182 and 184, illustrated with reference to FIGS. 31 to 34, may be performed in-situ.

Referring to FIGS. 39 to 42, first and second source/drain layers 202 and 204 may be formed to fill the second and third trenches 192 and 194, respectively.

In an exemplary embodiment of the present inventive concept, an SEG process may be performed using top surfaces of the first and second active fins 102 and 104 exposed by the second and third trenches 192 and 194, respectively, as a seed to form the first and second source/drain layers 202 and 204, respectively.

In an exemplary embodiment of the present inventive concept, the SEG process may be performed using a silicon source gas, for example, dichlorosilane ($SiH_2Cl_2$) gas, and a germanium source gas, for example, germane ($GeH_4$) gas so that a single crystalline silicon-germanium layer may be formed. In exemplary embodiments of the present inventive concept, a p-type impurity source gas, for example, diborane ($B_2H_6$) gas may be used to form a single crystalline silicon-germanium layer doped with p-type impurities. Thus, the first and second source/drain layers 202 and 204 may serve as a source/drain region of a positive-channel metal oxide semiconductor (PMOS) transistor.

In an exemplary embodiment of the present inventive concept, each of the first and second source/drain layers 202 and 204 may grow both in vertical and horizontal directions, and an upper portion of each of the first and second source/drain layers 202 and 204 may have a pentagon or hexagon cross-sectional shape taken along the first direction. Each of the first and second source/drain layers 202 and 204 may be formed to have a top surface higher than those of the first and second active fins 102 and 104. Thus, each of the first and second source/drain layers 202 and 204 may serve as an elevated source/drain (ESD) layer.

In an exemplary embodiment of the present inventive concept, the SEG process may be performed using a silicon source gas, for example, disilane ($Si_2H_6$) gas, and a carbon source gas, for example, monomethylsilane ($SiH_3CH_3$) gas to form a single crystalline silicon carbide layer. Alternatively, the SEG process may be performed using a silicon source gas such as, for example, disilane ($Si_2H_6$) gas to form a single crystalline silicon layer. In an exemplary embodiment of the present inventive concept, an n-type impurity source gas, for example, phosphine ($PH_3$) gas may be also used to form a single crystalline silicon carbide layer or a single crystalline silicon layer doped with n-type impurities. Thus, the first and second source/drain layers 202 and 204 may serve as a source/drain region of a negative-channel metal oxide semiconductor (NMOS) transistor.

In an exemplary embodiment of the present inventive concept, one of the plurality of first and second source/drain layers 202 and 204 may serve as a source/drain region of a PMOS transistor, and one of the plurality of first source/drain layers 202 and 204 may serve as a source/drain region of an NMOS transistor.

Referring to FIGS. 43 to 46, a first insulating interlayer 200 may be formed on the substrate 100 and the isolation layer pattern 125 to cover the first and second dummy gate structures 162 and 166, the first and second gate spacers 172 and 176, the first and second spacers 182 and 184, and the first and second source/drain layers 202 and 204. The first insulating interlayer 200 may be planarized until top surfaces of the first and second dummy gate electrodes 142 and 146 of the first and second dummy gate structures 162 and 166 may be exposed. The first and second hard masks 152 and 156 on the first and second dummy gate electrodes 142 and 146, and upper portions of the first and second gate spacers 172 and 176 may be removed. In an exemplary embodiment of the present inventive concept, the planarization process may be performed by a CMP process and/or an etch back process.

Figure 47:
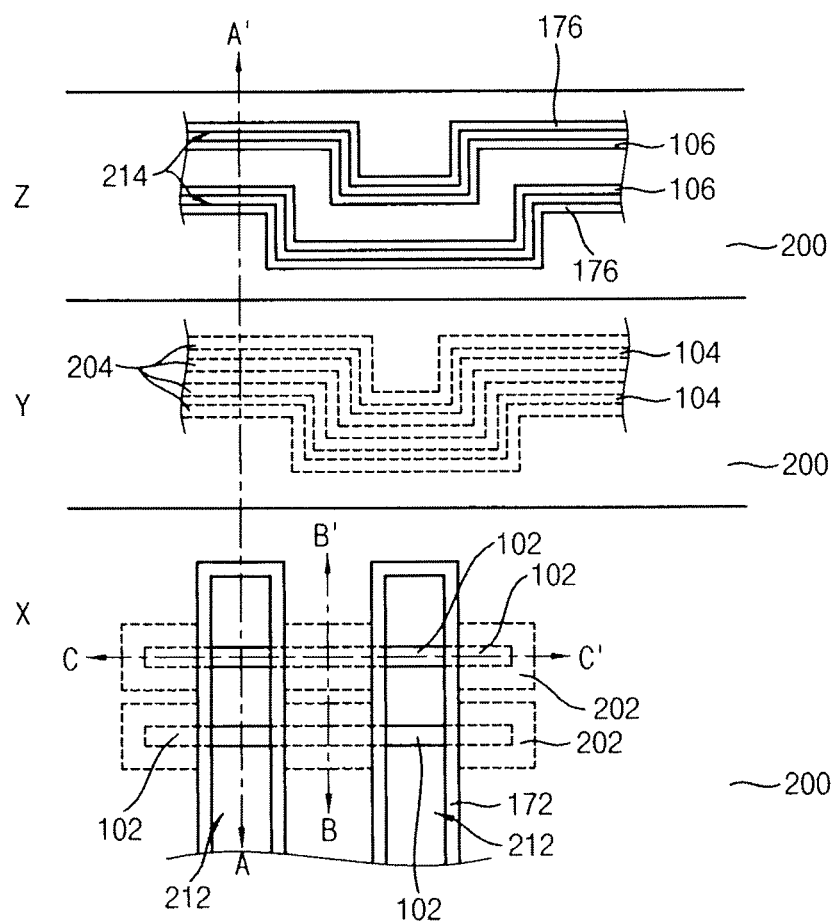
Figure 48:
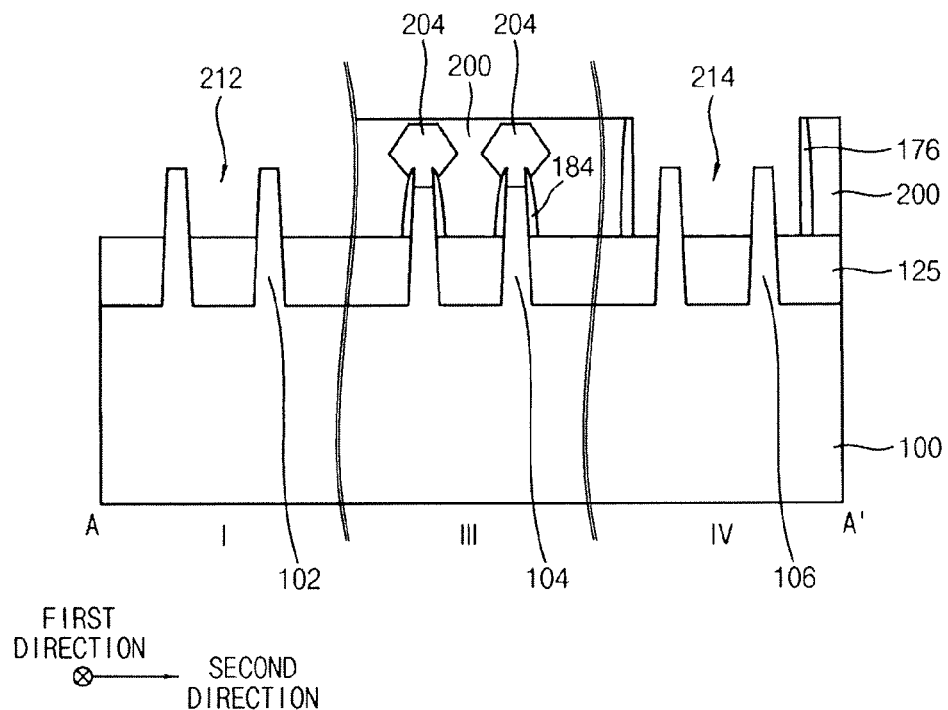
Figure 49:
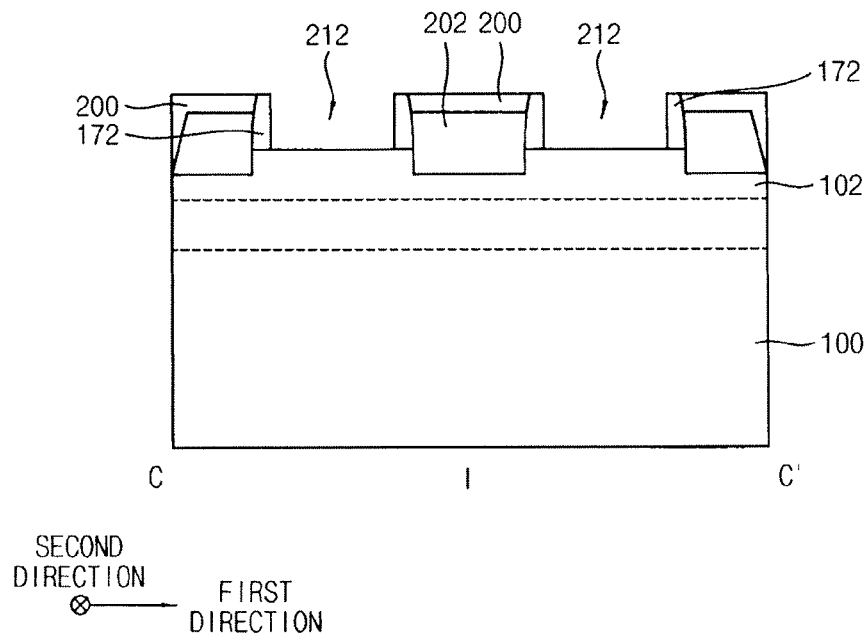

Referring to FIGS. 47 to 49, the exposed first and second dummy gate electrodes 142 and 146, and the first and second dummy gate insulation layer patterns 132 and 136 may be removed to form first and second openings 212 and 214, respectively. Accordingly, top surfaces of the first and third active fins 102 and 106 and the isolation layer pattern 125 adjacent thereto may be exposed.

In an exemplary embodiment of the present inventive concept, the first and second dummy gate electrodes 142 and 146, and the first and second dummy gate insulation layer patterns 132 and 136 may be removed by performing a dry etching process first and then a wet etching process. The wet etching process may be performed using hydrogen fluoride (HF) as an etching solution.

Alternatively, referring to FIG. 50, after forming a photoresist pattern covering the fourth region IV, the etching process may be performed, so that the second dummy gate electrode 146 and the second dummy gate insulation layer pattern 136 are not removed. In the chip region I, to form a gate structure actively operated, a gate replacement process for forming a gate electrode including a metal may be performed. However, in the sealing region II, an actively operated gate structure is not needed. Thus, the gate replacement process may not be performed in the fourth region IV and the dummy gate electrode may remain.

Figure 51:
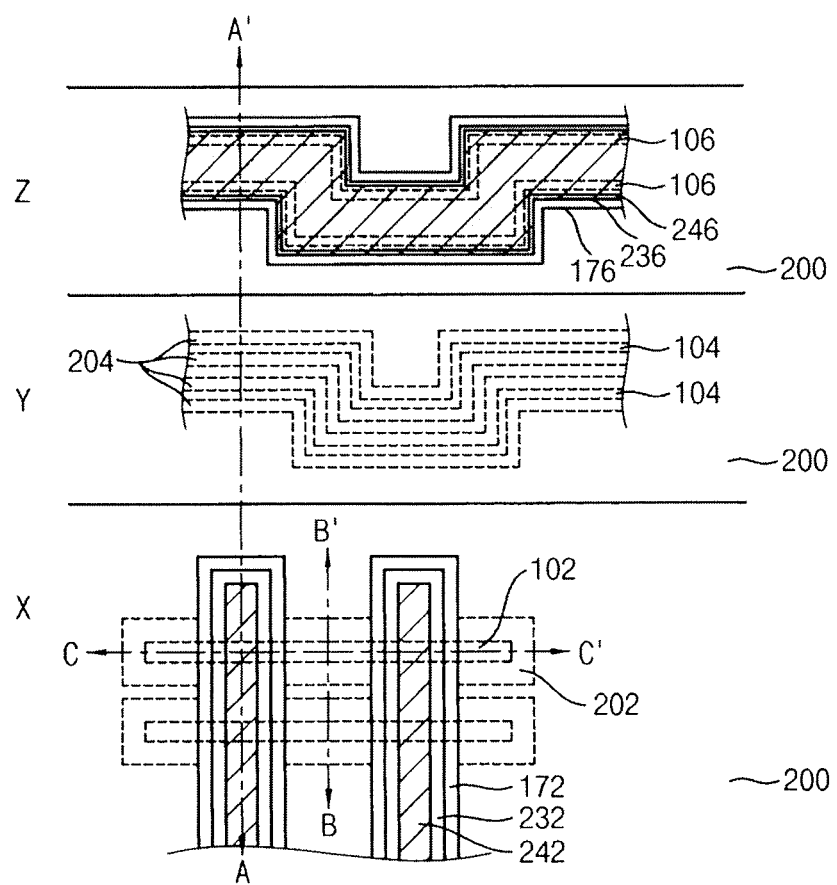
Figure 52:
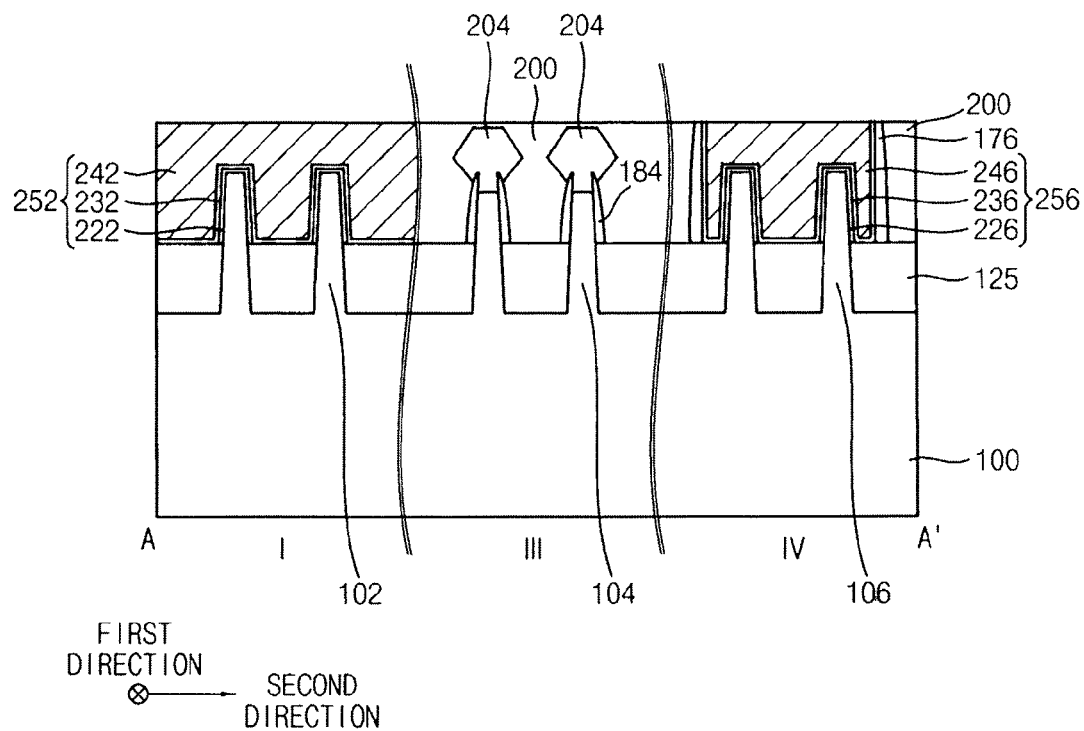
Figure 53:
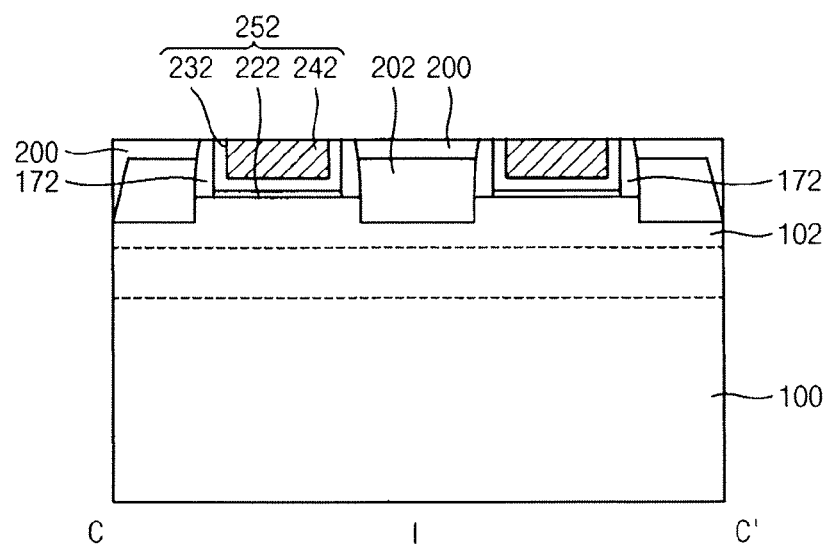

Referring to FIGS. 51 to 53, a first interface layer pattern 222, a first gate insulation layer pattern 232 and a first gate electrode 242 may be formed to fill the first opening 212. A second interface layer pattern 226, a second gate insulation layer pattern 236 and a second gate electrode 246 may be formed to fill the second opening 214.

After performing a thermal oxidation process on top surfaces of the first and third active fins 102 and 106 exposed by the first and second openings 212 and 214 to form the first and second interface layer patterns 222 and 226, respectively, a gate insulation layer may be formed on the first and second interface layer patterns 222 and 226, on inner sidewalls of the first and second gate spacers 172 and 176, and on the first insulating interlayer 200. A gate electrode layer may be formed on the gate insulation layer to fill remaining portions of the first and second openings 212 and 214.

In an exemplary embodiment of the present inventive concept, the first and second interface layer patterns 222 and 226 may be formed to include silicon oxide. The gate insulation layer may be formed to include a metal oxide having a high dielectric constant, for example, hafnium oxide, tantalum oxide, zirconium oxide, or the like. The gate electrode layer may include a material having a low resistance, for example, a metal such as aluminum, copper, tantalum, or the like, or doped polysilicon.

In an exemplary embodiment of the present inventive concept, the gate insulation layer and the gate electrode layer may be formed by a CVD process, a PVD process, an ALD process, or the like. However, the first and second interface layer patterns 222 and 226 may be formed by a CVD process, a PVD process, an ALD process, or the like, instead of the thermal oxidation process. In this case, the first and second interface layer patterns 222 and 226 may be formed on the top surfaces of the first and third active fins 102 and 106, on the top surface of the isolation layer pattern 125, and on the inner sidewalls of the first and second gate spacers 172 and 176.

In an exemplary embodiment of the present inventive concept, the first and second interface layer patterns 222 and 226 may not be formed. Additionally, a work function control layer may be formed between a gate insulation layer and a gate electrode layer. The work function control layer may include a metal nitride, for example, titanium nitride, titanium aluminum, titanium aluminum nitride, tantalum nitride, tantalum aluminum nitride, or the like, or an alloy.

The gate electrode layer and the gate insulation layer may be planarized until the top surface of the first insulating interlayer 200 may be exposed to form the first and second gate electrodes 242 and 246, and the first and second gate insulation layer patterns 232 and 236. In an exemplary embodiment of the present inventive concept, the planarization process may be performed by a CMP process and/or an etch back process.

The first interface layer pattern 222 may be formed on the top surface of the first active fin 102 exposed by the first opening 212 in the first region I. The first gate insulation layer pattern 232 may be formed on the first interface layer pattern 222. An inner sidewall of the first gate spacer 172, and the first gate electrode 242 may be formed on the first gate insulation layer pattern 232 to fill a remaining portion of the first opening 212. Additionally, the second interface layer pattern 226 may be formed on the top surface of the third active fin 106 exposed by the second opening 214 in the fourth region IV. The second gate insulation layer pattern 236 may be formed on the second interface layer pattern 226. The inner sidewall of the second gate spacer 176, and the second gate electrode 246 may be formed on the second gate insulation layer pattern 236 to fill a remaining portion of the second opening 214.

The first interface layer pattern 222, the first gate insulation layer pattern 232 and the first gate electrode 242, sequentially stacked, may form a first gate structure 252. The first gate structure 252 and the first source/drain layer 202 adjacent thereto may form a PMOS transistor or an NMOS transistor. The second interface layer pattern 226, the second gate insulation layer pattern 236 and the second gate electrode 246, sequentially stacked, may form a second gate structure 256.

In an exemplary embodiment of the present inventive concept, the first gate structure 252 filling the first opening 212 may be formed to extend in the first direction. The second gate structure 256 filling the second opening 214 may be formed to continuously surround (e.g., surround in a plan view) the third region III in a winding line.

Figure 54:
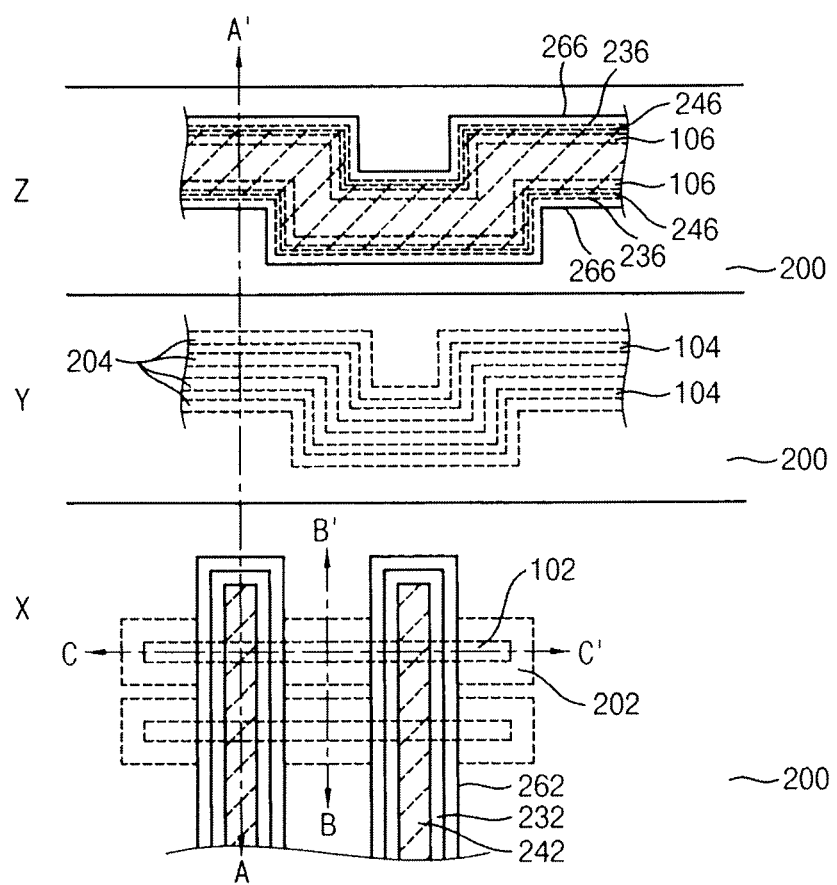
Figure 55:
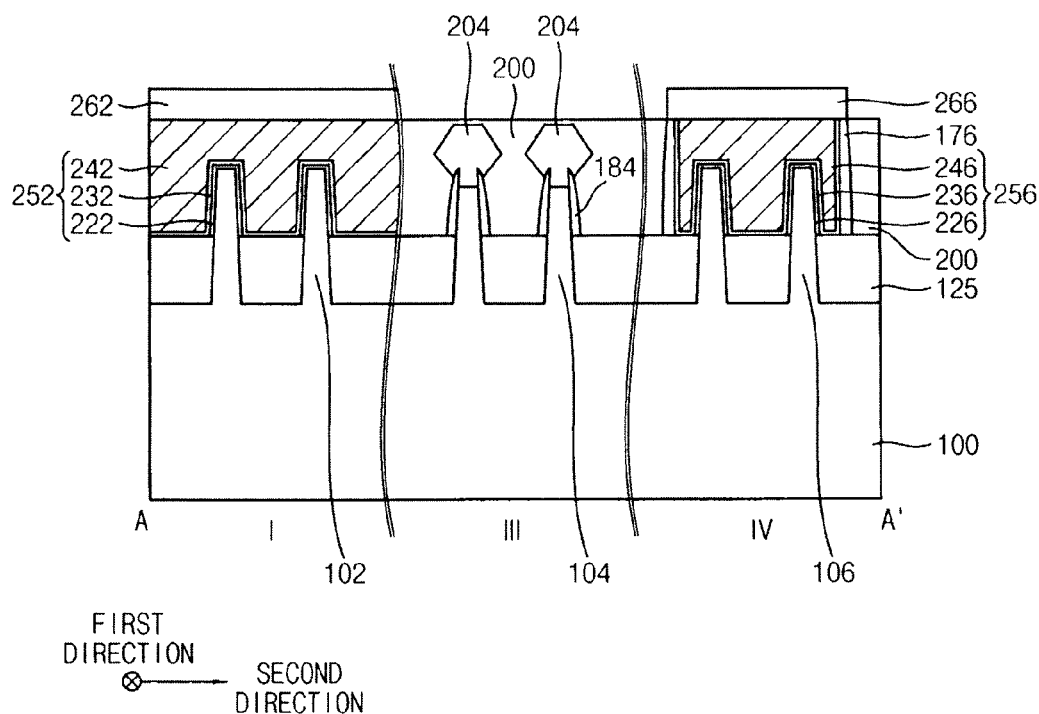
Figure 56:
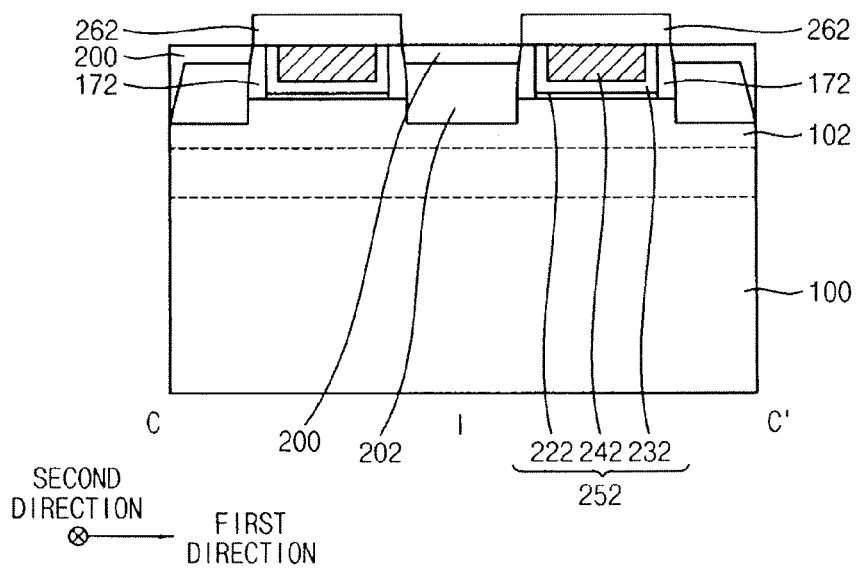
Figure 57:
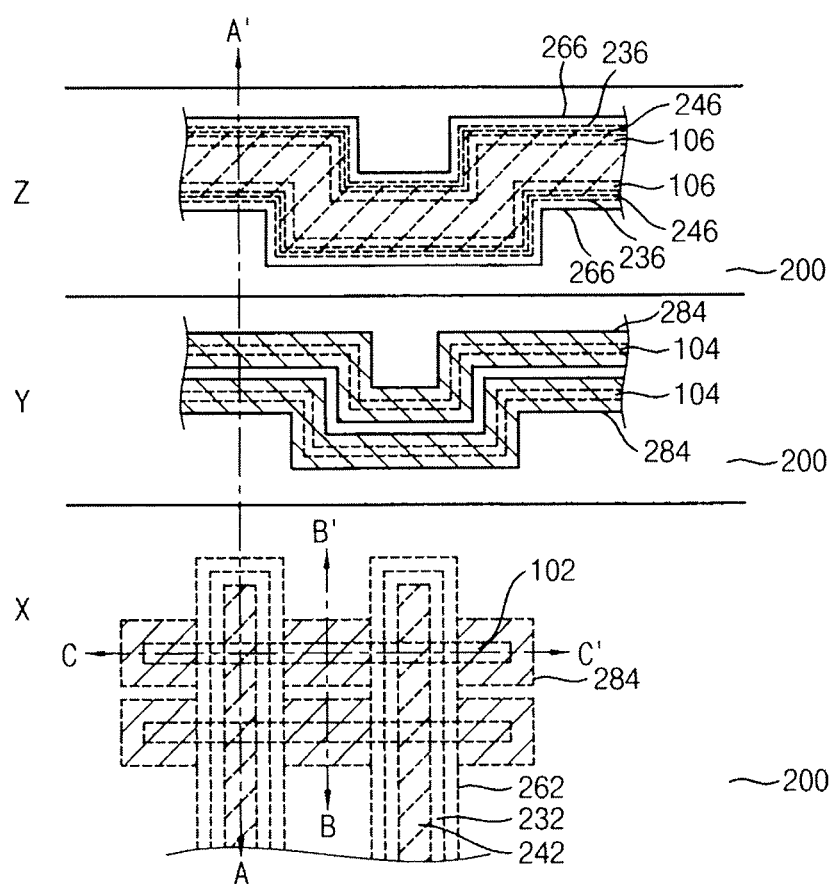
Figure 58:
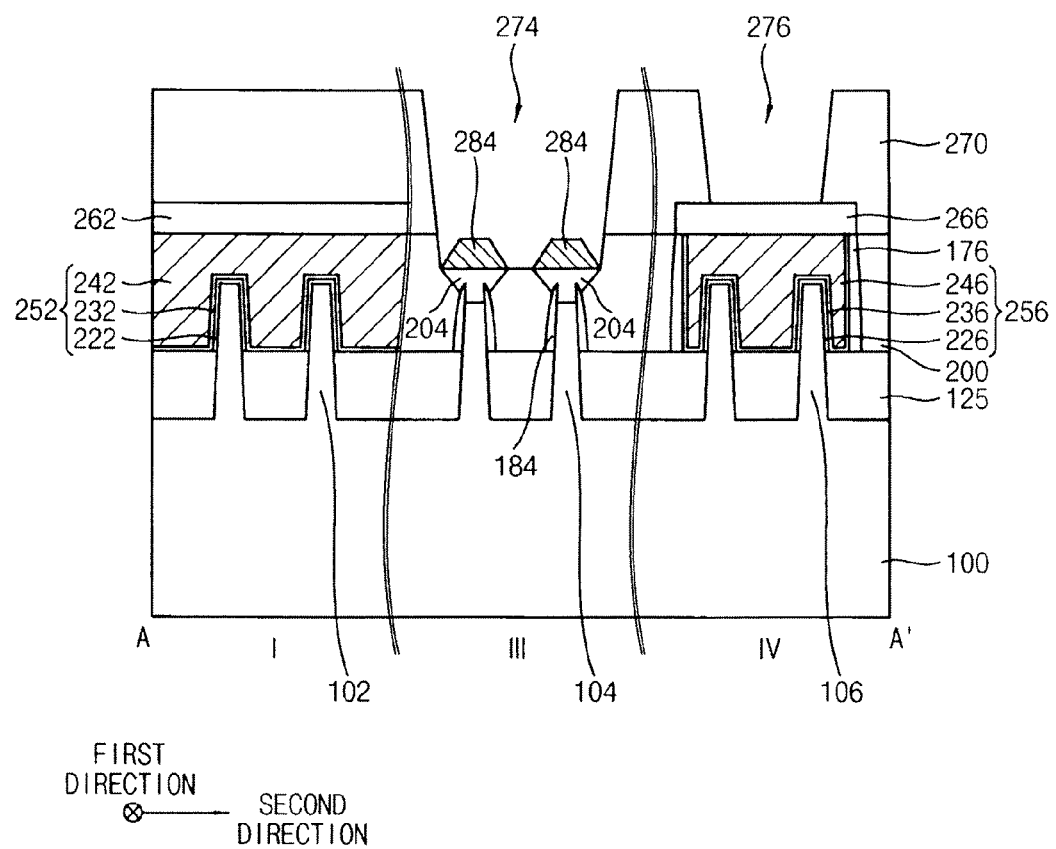
Figure 59:
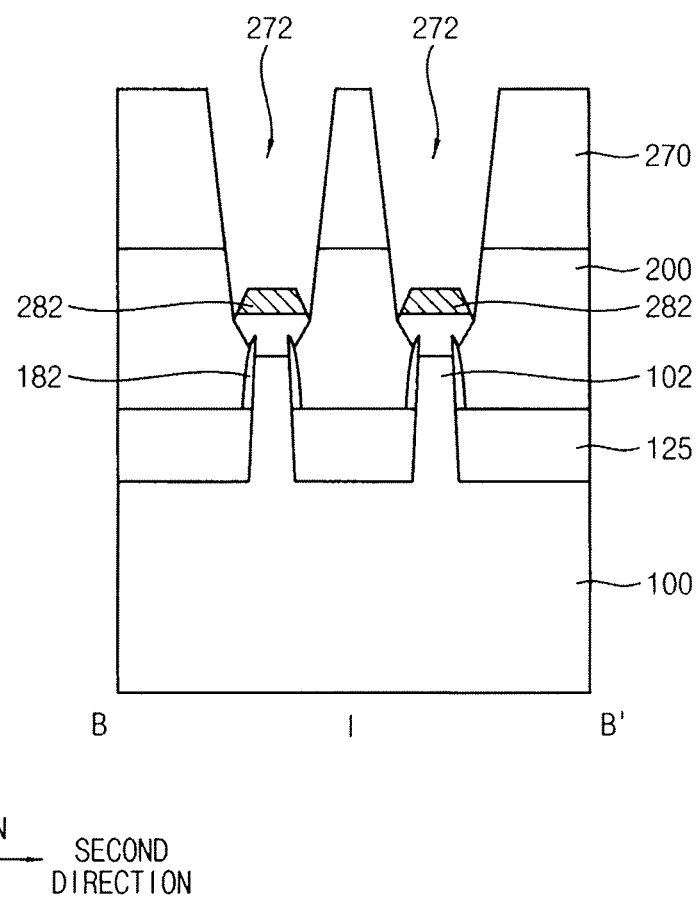
Figure 60:
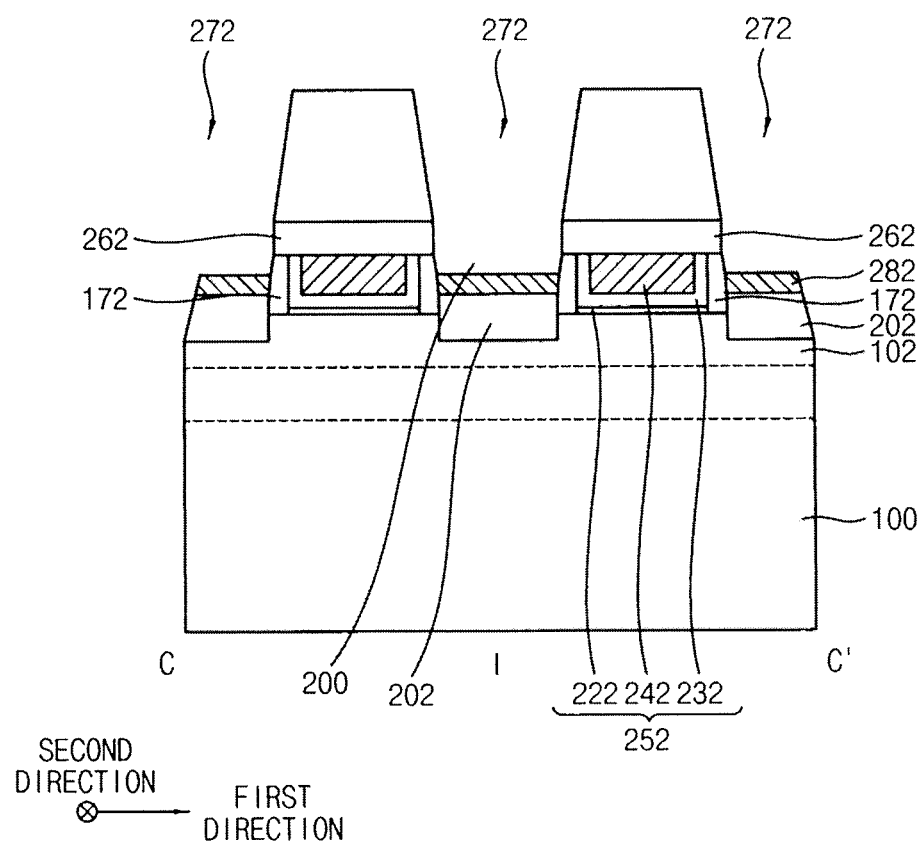
Figure 61:
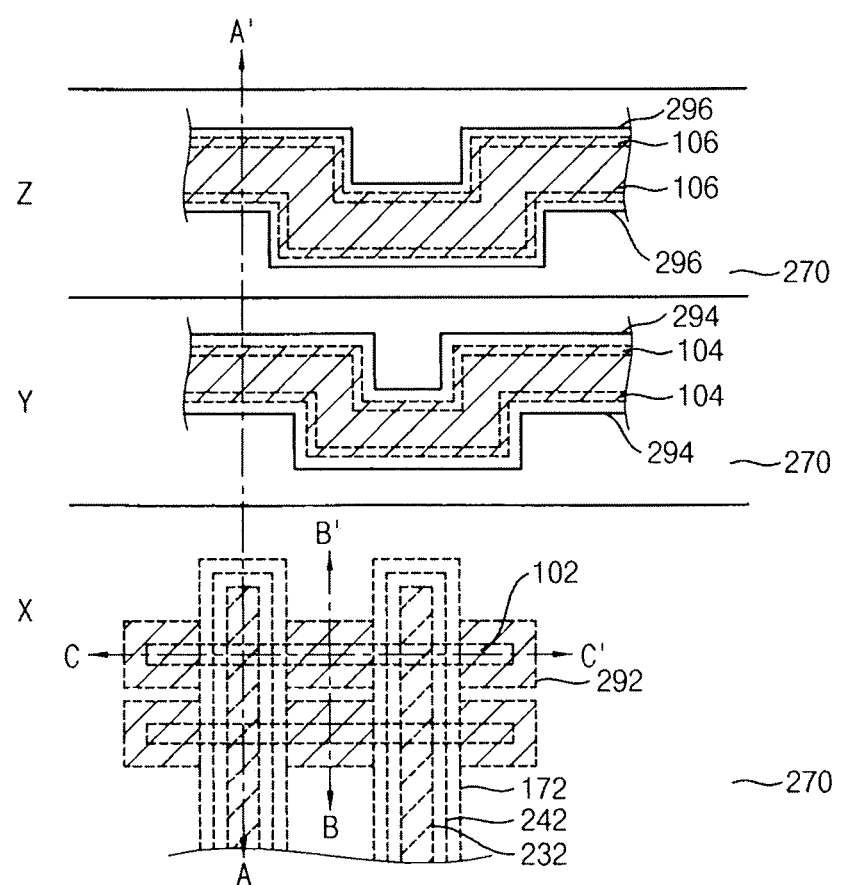
Figure 62:
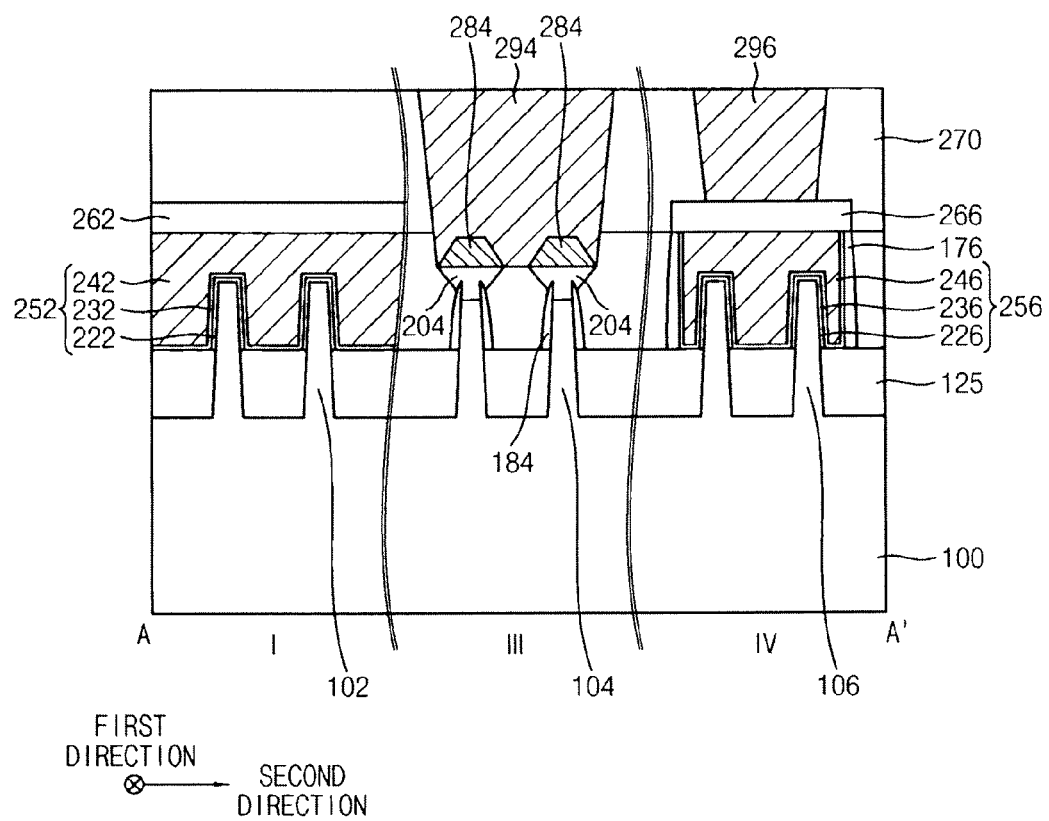
Figure 63:
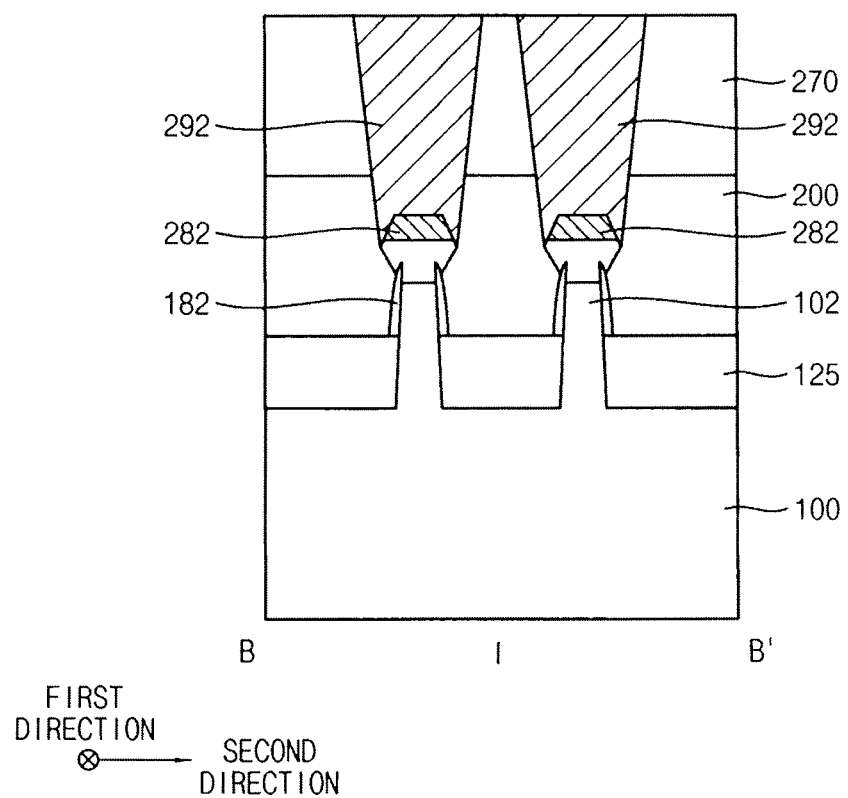
Figure 64:
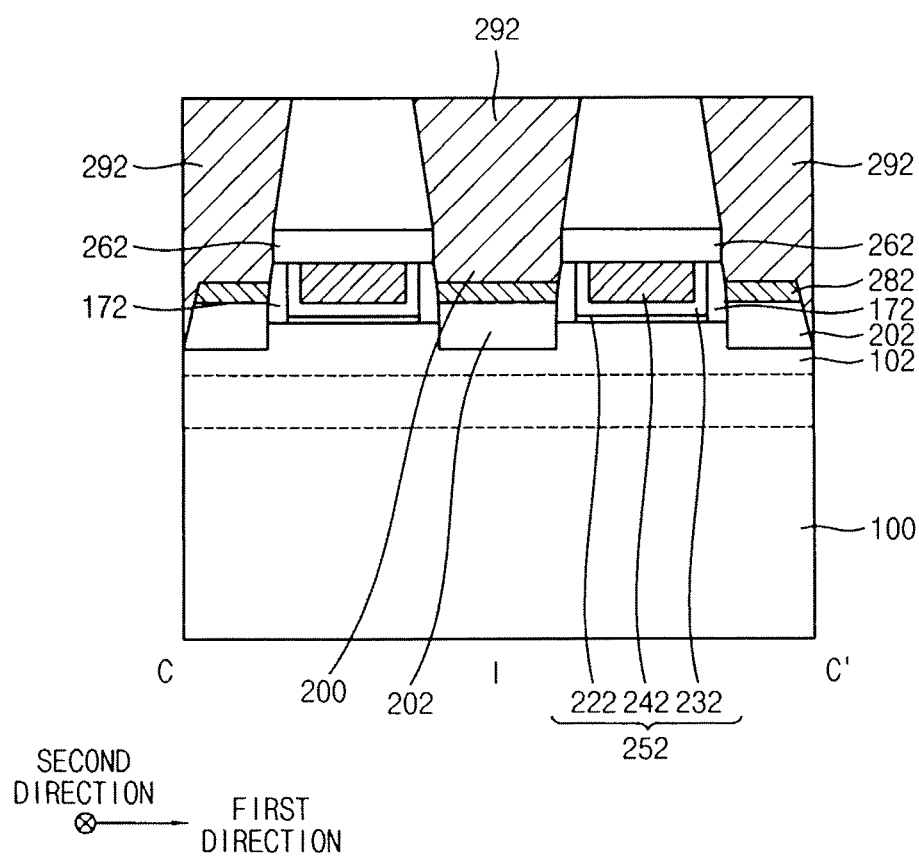

Referring to FIGS. 54 to 56, first and second blocking layer patterns 262 and 266 may be formed on the first and second gate structures 252 and 256 and on the first and second gate spacers 172 and 176, respectively.

The first and second blocking layer patterns 262 and 266 may be formed to include a nitride, for example, silicon nitride. In an exemplary embodiment of the present inventive concept, the first and second blocking layer patterns 262 and 266 may not be formed.

Referring to FIGS. 57 to 60, a second insulating interlayer 270 may be formed on the first and second blocking layer patterns 262 and 266 and on the first insulating interlayer 200. Third, fourth, and fifth openings 272, 274, and 276 may be formed in the first and second insulating interlayers 200 and 270 to expose the first source/drain layers 202, the second source/drain layers 204, and the second blocking layer pattern 266, respectively.

In an exemplary embodiment of the present inventive concept, the fourth opening 274 may expose two neighboring second source/drain layers 204.

A metal layer may be formed on the exposed first and second source/drain layers 202 and 204, on the second blocking layer pattern 266, on sidewalls of the third, fourth and fifth openings 272, 274 and 276, and on the second insulating interlayer 270. The metal layer may be annealed to form first and second metal silicide patterns 282 and 284 on the first and second source/drain layers 202 and 204, respectively. A portion of the metal layer that does not chemically react with silicon may be removed.

Referring to FIGS. 61 to 64, first, second and third contact plugs 294, 296 and 292 may be formed on the first and second metal silicide patterns 282 and 284 and on the second blocking layer pattern 266 to fill the third, fourth and fifth openings 272, 274 and 276, respectively. The first contact plug 294 may be formed on the second metal silicide pattern 284 to fill the fourth opening 274, the second contact plug 296 may be formed on the second blocking layer pattern 266 to fill the fifth opening 276, and the third contact plug 292 may be formed on the first metal silicide pattern 282 to fill the third opening 272.

In an exemplary embodiment of the present inventive concept, the first to third contact plugs 294, 296 and 292 may be formed by forming a first conductive layer on the first and second metal silicide patterns 282 and 284, on the second blocking layer pattern 266, and on the second insulating interlayer 270 to fill the third to fifth openings 272, 274 and 276. The first conductive layer may be planarized until a top surface of the second insulating interlayer 270 may be exposed. The first conductive layer may include, for example, a metal, a metal nitride, doped polysilicon, or the like.

Figure 65:
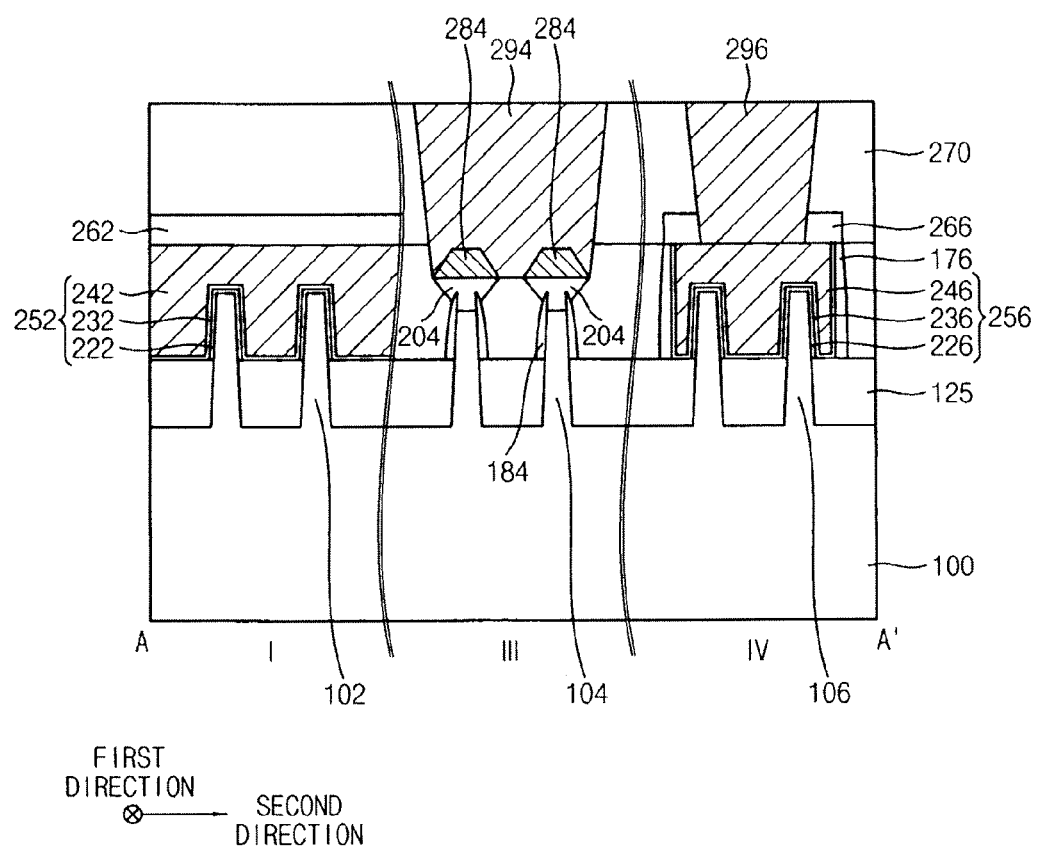

Referring to FIG. 65, in an exemplary embodiment of the present inventive concept, the second contact plug 296 may be formed in the second blocking layer pattern 266 to contact the second gate structure 256.

Referring to FIGS. 12 to 16 again, a third insulating interlayer 300 may be formed on the first to third contact plugs 294, 296 and 292. The second insulating interlayer 270, and sixth, seventh and eighth openings may be formed in the third insulating interlayer 300 to expose the first to third contact plugs 294, 296 and 292, respectively. First, second and third vias 314, 316 and 312 may be formed to fill the sixth to eighth openings, respectively.

A metal plate 320 may be formed on the first to third vias 314, 316 and 312 to complete the semiconductor device.

As illustrated above, in a method of manufacturing a semiconductor device in accordance with an exemplary embodiment of the present inventive concept, the second and third active fins 104 and 106 may not extend in a straight line. The second and third active fins 104 and 106 may extend in a winding line. Thus a double patterning process for forming minute patterns may be performed in a stable manner. The second and third active fins 104 and 106 may be formed in the chip region I. In addition, the second and third active fins 104 and 106 may be formed in the sealing region II. Accordingly, a subsequent planarization process may be easily performed. By using processes substantially the same as or similar to those for forming the transistor in the chip region I, the first guard ring 404 and the first moisture blocking structure 406 may be formed in the sealing region II.

The above moisture blocking structure and/or the guard ring, the semiconductor device including the same, and the method of manufacturing the same may be applied to various types of semiconductor devices including minute patterns having a width equal to or less than about 25 nm and to methods of manufacturing the same. For example, a semiconductor device and a method of manufacturing the same may be applied to logic devices such as central processing units (CPUs), main processing units (MPUs), application processors (APs), or the like. The method of manufacturing a blocking structure and/or a guard ring, and a semiconductor device including the same may be applied to volatile memory devices such as dynamic random-access memory (DRAM) or static random-access memory (SRAM) devices. In addition, the method of manufacturing a blocking structure and/or a guard ring, and a semiconductor device including the same may be applied to non-volatile memory devices such as flash memory devices, phase change random-access memory (PRAM) devices, magnetoresistive random-access memory (MRAM) devices, resistive random-access memory (RRAM) devices, and the like.

In a method of manufacturing the semiconductor device according to an exemplary embodiment of the present inventive concept, the active fins might not extend in a straight line but the active fins may extend in a winding line in the sealing region, and thus the double patterning process for forming minute patterns may be stably performed. Additionally, the active fins may be formed in the chip region and in the sealing region, so a subsequent planarization process may be performed. By processes substantially the same as or similar to those for forming the transistor in the chip region, the guard ring and the moisture blocking structure may be formed in the sealing region, and may ground currents, and prevent moisture and/or crack propagation.

While the inventive concept has been particularly shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A moisture blocking structure, comprising:
an active fin disposed on a sealing region of a substrate, the substrate including a chip region and the sealing region surrounding a periphery of the chip region, the active fin continuously surrounding the chip region and having a winding line shape in a plan view;
a gate structure covering the active fin and surrounding the periphery of the chip region; and
a conductive structure disposed on the gate structure, the conductive structure surrounding the periphery of the chip region,
wherein the active fin includes:
a plurality of first portions each extending in a first direction substantially parallel to a top surface of the substrate, the plurality of first portions being disposed in a third direction having an acute angle with the first direction; and
a plurality of second portions each extending in a second direction substantially parallel to the top surface of the substrate and substantially perpendicular to the first direction,
wherein each end of each first portion of the plurality of first portions is connected to an end of a corresponding second portion of the plurality of second portions.

2. The moisture blocking structure of claim 1, further comprising a plurality of active fins,
wherein the gate structure covers two neighboring active fins of the plurality of active fins.

3. The moisture blocking structure of claim 2, wherein the two neighboring active fins are substantially parallel to each other.

4. The moisture blocking structure of claim 1, wherein the conductive structure includes
a contact plug disposed on the gate structure, the contact plug surrounding the periphery of the chip region, and
a via disposed on the contact plug, the via surrounding the periphery of the chip region.

5. The moisture blocking structure of claim 1, further comprising:
a plurality of active fins, a plurality of gate structures, and a plurality of conductive structures; and
a metal layer disposed on the plurality of conductive structures.

6. The moisture blocking structure of claim 1, further comprising a blocking layer pattern disposed between the gate structure and the conductive structure, the blocking layer pattern including an insulating material.

7. A semiconductor device, comprising:
a substrate having a first region and a second region, wherein the second region is disposed around the first region;
a first active fin disposed on the first region, a second active fin disposed on the second region, and a third active fin disposed on the second region, wherein the second active fin forms a closed loop around the first region, and the third active fin forms a closed loop around the second active fin;
a first conductive structure disposed on the second active fin, wherein the first conductive structure forms a closed loop around the first region;
a first gate structure covering the third active fin, a second conductive structure disposed on the first gate structure, wherein the first gate structure forms a closed loop around the second active fin, and the second conductive structure forms a closed loop around the second active fin.

8. The semiconductor device of claim 7, further comprising a fourth active fin disposed between the second and third active fins, the fourth active fin forming a closed loop around the second active fin, and a fifth active fin disposed on the second region of the substrate, the fifth active fin forming a closed loop around the third active fin,
wherein the first conductive structure covers the second and fourth active fins, and the second conductive structure covers the third and fifth active fins.

9. The semiconductor device of claim 7, wherein the second and third active fins each includes a curved or zigzag portion.

10. The semiconductor device of claim 7, further comprising a second gate structure including a first gate insulation layer pattern and a first gate electrode sequentially stacked on the first active fin.

11. The semiconductor device of claim 7, wherein the first conductive structure includes a first contact plug disposed on the second active fin, the first contact plug forming a closed loop around the first region, and
a first via disposed on the first contact plug, the first via forming a closed loop around the first region, and
wherein the second conductive structure includes a second contact plug disposed on the first gate structure, the second contact plug forming a closed loop around the second active fin, and
a second via disposed on the second contact plug, the second via forming a closed loop around the second active fin.

12. The semiconductor device of claim 7, further comprising a plurality of second active fins,
wherein each of first and second ones of the plurality of second active fins have concave portions and convex portions,
and wherein the concave portions of the first one of the plurality of second active fins face the convex portions of the second one of the plurality of second active fins, respectively, and the convex portions of the first one of the plurality of second active fins face the concave portions of the second one of the plurality of second active fins, respectively.

13. The semiconductor device of claim 7, further comprising a plurality of third active fins,
wherein each of first and second ones of the plurality of third active fins have concave portions and convex portions,
and wherein the concave portions of the first one of the plurality of third active fins face the convex portions of the second one of the plurality of third active fins, respectively, and the convex portions of the first one of the plurality of third active fins face the concave portions of the second one of the plurality of third active fins, respectively.

14. The semiconductor device of claim 7, further comprising a plurality of first active fins,
wherein each of the first active fins extend in the same direction.

15. The moisture blocking structure of claim 1, further comprising a plurality of active fins,
wherein each of first and second ones of the plurality of active fins have concave portions and convex portions,
and wherein the concave portions of the first one of the plurality of active fins face the convex portions of the second one of the plurality of active fins, respectively, and the convex portions of the first one of the plurality of active fins face the concave portions of the second one of the plurality of active fins, respectively.

16. The moisture blocking structure of claim 1, wherein the active fin is a first active fin, and wherein the semiconductor device further includes a plurality of second active fins disposed on the chip region of the substrate, each of the second active fins extending in a fourth direction.

17. The moisture blocking structure of claim 16, wherein the gate structure is a first gate structure, and wherein the semiconductor device further includes a second gate structure on the chip region of the substrate, the second gate structure extending in a fifth direction substantially perpendicular to the fourth direction.

18. A semiconductor device, comprising:
a substrate having a first region and a second region, wherein the second region is disposed around the first region;
a first active fin disposed on the second region and a second active fin disposed on the second region, wherein the first active fin forms a closed loop around the first region, and the second active fin forms a closed loop around the first active fin;
a first conductive structure disposed on the first active fin, wherein the first conductive structure forms a closed loop around the first region; and
a first gate structure covering the second active fin, a second conductive structure disposed on the first gate structure, wherein the first gate structure forms a closed loop around the first active fin, and the second conductive structure forms a closed loop around the first active fin.

19. The semiconductor device of claim 18, further comprising a third active fin disposed between the first and second active fins, the third active fin forming a closed loop around the first active fin, and a fourth active fin disposed on the second region of the substrate, the fourth active fin forming a closed loop around the second active fin,
wherein the first conductive structure covers the first and third active fins, and the second conductive structure covers the second and fourth active fins.

20. The semiconductor device of claim 18, further comprising:
a fifth active fin on the first region of the substrate; and
a second gate structure including a first gate insulation layer pattern and a first gate electrode sequentially stacked on the fifth active fin.

* * * * *